(12) United States Patent
Yamazaki et al.

(10) Patent No.: US 6,828,587 B2
(45) Date of Patent: Dec. 7, 2004

(54) SEMICONDUCTOR DEVICE

(75) Inventors: Shunpei Yamazaki, Tokyo (JP); Toru Mitsuki, Kanagawa (JP); Kenji Kasahara, Kanagawa (JP); Taketomi Asami, Kanagawa (JP); Tamae Takano, Kanagawa (JP); Takeshi Shichi, Kanagawa (JP); Chiho Kokubo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/880,089

(22) Filed: Jun. 14, 2001

(65) Prior Publication Data

US 2002/0043662 A1 Apr. 18, 2002

(30) Foreign Application Priority Data

Jun. 19, 2000 (JP) ........................................ 2000-183817
Mar. 1, 2001 (JP) ........................................ 2001-057224

(51) Int. Cl.[7] ............................................. H01L 29/04
(52) U.S. Cl. ........................................ 257/72; 438/166
(58) Field of Search ............................... 257/49, 57, 59, 257/65, 72, 316, 347, 410–411; 349/42, 44, 46; 438/149–151, 158, 166, 487, 585, 517

(56) References Cited

U.S. PATENT DOCUMENTS

| 4,987,005 | A | | 1/1991 | Suzuki et al. |
| 5,162,933 | A | * | 11/1992 | Kakuda et al. ............... 257/55 |
| 5,304,407 | A | | 4/1994 | Hayashi et al. |

(List continued on next page.)

FOREIGN PATENT DOCUMENTS

| JP | 02-219234 | 8/1990 |
| JP | 07-130652 | 5/1995 |
| JP | 08-078329 | 3/1996 |
| JP | 11-204434 | 7/1999 |
| JP | 11-284198 | 10/1999 |
| JP | 11-307783 | 11/1999 |
| TW | 251379 | 7/1995 |
| TW | 310478 | 7/1997 |

OTHER PUBLICATIONS

Ishihara et al., AM–LCD 99, Microtexture Analysis of Location Controlled Large Si Grain Formed by Excimer–Laser Crystallization Method, Jul. 14, 1999, pp. 99–102.

Lee et al., Low Temperature Poly–Si Thin–Film Transistor Fabrication by Metal–Induced Lateral Crystallization, IEEE Electronic Device Letters, vol. 17, No. 4, Apr. 1996, pp. 160–162.

Primary Examiner—David Nelms
Assistant Examiner—David Vu
(74) Attorney, Agent, or Firm—Eric J. Robinson; Robinson Intellectual Property Law Office, P.C.

(57) ABSTRACT

Crystal orientation planes exist randomly in a crystalline silicon film manufactured by a conventional method, and the orientation ratio is low with respect to a specific crystal orientation. A semiconductor film having a high orientation ratio for the {101} lattice plane is obtained if crystallization of an amorphous semiconductor film, which has silicon as its main constituent and contains from 0.1 to 10 atom % germanium, is performed after introduction of a metal element. A TFT is manufactured utilizing the semiconductor film.

60 Claims, 40 Drawing Sheets

U.S. PATENT DOCUMENTS

| | | |
|---|---|---|
| 5,437,895 A | 8/1995 | Kodama et al. |
| 5,643,826 A | 7/1997 | Ohtani et al. |
| 5,686,980 A * | 11/1997 | Hirayama et al. .......... 257/294 |
| 5,904,567 A | 5/1999 | Yamazaki |
| 5,923,962 A | 7/1999 | Ohtani et al. |
| 5,932,893 A | 8/1999 | Miyanaga et al. |
| 5,943,560 A | 8/1999 | Chang et al. |
| 5,977,560 A | 11/1999 | Banerjee et al. |
| 6,087,679 A | 7/2000 | Yamazaki et al. |
| 6,107,639 A | 8/2000 | Yamazaki et al. |
| 6,107,654 A | 8/2000 | Yamazaki |
| 6,130,118 A | 10/2000 | Yamazaki |
| 6,180,957 B1 * | 1/2001 | Miyasaka et al. .......... 257/336 |
| 6,190,949 B1 | 2/2001 | Noguchi et al. |
| 6,285,042 B1 | 9/2001 | Ohtani et al. |
| 6,307,214 B1 | 10/2001 | Ohtani et al. |
| 6,307,220 B1 | 10/2001 | Yamazaki |
| 6,335,541 B1 | 1/2002 | Ohtani et al. |
| 6,348,368 B1 | 2/2002 | Yamazaki et al. |
| 2001/0014535 A1 | 8/2001 | Yamazaki |
| 2002/0008286 A1 * | 1/2002 | Yamazaki et al. .......... 257/359 |
| 2002/0014625 A1 | 2/2002 | Asami et al. |
| 2002/0038889 A1 | 4/2002 | Yamazaki et al. |
| 2002/0043662 A1 | 4/2002 | Yamazaki et al. |

\* cited by examiner 1 ppm

{101} orientation ratio 53%

3 ppm

{101} orientation ratio 44%

10 ppm

{101} orientation ratio 30%

30 ppm

{101} orientation ratio 19%

Fig. 12A-a
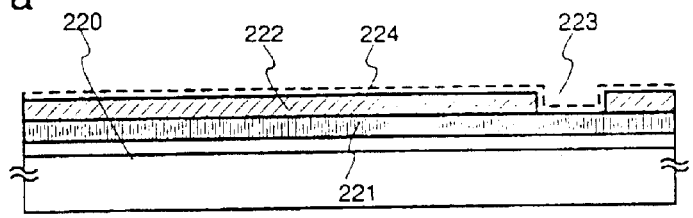
Fig. 12A-b
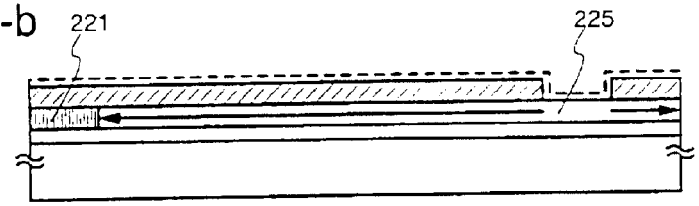
Fig. 12A-c
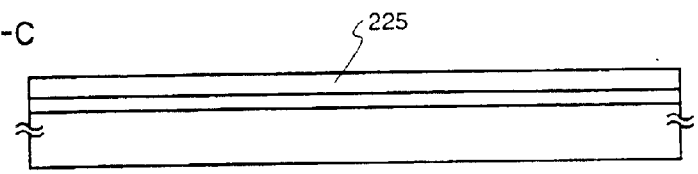
Fig. 12B-a
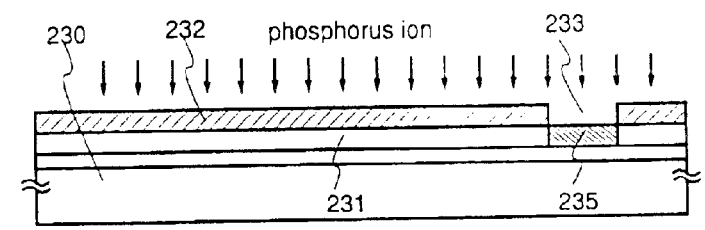
Fig. 12B-b
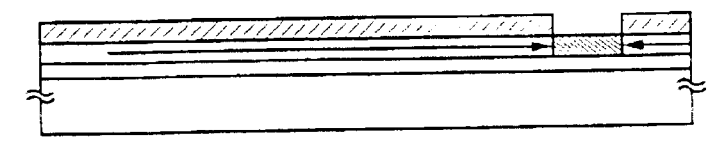
Fig. 12B-c
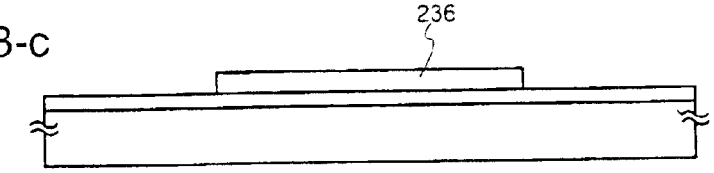

n-channel TFT

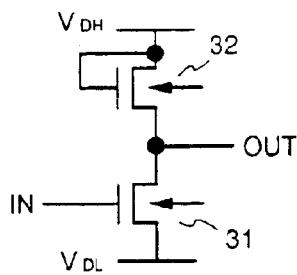
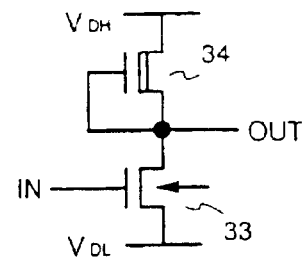
Fig. 15A    Fig. 15B
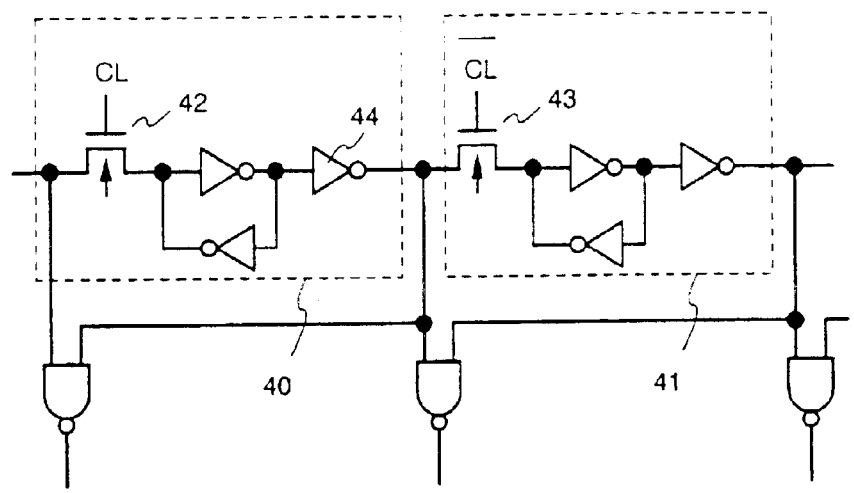
Fig. 16A
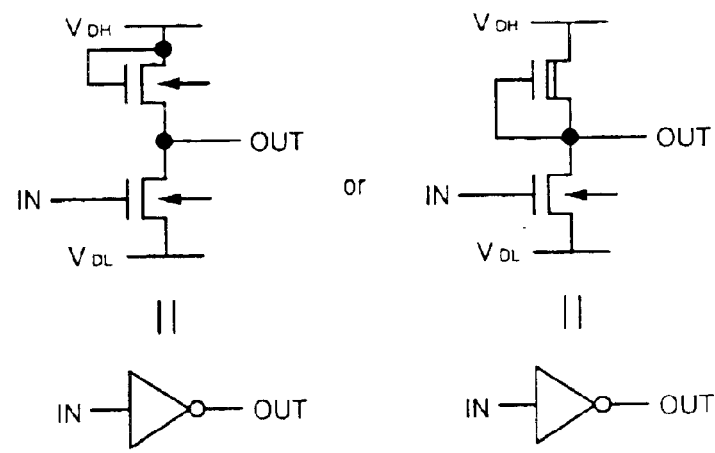
Fig. 16B p-channel TFT n-channel TFT | p-channel TFT

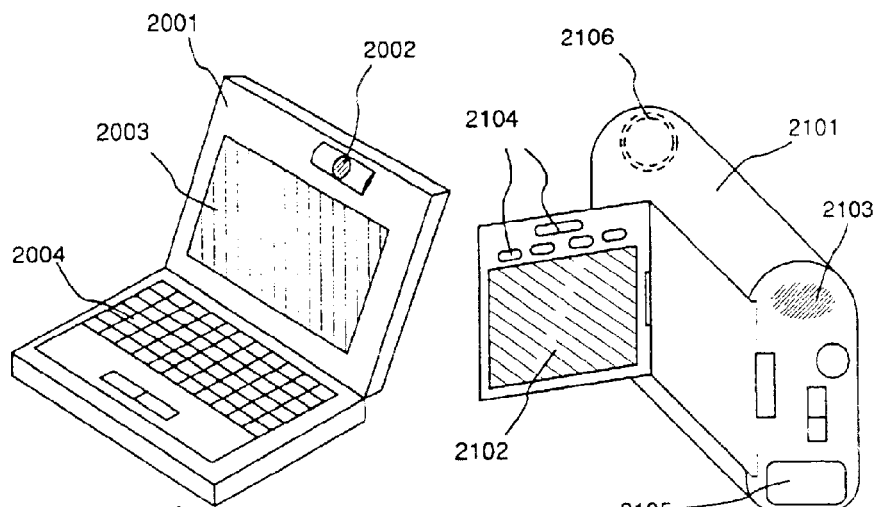
Fig. 39A
Fig. 39B
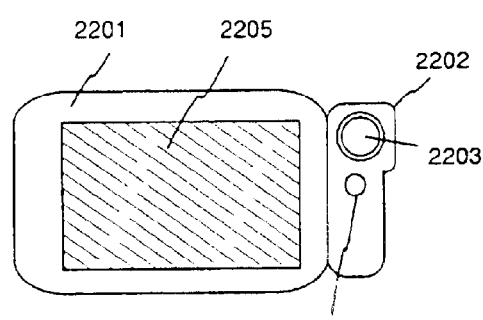
Fig. 39C
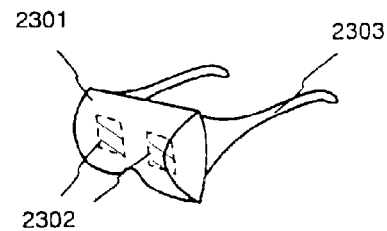
Fig. 39D
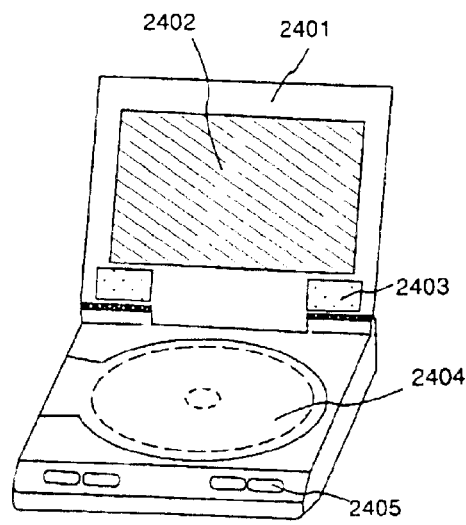
Fig. 39E
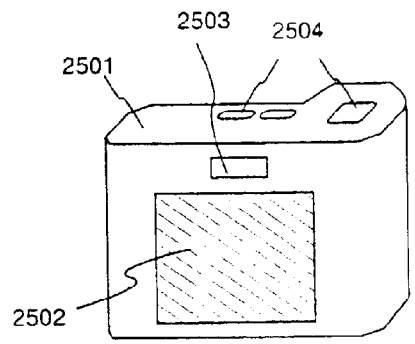
Fig. 39F

SEMICONDUCTOR DEVICE

BACKGROUND OF THE INVENTION

1. Field of the Invention

The present invention relates to a semiconductor device in which an active region is formed by a semiconductor film having a crystalline structure. In particular, the present invention relates to a semiconductor device in which a thin film transistor is formed, or in which a circuit is formed by thin film transistors. Note that, in this specification, the term semiconductor device indicates general devices which can function by utilizing semiconductor characteristics, and that semiconductor integrated circuits, electro-optical devices, and electronic devices are all included in the category of semiconductor devices.

Note also that, throughout this specification, the term semiconductor device indicates general devices which can function by utilizing semiconductor characteristics, and electro-optical devices, semiconductor circuits, and electronic devices are all semiconductor devices.

2. Description of the Related Art

Techniques of using a semiconductor film (hereinafter referred to as crystalline semiconductor film) having a crystalline structure on the order of several nm to several hundreds of run in thickness formed on a substrate having an insulating surface in order to form thin film transistors (hereafter referred to as TFTs) have been developed. TFTs are being put into practical use as switching elements for liquid crystal display devices, and in recent years it has become possible to form a semiconductor integrated circuit on a glass substrate.

Silicon is mainly used as the material for crystalline semiconductor films used in TFTs. A silicon film having a crystalline structure (hereafter referred to as a crystalline silicon film) utilizes an amorphous silicon film deposited on a substrate, such as glass or quartz, by plasma CVD or low pressure CVD, which is then crystallized by heat treatment or laser light irradiation (hereafter referred to as laser processing throughout this specification).

However, it is necessary to heat the amorphous silicon film to a temperature equal to or greater than 600° C. for 10 or more hours in order to crystallize the amorphous semiconductor film if crystallization is performed by heat treatment. The processing temperature and processing time cannot necessarily be thought of as suitable when considering the productivity of TFTs. It also becomes necessary to use a large size heat treatment furnace in order to handle substrates which have large surface areas when considering a liquid crystal display device as an applied product using the TFTs, and not only does the energy consumed during the process of manufacturing increase greatly, but it also becomes difficult to obtain uniform crystals across a wide surface area. Further, if laser processing is used, it is also difficult to obtain homogeneous crystals if laser processing is used because the output of laser oscillators is unstable. This type of dispersion in the quality of crystals becomes a cause of dispersion in the properties of the TFTs, and there is a fear that this will be a factor in lowering the display quality of a liquid crystal display device or an EL display device.

On the other hand, techniques have been developed for manufacturing a crystalline semiconductor film by introducing a metal element for promoting the crystallization of silicon into an amorphous silicon film, and then using heat treatment at a temperature lower than that conventionally used. For example, Japanese Patent Application Laid-open Nos. Hei 7-130652 and Hei 8-78329 disclose that a metal element such as nickel is introduced into an amorphous silicon film, and a crystalline silicon film is obtained by heat treatment for 4 hours at 550° C.

Furthermore, TFTs using crystalline silicon films thus manufactured are still inferior compared to the characteristics of MOS transistors using a single crystal silicon substrate. Even if semiconductor films, having thickness of several nm to several hundreds of nm and formed on various materials such as glass and quartz, are crystallized, only polycrystalline structures made from an aggregate of a plurality of crystal grains can be obtained. Carriers become trapped due to a plurality of defects existing in the crystal grains and in the crystal grain boundaries, and this causes restrictions in the TFT performance.

However, the crystal orientation planes exist randomly for crystalline silicon films manufactured by the above conventional method, and the orientation ratio with respect to a specified crystal orientation is low. Crystalline silicon films obtained by heat treatment or laser processing have a plurality of crystal grains deposited, with a tendency to be oriented in the {111} plane. However, the ratio of this orientation toward the plane orientation does not exceed 20% of the total.

If the orientation ratio is low, then it may be assumed that it becomes almost impossible to maintain continuity of the lattice at crystal grain boundaries in which crystals having differing orientations meet to generate a plurality of unpaired bonding sites. Unpaired bonding sites occurring at the grain boundaries become centers, which capture carriers (electrons, holes), thereby lowering the transport characteristics. Namely, the carrier is dispersed and trapped, and therefore a TFT having high electric field effect mobility cannot be expected when the TFT is manufactured from this type of crystalline semiconductor film. Further, the crystal grain boundaries exist randomly, and therefore it is impossible to form a channel-forming region by crystal grains possessing a specified crystal orientation. This becomes a cause of dispersion in the TFT electrical properties.

SUMMARY OF THE INVENTION

An object of the present invention is to provide a means of solving these types of problems, and an object of the present invention is to increase the orientation of a crystalline semiconductor film obtained by crystallizing an amorphous semiconductor film, and to provide a TFT, which uses this type of crystalline semiconductor film in an active layer.

The distribution of crystal orientation is found in accordance with EBSP (electron backscatter diffraction patterning). EBSP is a method (hereafter referred to as EBSP method, for convenience) of analyzing crystal orientation from the backscatter of primary electrons using a specialized detector formed in a scanning electron microscope (SEM). In this specification, S-4300SE scanning electron microscope of Hitachi Science Systems Co. Ltd. is used as the scanning electron microscope, and "Orientation Imaging Microscopy" of TSL Co. Ltd. is used as the specialized detector. A method of measuring by the EBSP method is explained in accordance with FIG. 6. An electron gun (a Schottky field emission electron gun) 101, a mirror 102, and a test piece chamber 103 have the same structure as those of a normal scanning electron microscope. A stage 104 is formed having an inclination on the order of 60° for measuring EBSP, and a sample 109 is set thereupon. A screen 105 of a detector 106 is inserted in this state so as to face the test piece.

If an electron beam is irradiated to a test piece having a crystalline structure, inelastic scattering occurs in back, and a linear pattern unique to the crystal orientation within the test sample by Bragg diffraction (generally referred to as a Kikuchi image) is observed. The crystal orientation of the test sample is found by analyzing the Kikuchi images shown in the detector screen with the EBSP method.

FIG. 7 shows a crystalline semiconductor film 122, having a polycrystalline structure, formed on a substrate 121. The polycrystalline structure is assumed to possess crystal grains each having different crystal orientations. By repeatedly moving the position at which the electron beam strikes the test piece and analyzing the orientation (mapping measurement), the crystal orientation, or arrangement information, of the planer shape test piece can be obtained. The thickness of the imparted electron beam differs depending upon the type of the electron gun of the scanning electron microscope, but for Schottky field emission type, an extremely fine electron beam 123 having a spot diameter of 10 to 20 nm is irradiated. With mapping measurement, very averaged information for the crystal orientation can be obtained as the number of measurement points increases, or as the measurement region is expanded. In practice, measurement is performed in a 100×100 $\mu m^2$ region with on the order of 10,000 (1 $\mu m$ spacing) to 40,000 (0.5 $\mu m$ spacing) points.

If all of the crystal orientations of each crystal grain are found by mapping measurement, then the state of crystal orientation with respect to the film can be displayed statistically. An example of an inverse pole diagram found by EBSP is shown in FIG. 8A. Inverse pole diagrams are often used when displaying the precedence of orientations of a polycrystalline body, and therefore collective display of which lattice plane coincides with a certain specific plane of the test piece (the film surface here) can be performed.

The fan shaped frame of FIG. 8A is generally referred to as a standard triangular shape, and therefore all of the indices of a cubic crystal system are contained within. Further, the lengths occurring within the figure correspond to the angle in the crystal orientation. For example, the angle between {001} and {101} is 45°, the angle between {101} and {111} is 35.26°, and the angle between {111} and {001} is 54.74°. Further, the white dashed line shows a range in which there is a difference of 5 to 10° from {101}.

FIG. 8A is a diagram in which all points measured in mapping (11,655 points with this example) are plotted within the standard triangular shape. It can be seen that the density of points in the vicinity of {101} is high. FIG. 8B is a diagram showing contour lines for the intensity of such points. The numerical values here are non-dimensional numerals showing a multiplier for a case in which it is assumed that each crystal grain has a completely random orientation, in other words, that the points inside the standard triangular shape are distributed without bias.

If the orientation precedence is known to be a specific index ({101} here), then it becomes very easy to image the degree or orientation precedence by quantifying the ratio of how many crystal grains have gathered in the vicinity of the index. For example, in the inverse pole diagram shown in FIG. 8A, the ratio of the number of points existing within a range (the white dashed line in the figure) having a difference of 5 to 10° with {101} to the whole can be found as an orientation ratio in accordance with the following equation.

{101} orientation ratio=(measurement points within allowable error of an angle between {101} lattice plane and film surface)/(the number of all measurement points)

This ratio can also be explained as follows. If the distribution aggregates in the vicinity of {101} plane, as in FIG. 8A, then the <101> direction of each grain is almost perpendicular to the substrate with an actual film, as in FIG. 10, but the grains are expected to be lined up possessing a slight wavering in the periphery. The tolerance of the difference angle is set to 5° and 10°, and the ratio of values smaller than those are shown by the numerical values. For example, in FIG. 9 the <101> direction of a certain crystal grain is included in the 10° tolerance, although it does not fall within the 5° tolerance. For the latter data, the tolerance angle is set to 5° or is set to 10°, and the ratio of crystal grains satisfying the tolerance is displayed, as explained above.

An invention structure disclosed in this specification is characterized in a semiconductor device comprising a thin film transistor having: a semiconductor layer containing a channel-forming region; a source region; and a drain region on an insulating film covering an electrode;

wherein:

the channel-forming region: has silicon as its main constituent and contains germanium; has a concentration of nitrogen, and a concentration of carbon, less than $5\times10^{18}/cm^3$ as detected by secondary ion mass spectroscopy; and has a concentration of oxygen less than $1\times10^{19}/cm^3$ as detected by secondary ion mass spectroscopy;

the channel-forming region is made from a semiconductor film containing a plurality of crystal grains; and the ratio, within a plurality of crystal planes in the channel-forming region, of the crystal planes which form an angle equal to or less than 10° with a substrate surface, measured by a method of reflective electron beam diffraction patterning while moving the position at which an electron beam strikes, is as follows:

greater than or equal to 20% when the crystal plane is {101};

less than or equal to 3% when the crystal plane is {001}; and less than or equal to 5% when the crystal plane is {111}.

In the above structure, the channel-forming region comprises silicon and germanium, and a concentration of germanium is larger than or equal to 0.1 atom %, and less than or equal to 10 atom %.

Further, in the above structure, the electrode comprises a gate electrode, the insulating film comprises a gate insulating film, and the thin film transistor is a reverse stagger type thin film transistor. It should be noted that the channel-forming region in this specification denotes a region (called "channel") in which carriers are transported. In case of a reverse stagger type thin film transistor, for example, the channel is formed in a vicinity of an interface between the semiconductor film and the gate insulating film over the gate electrode. However, a whole region of the semiconductor film including the interface is called the channel-forming region.

Further, in the above structure, the semiconductor layer is obtained by a heat treatment or by a laser processing to an amorphous semiconductor film provided with a metal element. After the laser processing, a light from a halogen lamp, a xenon lamp, a mercury lamp, or a metal halide lamp may be irradiated to the crystallized semiconductor film.

Further, in the above structure, the metal element may be one or a plurality of elements selected from the group consisting of Fe, Co, Ni, Ru, Rh, Pd, Os, Ir, Pt, Cu, and Au. And it is preferable to reduce a concentration of the metal element contained in the crystallized semiconductor film at less than $1 \times 10^{17}$ atoms/cm$^3$ by a gettering process.

Further, in the above structure, the channel-forming region has a germanium concentration gradient in which the germanium concentration becomes larger with increasing a distance from an interface with said insulating film in the film thickness direction. FIGS. 13A to 13C are graphs which show germanium concentration gradient when the semiconductor layer comprising silicon and germanium is treated by a heating or laser processing. FIG. 13A shows a SIMS data for a test piece in which the semiconductor film provided with Ni of 10 ppm is heat treated at 550° C. for 4 hours. FIG. 13B shows a SIMS data after the test piece of FIG. 13A is further treated by a laser irradiation at 471 mJ/cm$^2$. FIG. 13C shows a SIMS data after the test piece of FIG. 13A is further treated by a laser irradiation at 521 mJ/cm$^2$.

Further, in the semiconductor device comprising a pixel portion and a driver circuit formed over a same substrate, all thin film transistors in the pixel portion and the driver circuit may be formed of reverse stagger type n-channel thin film transistors. And semiconductor layers in these thin film transistors have large orientation ratio in {101} lattice plane.

Further, in the semiconductor device comprising a pixel portion and a driver circuit formed over a same substrate, all thin film transistors in the pixel portion and the driver circuit may be formed of reverse stagger type p-channel thin film transistors. And semiconductor layers in these thin film transistors have large orientation ratio in {101} lattice plane.

Further, in the semiconductor device comprising a pixel portion and a driver circuit formed over a same substrate, all thin film transistors in the pixel portion and the driver circuit may be formed of reverse stagger type n-channel thin film transistors or p-channel thin film transistors. And semiconductor layers in these thin film transistors have large orientation ratio in {101} lattice plane.

Further, in the semiconductor device comprising a pixel portion formed over a same substrate, semiconductor layers in of thin film transistors in the pixel portion are formed on an insulating film covering an electrode. And the semiconductor layers in these thin film transistors have large orientation ratio in {101} lattice plane.

Further, in the above structure, a difference between an interval of lattice planes which is horizontal to the semiconductor layer and an interval of lattice planes which is oblique by 60° is exceeding 0 and less than or equal to 0.002 nm calculated in lattice constant.

BRIEF DESCRIPTION OF THE DRAWINGS

In the accompanying drawings:

FIGS. 12A-a to 12B-c are diagrams for explaining a method of manufacturing a crystalline semiconductor film of the present invention;

FIGS. 15A and 15B are diagrams showing NMOS circuit structures;

FIGS. 16A and 16B are diagrams showing shift register structures;

FIGS. 39A to 39F are diagrams showing examples of electronic devices;

DETAILED DESCRIPTION OF THE PREFERRED EMBODIMENTS

Embodiment Modes

Figure 1A:
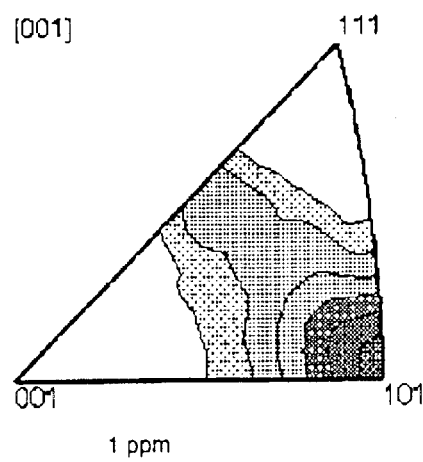
FIGS. 1A to 1D are inverse pole diagrams of a crystalline semiconductor film of the present invention found by an EBSP method.
Figure 1B:
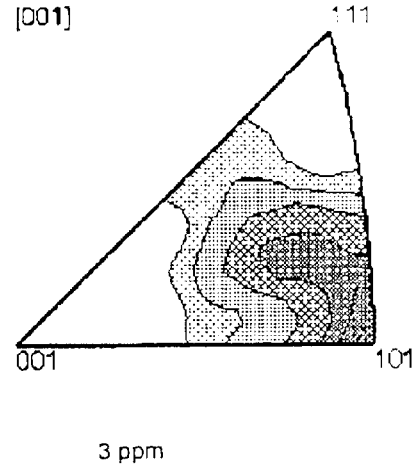
Figure 1C:
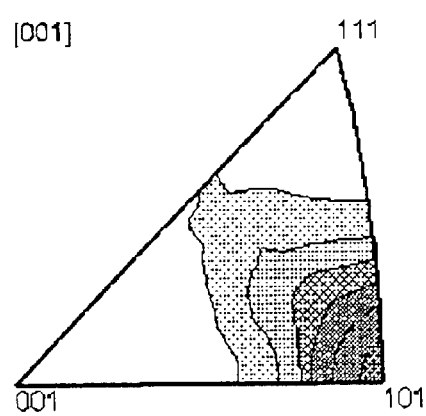
Figure 1D:
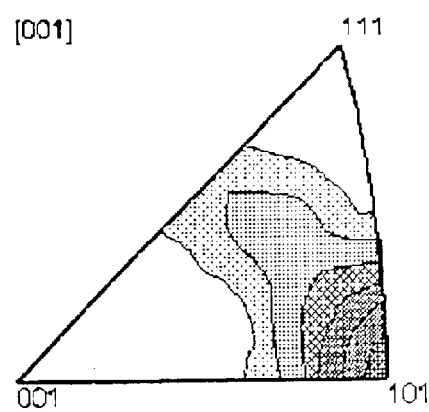

Embodiment modes of the present invention are explained below.

A TFT is formed by a semiconductor film having a high orientation ratio for the {101} lattice plane with the present invention. A crystalline semiconductor film having a high orientation ratio can be realized only after using a semiconductor material having silicon as its main constituent, and containing germanium in an amount greater than or equal to 0.1 atom %, and less than or equal to 10 atom %. One typical embodiment in which this type of semiconductor film is obtained is as follows: a metal element for promoting crystallization of an amorphous semiconductor film is introduced to the surface of an amorphous semiconductor film manufactured by plasma CVD or low pressure CVD, using gases of hydrogenated, fluorinated, or chlorinated silicon atoms and germanium atoms, and a crystalline semiconductor film is formed by heat treatment utilizing the metal element.

A non-alkaline glass substrate, such as aluminum borosilicate glass or barium borosilicate glass, is suitable as a substrate for forming the semiconductor film in the present invention. Corning Corp. #7059 glass, or #1737 glass, is typically used. In addition, a quartz substrate or a sapphire substrate may also be used. Further, an insulating film may be formed on the surface of a semiconductor substrate, such as a silicon, germanium, or gallium arsenide substrate, and this may be used as the substrate.

If one of the above glass substrates is used as the substrate, a blocking layer such as silicon nitride, silicon oxide, or silicon oxynitride is formed between the amorphous semiconductor film and the glass substrate. Impurity elements such as alkaline metal elements contained within the glass substrate thus are prevented from diffusing within the semiconductor layer. For example, a silicon nitride film is formed by plasma CVD using a reactant gas of $SiH_4$, $NH_3$, and $N_2$. Furthermore, a silicon oxynitride film may be formed using $SiH_4$, $N_2O$, and $NH_3$ as a reactant gas. The blocking layer is formed with a film thickness of 20 to 200 nm.

Formation of the amorphous semiconductor film is performed in accordance with plasma CVD, low pressure CVD, or another appropriate method. If plasma CVD is used, then a reactant gas made from $SiH_4$ and $GeH_4$, or a reactant gas made from $GeH_4$ diluted by $SiH_4$ and $H_2$ is introduced to a reaction chamber, separated by a 1 to 200 MHz high frequency electric discharge, and then an amorphous semiconductor film is deposited on the substrate. $Si_2H_6$ or $SiF_4$ may be employed as a substitute for $SiH_4$, and $GeF_4$ may be employed as a substitute for $GeH_4$ in the reactant gas. It is also possible to apply similar reactant gases if low pressure CVD is used, and it is preferable to dilute the reactant gas by He and then deposit the amorphous semiconductor film on the substrate at a temperature of 400 to 500° C. Whichever method is used, the above stated gases used by the present invention are purified to a high purity in order to reduce the concentration of impurity elements such as oxygen, nitrogen, and carbon from being incorporated into the deposited amorphous semiconductor film. The thickness of the deposited semiconductor film is set within a range between 20 and 100 nm.

The amorphous semiconductor film used in the present invention has silicon as its main constituent and contains germanium from 0.1 atom % to 10 atom %, preferably in the range of 1 to 5 atom %. The amount of germanium contained can be regulated in accordance with the mixture ratio of $SiH_4$ and $GeH_4$ used as the typical reactant gas. Further, the concentration of nitrogen and the concentration of carbon contained within the amorphous semiconductor film are set to be less than $5 \times 10^{18}/cm^3$, and the concentration of oxygen is set to be less than $1 \times 10^{19}/cm^3$, so that there will be no adverse influence on the electrical characteristics of the manufactured crystalline semiconductor film.

A metal element for promoting crystallization of the amorphous semiconductor film is introduced to the surface of the amorphous semiconductor film thus formed. One type of metal element, or a plurality of types thereof, chosen from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au) as the metal element. These metal elements can be used as metal elements for promoting crystallization of an amorphous semiconductor film in all inventions recorded in this specification. Similar properties and effects can be obtained whichever one or ones of the above metal elements are used, but nickel is typically used.

Locations for the introduction of these metal elements may be over the entire surface of the amorphous semiconductor film, or in other surfaces, such as suitable slit shaped surfaces in the amorphous semiconductor film surface, or in point shaped surfaces on the film surface. If the metal element is introduced over the entire surface, then either the surface of the amorphous semiconductor film positioned on the substrate side, or the surface opposite that of the substrate side may be used. For cases in which the metal element is not introduced over the entire surface, it is preferable that an insulating film be formed over the amorphous semiconductor film, and then that the metal element be introduced utilizing openings formed in the insulating film. There are no special limitations placed on the size of the openings, and the width of the openings can be set from 10 to 40 μm. Further, the length in the longitudinal direction may be arbitrarily determined, and can be set in a range from several tens of im to several tens of cm.

There are no special limitations placed on the method for introducing the metal element, provided that the method is one in which the metal film is provided on the surface of, or inside of, the amorphous semiconductor film. For example, methods such as sputtering, evaporation, plasma processing (including plasma CVD), adsorption, and application of a metal salt solution can be used. Plasma processing utilizes a metal element sputtered from a cathode in a glow discharge environment by an inert gas. Further, the method of metal salt solution application is useful because it is simple, and it is easy to perform regulation of the metal element concentration.

It is possible to use all types of salt as metal salts, and organic solvents such as water, alcohols, aldehydes, ethers, or a mixture of these organic solvents and water as a solvent. Further, there are no limitations on the solution such that the metal salt be completely dissolved, and a solution in which a portion of the metal salt, or all of the metal salt, exists in suspension may also be used. Whichever method is employed, the metal element is introduced as distributed on the surface of, or inside, the amorphous semiconductor film.

Crystallization of the amorphous semiconductor film is performed utilizing the metal element after introducing the metal element by one of the above methods. Crystallization is performed by heat treatment or irradiation of strong light such as laser light, ultraviolet light, or infrared light. A crystalline silicon film, which is oriented preferentially to {101}, can be obtained by using only heat treatment processing, but it is preferable to perform irradiation of strong light, such as laser light, after performing heat treatment. The laser processing after heat treatment can repair and eradicate crystal defects remaining within crystal grains, and is an effective process for increasing the quality of the manufactured crystals. Further, a crystalline silicon film which is oriented preferentially to {101} can also be obtained by using only laser processing, but preferably it is also possible to apply a method in which the irradiation of strong light from a light source such as a halogen lamp, a xenon lamp, a mercury lamp, or a metal halide lamp is performed after performing laser processing.

It is possible to perform heat treatment at a temperature in the range of 450 to 1000° C., but the maximum temperature is made in consideration of the resistance to heat of the substrate used. If a glass substrate is used, a temperature equal to or less than the distortion point of the glass substrate becomes one basis for the maximum temperature. For example, the maximum temperature must be set on the order of 660° C. with respect to a glass substrate having a distortion point of 667° C. The time required is set appropriate to the heat processing temperature and to later processing conditions (for example, the presence or absence of a laser light irradiation process), and it is preferable that heat treatment be performed at 550 to 600° C. for 4 to 24 hours. Further, heat treatment is performed at 500 to 550° C. for 4 to 8 hours for a case of later laser processing. The above heat treatment may be performed in the atmosphere or in a hydrogen atmosphere, but it is preferable to perform heat treatment in a nitrogen or inert gas atmosphere.

Furthermore, if the above heat treatment of the amorphous semiconductor film is performed after formation of a gate electrode and a gate insulating film, then it is necessary to consider the resistance to heat of the gate electrode material used when determining the maximum heat treatment temperature.

Laser processing is performed with an excimer laser having a wavelength equal to or less than 400 nm, a YAG laser, or a $YVO_4$ laser light from the second harmonic (wavelength 532 nm) to the fourth harmonic (wavelength 266 nm) used as a light source. The laser light is gathered into a linear shape or into a spot shape, and irradiated with the energy density set from 100 to 700 $mJ/cm^2$. Laser processing is performed by scanning the laser beam, in which light is gathered as stated, over a predetermined region of the substrate. In addition, a light source such as a halogen lamp, a xenon lamp, a mercury lamp, or a metal halide lamp may also be used as the light source. Further, irradiation of light such as that of a halogen lamp, a xenon lamp, a mercury lamp, or a metal halide lamp may also be performed after laser processing.

A mechanism for obtaining a crystalline semiconductor film having a high ratio for orientation in the {101} plane, like that of the present invention, in accordance with the above processes is not always clear at this state, but a summary can be conjectured as follows.

First, the metal element and silicon react due to the heat treatment at 400 to 500° C. during crystallization, thereby forming a silicide, and the silicide becomes a seed for crystallization, and this contributes to later crystal growth. For example, if the typical metal element nickel is used, then nickel silicide (hereafter denoted by $NiSi_2$) is formed. The structure of $NiSi_2$ is a fluorite structure, a structure in which nickel atoms are arranged in gaps between the diamond structure silicon lattices. If the nickel atoms leave from $NiSi_2$, then a silicon crystal structure remains. It has been determined from the results of numerous experiments that nickel atoms migrate to the amorphous silicon, and the reason for this is thought to be because the solid solubility within the amorphous silicon film is higher than that within the crystalline silicon film. Therefore, a model in which crystalline silicon is formed while nickel migrates within amorphous silicon can be drawn up.

$NiSi_2$ does not possess a specific orientation, but growth is only permitted in a direction parallel to the surface of the substrate if the amorphous semiconductor film thickness is set from 20 to 100 nm. In this case, the interface energy is at a minimum when $NiSi_2$ and the (111) plane of crystalline silicon are in contact, and therefore a plane parallel to the surface of the crystalline silicon film becomes the (110) plane, and this lattice plane is the orientation of preference. If the crystal growth direction is in a direction parallel to the surface of the substrate, and if the grown is in rod shapes, then a degree of freedom exists in a rotation direction about the axis of the rod shape crystals, and it is considered that other lattice planes are also detected because the (110) plane is not necessarily always oriented.

A restriction is imparted to the rotation direction of the rod shaped crystal in order to increase the orientation of the {101} lattice plane of the crystalline semiconductor film with the present invention, and germanium is included to an amorphous silicon at a concentration of 0.1 atom % to 10 atom % as means of reducing the degree of freedom.

Figure 5:
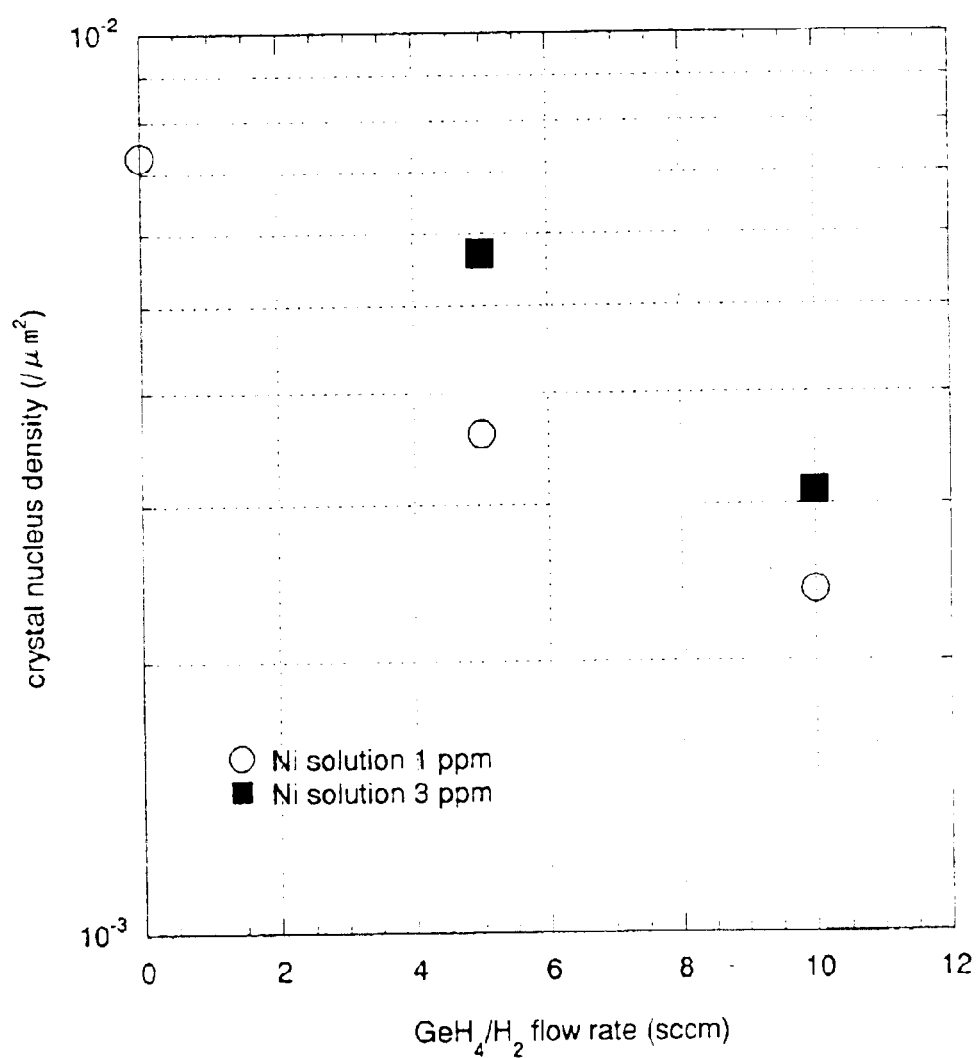
FIG. 5 is a graph showing the relationship between the amount of added GeH$_4$ and the concentration of crystal nucleus generated.
Figure 6:
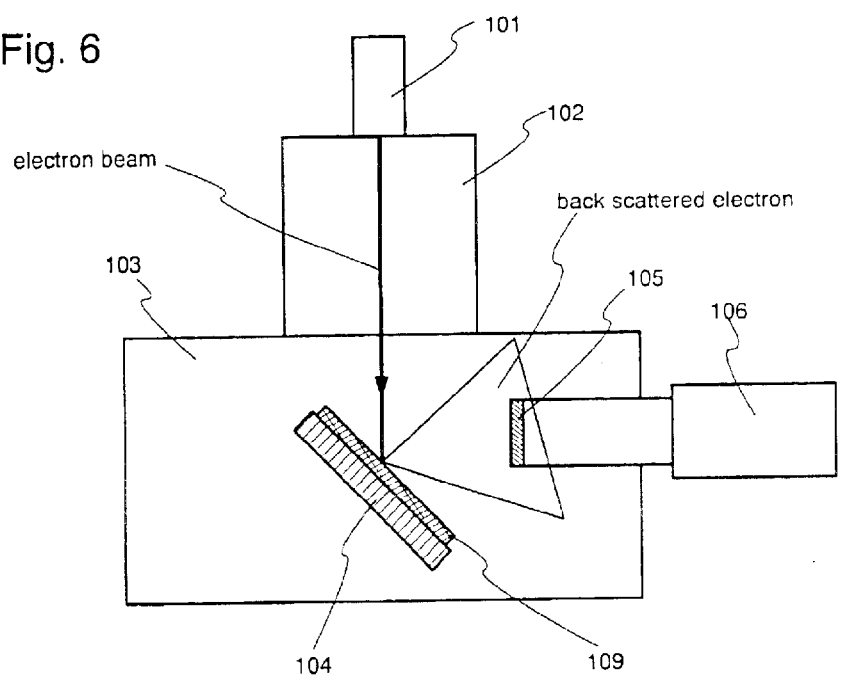
FIG. 6 is a diagram for explaining the structure of an EBSP apparatus.
Figure 7:
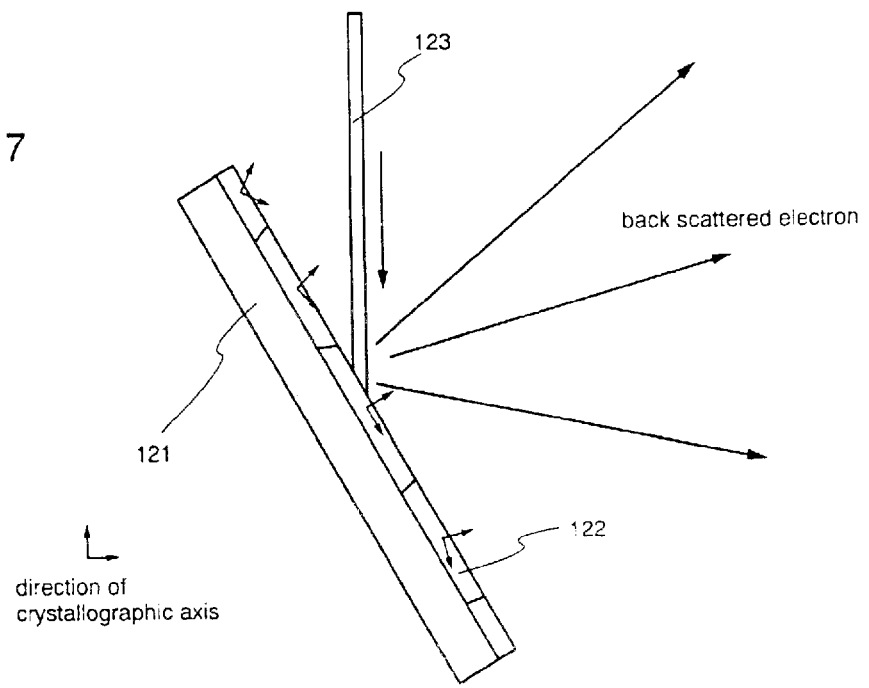
FIG. 7 is a diagram for explaining the principle of measuring a test piece by EBSP.
Figure 8A:
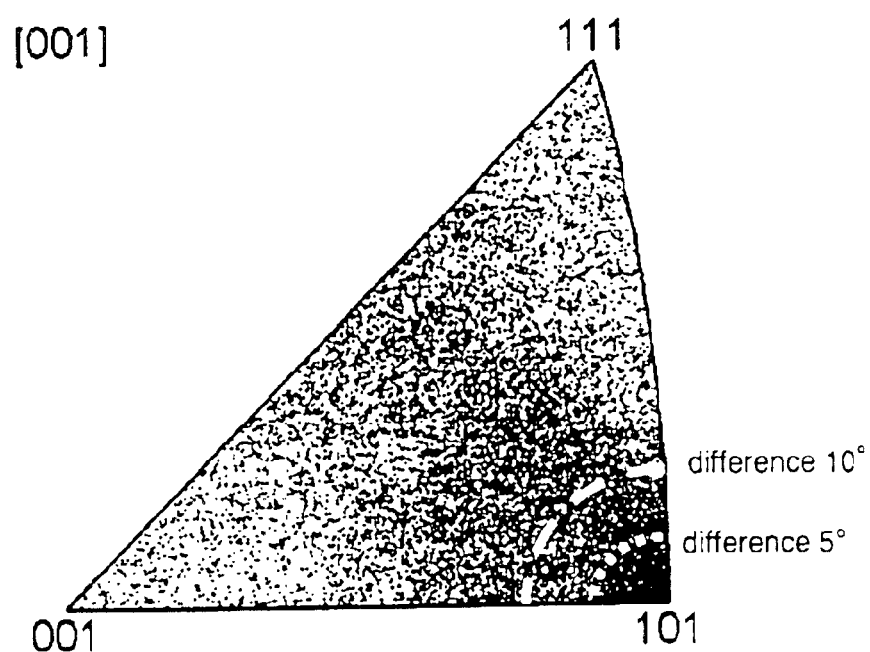
FIGS. 8A and 8B are examples of inverse pole diagrams obtained from EBSP data.
Figure 8B:
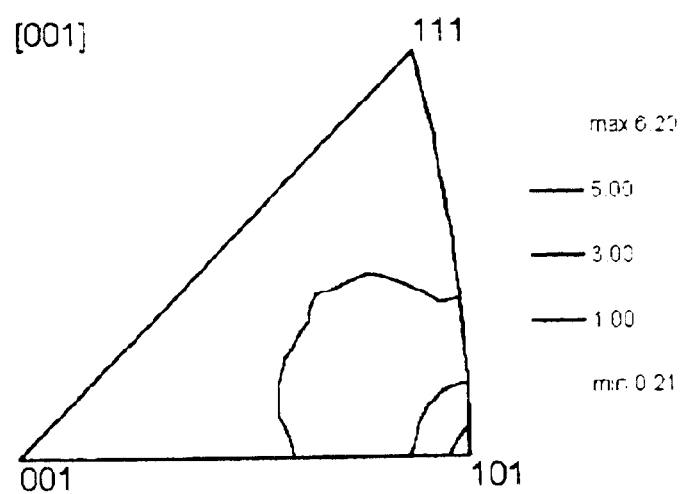
Figure 9:
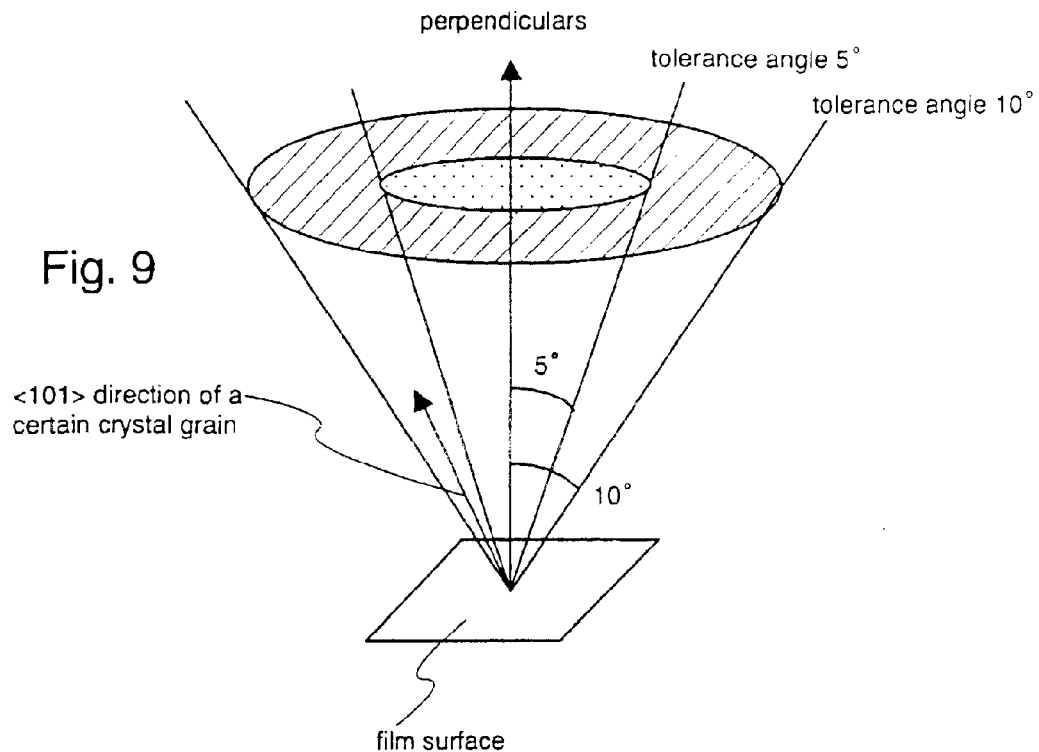
FIG. 9 is a diagram for explaining slip angle from {101} direction.
Figure 10:
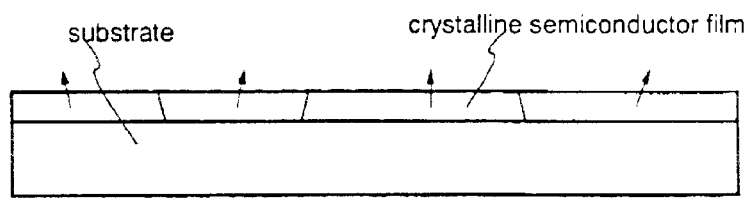
FIG. 10 is a diagram for explaining the fluctuation in the <101> orientation of each crystal grain in the case of a preferable direction being near {101}.

First, it has been observed that the generation concentration of crystal seeds is lowered if between 0.1 atom % and 10 atom % of germanium is contained within amorphous silicon. FIG. 5 shows those results, and shows that there is a tendency for the density of crystal nucleus to fall in accordance with increasing amount of $GeH_4$ added during the amorphous silicon film formation, namely, in accordance with increasing concentration of germanium introduced to the amorphous silicon film. When the $NiSi_2$ crystal seeds are formed, it is expected that germanium is removed due to the difference in spacing between molecules, and that the above crystal growth will occur. The germanium therefore becomes segregated on the outside of the rod shaped crystals, and it is assumed that the existence of germanium reduces the degree of freedom in the rotational direction. As a result, it becomes possible to obtain a crystalline semiconductor film having a high orientation ratio for the (110) plane.

The manufacturing conditions regarding the above crystalline semiconductor film manufactured based upon the present invention, and the orientation of crystals observed by an EBSP method, are shown next. Table 1 shows the manufacturing conditions for an amorphous semiconductor film manufactured by plasma CVD. The high frequency electric power is 0.35 W/cm$^2$ (27 MHz), and this is modulated into a repeating pulse emission having a frequency of 10 kHz (duty ratio 30%), and supplied to the cathode of a parallel plate plasma CVD apparatus. In addition, common conditions of a reaction pressure set to 33.25 Pa, a substrate temperature set to 300° C., and an electrode spacing of 35 mm are used.

TABLE 1

| | | #SGN30 | #SGN10 | #SGN5 | #SN |
|---|---|---|---|---|---|
| $SiH_4$ flow rate | [sccm] | 70 | 90 | 95 | 100 |
| $GeH_4$ flow rate | [sccm] | 30 | 10 | 5 | 0 |
| RF power | [W/cm$^2$] | 0.35 | 0.35 | 0.35 | 0.35 |
| Pulse frequency | [kHz] | 10 | 10 | 10 | 10 |
| Duty | [%] | 30 | 30 | 30 | 30 |
| Pressure | [Pa] | 33.25 | 33.25 | 33.25 | 33.25 |
| Substrate temperature | [° C.] | 300 | 300 | 300 | 300 |
| Electrodes gap | [mm] | 35 | 35 | 35 | 35 |

In order to change the amount of germanium contained with respect to silicon, the total flow rate is set to be fixed, and the mixture ratio of $GeH_4$ gas diluted to 10% by $SiH_4$ and $H_2$ is changed. With the conditions listed in Table 1, the flow of $GeH_4$ diluted to 10% by $H_2$ is changed from 30 to 10 to 5 SCCM for the film formation conditions #SGN30, #SGN10, and #SGN5, respectively. High purity reactants are used, with the purity of $SiH_4$ equal to or greater than 99.9999%, and the amount of nitrogen and hydrocarbon compounds equal to or less than 1 ppm and the amount of $CO_2$ equal to or less than 2 ppm for $GeH_4$. Further, #SN is a condition in which $GeH_4$ is not added. The thickness of the amorphous semiconductor film formed was set to 50 nm in all test pieces.

Figure 4:
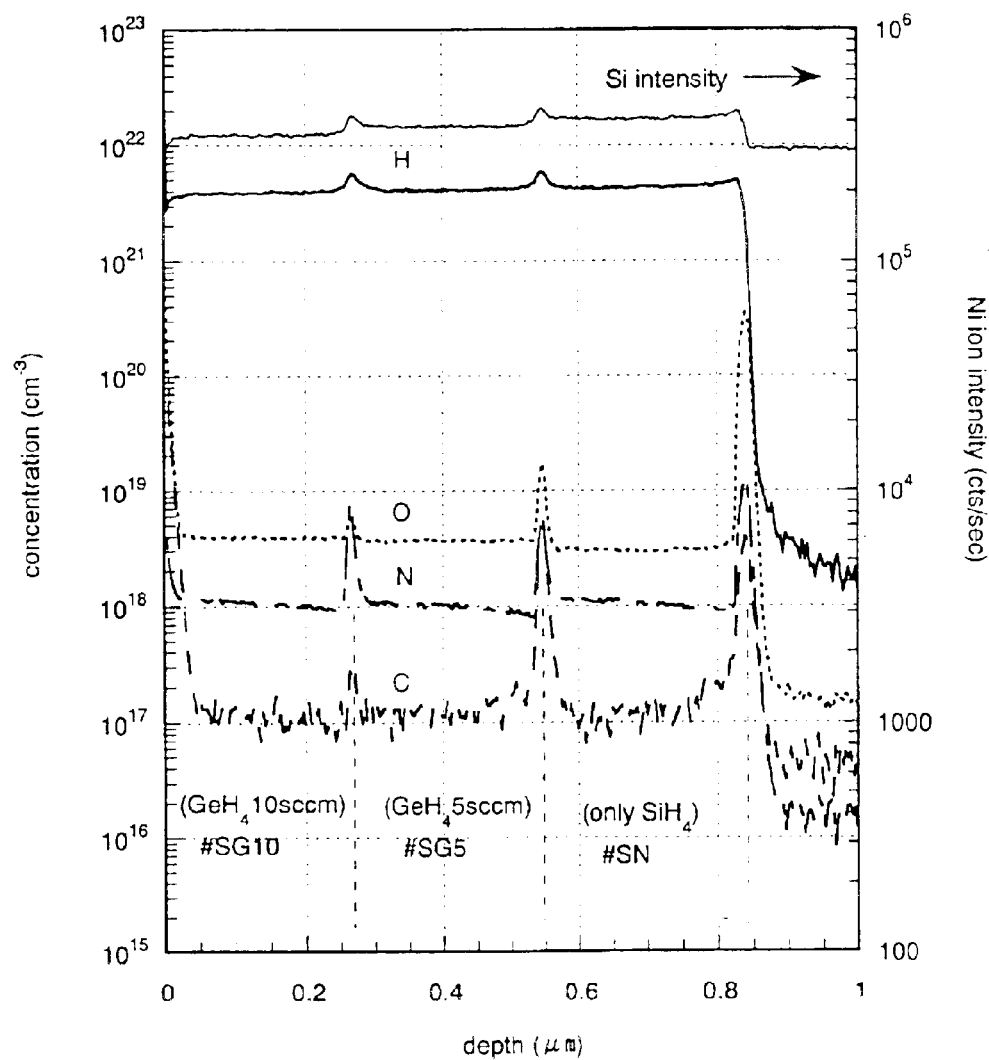
FIG. 4 is SIMS data showing the concentration of C, N, and O of a test sample manufactured by SiH$_4$, GeH$_4$, and H$_2$ gases.

The amount of nitrogen, carbon, and oxygen contained in the amorphous semiconductor films manufactured under these conditions was measured by secondary ion mass spectroscopy (SIMS). The results are shown in FIG. 4. The test piece used in the measurements was one in which films were laminated in order of conditions #SN, #SGN5, and #SGN10, and the amount of nitrogen and carbon contained was less than 5×10$^{18}$/cm$^3$ for all film formation conditions, while the amount of oxygen contained was less than 1×10$^{19}$/cm$^3$ for all film formation conditions.

Crystallization of the amorphous semiconductor films thus manufactured was performed by heat treatment within a nitrogen atmosphere at 550° C. for 4 hours, and by laser processing, with nickel used as the metal element. Nickel was applied by a spinner using an aqueous solution containing nickel acetate. Further, the laser processing was performed using an XeCl excimer laser (wavelength 308 nm), the irradiation energy was set from 300 to 600 mJ/cm$^2$, and the irradiation was performed at an overlap ratio of 90 to 95%. Laser processing was performed in order to crystallize uncrystallized portions of the film crystallized by heat treatment, and in order to repair faults within the crystal grains.

The faults remaining within the crystalline semiconductor film can be effectively reduced by hydrogenation processing in accordance with making the film contain between 0.01 and 1 atom % hydrogen. Hydrogenation can be performed by heat treatment at 350 to 500° C. in an atmosphere containing hydrogen. Further, it is also possible to perform hydrogenation using hydrogen generated by a plasma. Furthermore, a film deposited in accordance with fluorides, such as $SiF_4$ and $GeF_4$, has fluorine remaining within the film on the order of 0.001 to 1 atom %, and this fluorine compensates the defects.

Figure 3:
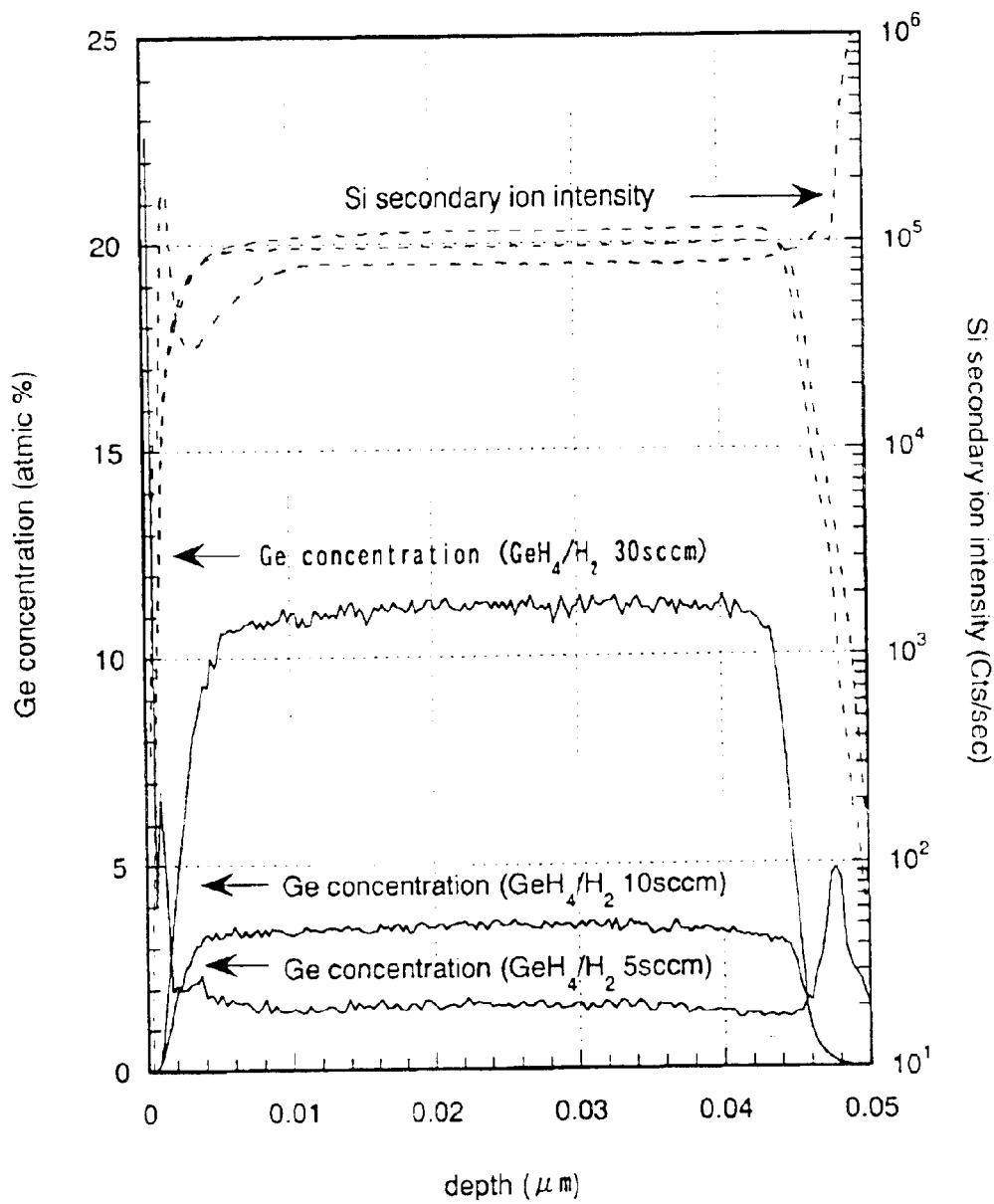
FIG. 3 is a graph showing results obtained when measuring the concentration of Ge within a crystalline semiconductor film using SIMS.

FIG. 3 shows the results of evaluating the germanium concentration, by SIMS, when crystallization is performed in accordance with #SGN10 and #SGN30. The amount of germanium contained with respect to silicon is 1.5 atom % for #SGN5, 3.5 atom % for #SGN10, and 11.0 atom % for #SGN30. If converted from the flow rate of $GeH_4$ with respect to $SiH_4$, the actual amount of germanium with respect to silicon introduced within the film is from 3 to 4 times the conversion. This is because the separation energy by glow discharge of $GeH_4$ is small compared to that of $SiH_4$.

Figure 2:
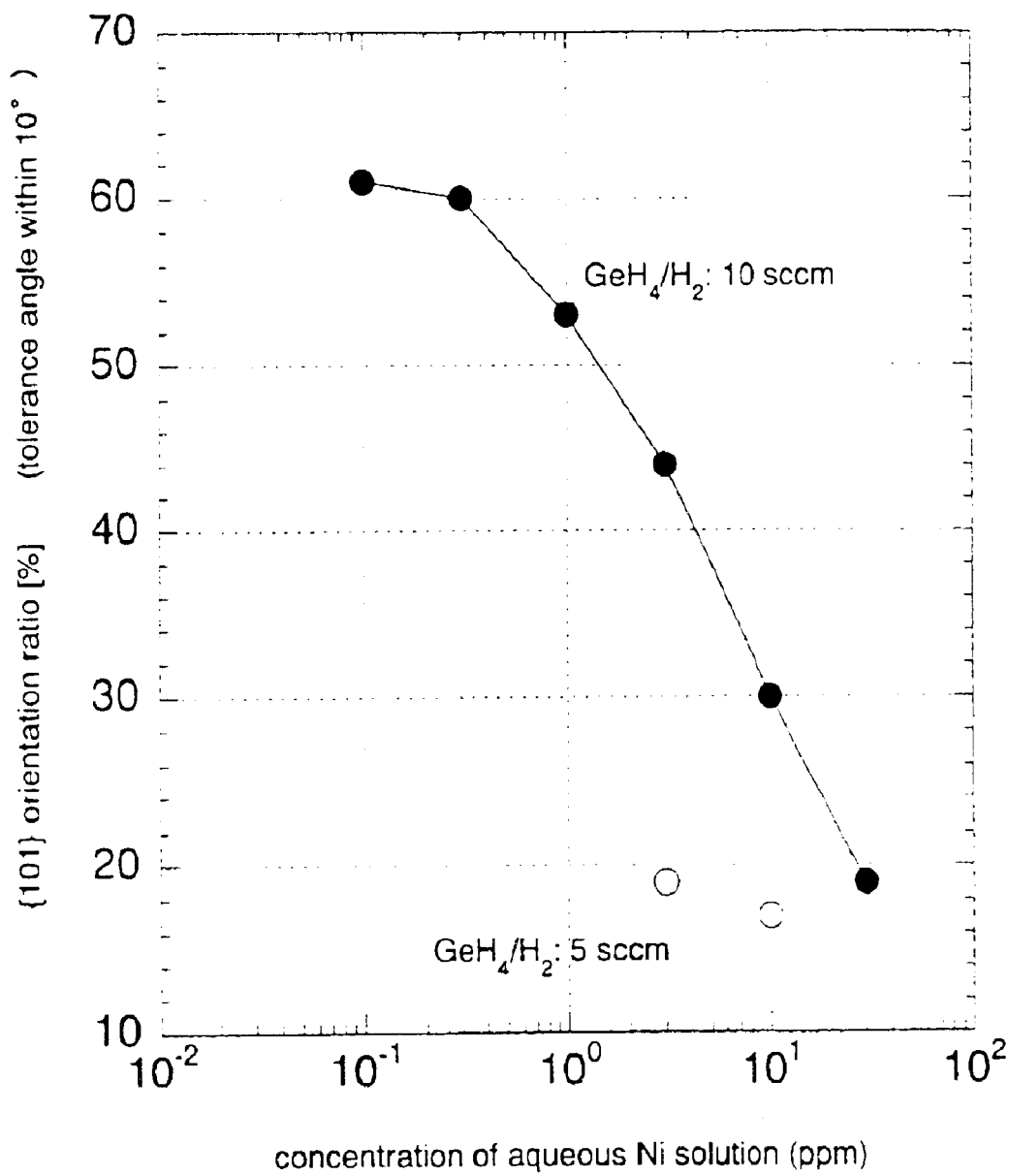
FIG. 2 is a graph showing the relationship between the concentration of aqueous Ni solution and {101} orientation ratio.

Detailed crystal orientation was found by an EBSP method. FIGS. 1A to 1D show inverse pole diagrams of crystalline silicon films for cases in which the nickel concentration of the aqueous solution, containing nickel acetate, added was set to 1 ppm, 3 ppm, 10 ppm, and 30 ppm, respectively using an amorphous silicon film manufactured by the #SGN 10 conditions shown in Table 1. The crystallization conditions were such that heat treatment was performed at 580° C. for 4 hours. The orientation ratio of the crystals was seen to be strongly oriented to {101}, and a tendency for orienting to the {113} plane, intermediate between {001} and {111} was also seen. The orientation ratio for {101} was seen to be dependent on the nickel concentration, and the orientation ratio became higher with lower nickel concentration. FIG. 2 is a graph showing the dependence of the {101} orientation ratio on the nickel concentration, and shows cases for which the amount of $GeH_4$ added was 5 sccm and 10 sccm. The orientation ratio shows a strong correlation with respect to the nickel concentration for the #SGN10 case, and an orientation ratio of 61% was obtained with a nickel concentration of 0.1 ppm, while a 60% orientation ratio was obtained when the nickel concentration was 0.3 ppm.

Figure 44:
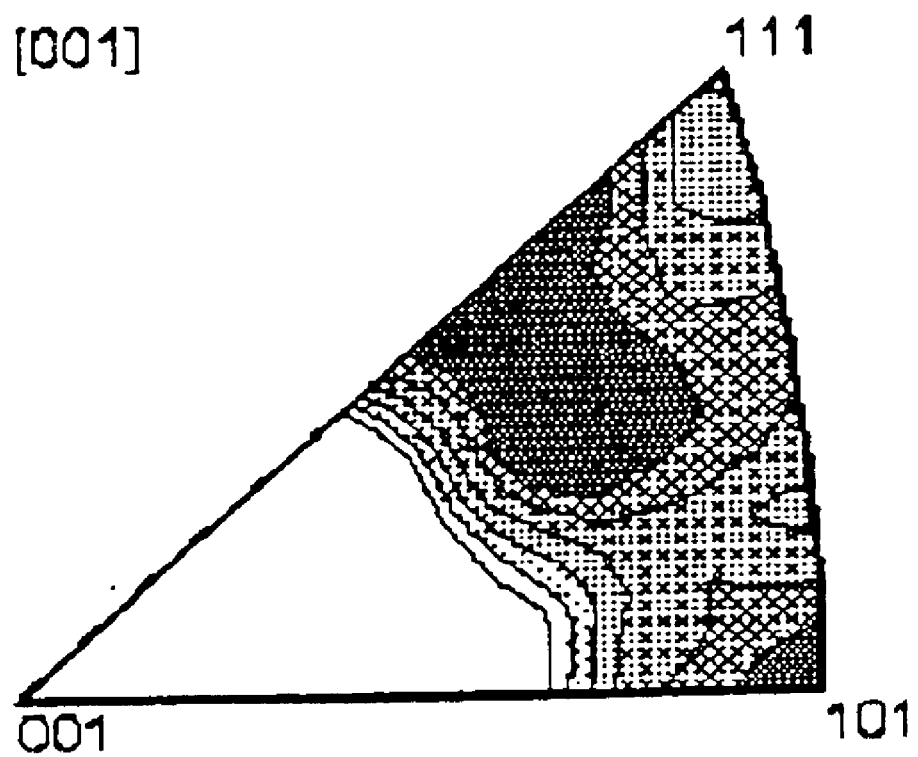
FIG. 44 is a diagram showing a comparative example of an inverse pole diagram obtained from EBSP data.

On the other hand, FIG. 44 shows an inverse pole diagram of a crystalline silicon film for a case in which an amorphous silicon film not containing Ge (#SN) was used, and crystallization was performed by heat treatment at 550° C. for 4 hours, and laser processing, with the nickel concentration of the aqueous solution containing nickel acetate set to 10 ppm. Further, an XeCl excimer laser (wavelength 308 nm) was used for laser processing, and irradiation was performed with the irradiation energy density set from 300 to 600 mJ/cm$^2$ and at an overlap ratio of 90 to 95%. From FIG. 44, a tendency for orientation along the {101} plane, and along the {113} plane, intermediate between {001} and {111} was seen.

Table 2 shows the results found for the orientation ratios of {101}, {001}, {111}, and {113} of each test piece when each lattice plane is within a range of 5° or 10° of the angle formed with respect to the film surface.

TABLE 2

| difference | {101} | | {001} | | {111} | | {113} | unit: % |
|---|---|---|---|---|---|---|---|---|
| angle within | 10° | 5° | 10° | 5° | 10° | 5° | 10° | 5° |
| #SGN30 | 19 | 1 | 8 | 2 | 7 | 3 | 19 | 5 |
| #SGN10 | 31 | 14 | 1 | 0 | 3 | 1 | 10 | 3 |
| #SGN5 | 20 | 6 | 1 | 0 | 3 | 0 | 12 | 3 |
| #SN | 12 | 3 | 1 | 0 | 7 | 2 | 15 | 3 |
| #HS | 4 | 1 | 10 | 3 | 12 | 6 | 18 | 4 |

The orientation ratios of {113} and {111} are high in Table 2 for the #HS test piece, becoming 18% (within 10°) and 12% (within 5°). Further, the orientation ratios of {101} and {113} become high with the #SN test piece. From the viewpoint of symmetry, the number of equivalent lattice planes is highest with {113}, and therefore its ratio of generation becomes higher for a polycrystalline body having random orientation.

On the other hand, tendencies are seen within the test pieces in which germanium is added under #SGN30, #SGN10, and #SGN5, and changes in crystal orientation are shown depending upon the concentration of germanium contained within the film. Of particular interest with #SGN10 and #SGN5, the orientation of the {101} lattice plane is strong compared to other lattice planes, and the amount within the 10° angle is 31%, and the number within the 5° angle is 14%, for #SGN10. Further, the amount within the 10° angle for SGN5 is 20%, while 6% is seen within the 5° angle. This type of high orientation ratio for the {101} lattice plane is a novel effect, which is not, achieved in other test pieces in which germanium is not added.

However, if the amount of germanium contained within the film in #SGN30 increases to 11 atom %, then the orientation ratio for the {101} lattice plane is shown to drop. Further, if the amount of germanium contained within the film is reduced to 1.5 atom % in #SGN5, then the orientation ratio drops by 20%. The meaning of these results, therefore, is that in order to increase the orientation ratio of {101}, the concentration of germanium contained within the amorphous silicon film must be kept within a suitable range, and the concentration range is seen to be from 0.1 atom % to 10 atom %, preferably on the order of 1 to 5 atom %.

This type of crystalline semiconductor film showing a high orientation ratio for the {101} lattice plane may also be achieved synergistically without adding germanium in the range from 0.1 atom % to 10 atom %, or course, by setting the concentration of oxygen, nitrogen, and carbon elements contained within the film to be less than $1 \times 10^{19}/cm^3$ and making the film thickness in the range of 20 to 100 nm, such that crystal growth will be governed in a direction parallel to the substrate surface.

This type of crystalline semiconductor film having a high orientation ratio to the {101} lattice plane can be suitably used in a TFT channel-forming region, or in a channel-forming region, which determines the characteristics of elements, such as in electro-optical conversion layers of photo-electromotive elements.

Further, measurements of the lattice plane spacing was found by x-ray diffraction.

With X-ray diffraction, the diffraction strength is measured while scanning through a diffraction angle of 2θ. The lattice plane spacing d can be found with a Bragg equation (2d sin θ=λ, where λ is the x-ray wavelength) from the measurements of 2θ, which is where the strength peaks. If the 2θ scan is performed slowly here and the peak position is found precisely, then information regarding distortions added to the lattice can also be obtained.

Measurements were performed on a polysilicon film (test sample B) and on a silicon film containing Ge (film deposition gas flow 10 sccm), and the results of comparing d values are shown in Table 3.

TABLE 3

| Test piece | Measurement index | Psi [°] | 2θ [°] | 2θ [°] (corrected) | d [nm] | a [nm] | Δa [nm] |
|---|---|---|---|---|---|---|---|
| A | (440) | 0 | 106.9092 | | 0.0960934 | 0.54359 | 0.00164 |
| | | 60 | 106.4369 | 106.4449 | 0.0963836 | 0.54523 | |
| B | (220) | 0 | 47.4447 | | 0.1918942 | 0.54276 | 0.00272 |
| | | 60 | 47.2188 | 47.1934 | 0.1928572 | 0.54548 | |

Figure 42:
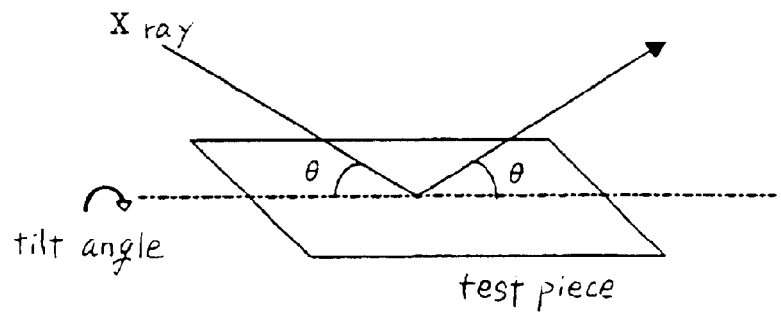
FIG. 42 is a diagram showing x-ray diffraction measuring and sample tilt angle.
Figure 43A:
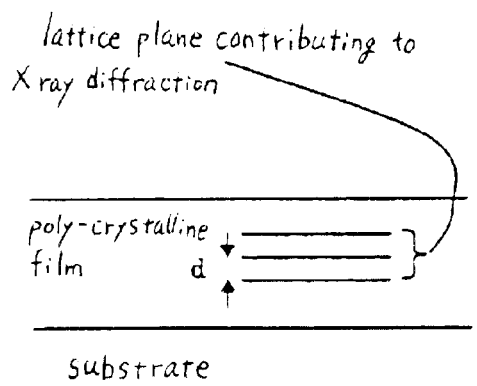
FIGS. 43A and 43B are diagrams showing sample tilt angle and lattice plane contribution to diffraction.
Figure 43B:
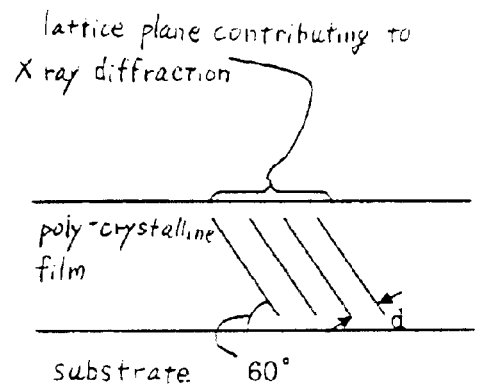

Quartz substrates are used for both test pieces, and a film thickness of 54 nm were formed at the respective conditions, a 10 ppm aqueous Ni solution was applied, and crystallization was performed (at 500° C. for 1 hour by heat treatment, and at 580° C. for 8 hours by heat treatment). Measurements were made, in addition to those of the lattice plane parallel to the semiconductor film, on lattice planes possessing an angle of 60° from the semiconductor film by giving the test piece a tilt angle, as shown in FIG. 42 and FIGS. 43A and 43B. This is shown schematically in FIGS. 43A and 43B.

Further, the measurement precision when using the 2θ large diffraction is increased. The diffractions able to be measured by changing the orientation of both test pieces differed, but measurements were performed and the largest 2θ diffraction was investigated in accordance with preliminary measurements for each case. The diffraction used in these measurements was (440) for the test sample B, and (220) for the test sample A.

When the samples possessed a tilt angle, characteristic systematic shifts in the x-ray optical system of the apparatus develop in the value of 2θ. These shifts are very little, but the influence of these differences cannot be ignored with these measurements, and therefore measurements of 2θ values were performed with tilt angles of 0° and 60° in advance using a standard test piece (a non-oriented tungsten powder). Compensation was performed using the amount of shift during those measurements. The results of measurements on the standard test piece are shown in Table 4.

TABLE 4

| Measurement index | Psi [°] | 2θ [°] | Δ2θ [°] |
| --- | --- | --- | --- |
| (310) | 0 | 100.628 | −0.0080 |
|  | 60 | 100.620 |  |
| (110) | 0 | 40.2444 | 0.0254 |
|  | 60 | 40.2698 |  |

The diffraction in which 2θ is near to the index in these measurements was selected for the polycrystalline samples. In other words, the (440) diffraction (near 2θ=106°) was measured for the test sample A, and therefore compensation was performed by the (310) diffraction of tungsten (2θ=100.628°). On the other hand, the test sample B was measured at the (220) diffraction (near 2θ=47°), and therefore compensation was performed by the (110) diffraction (2θ=40.2444°).

Further, when compared by the tilt angle Psi, the d value is larger for the case of 60° compared with 0° for both test samples, as shown in Table 3, and therefore the lattice is shown to have elongation distortion in the direction parallel to the film. If this is converted to the lattice constant a and comparison is performed between the test pieces, then the difference between both test pieces when they contain Ge is 0.00164 nm, but becomes a very large value equal to 0.00272 nm when the test pieces do not contain Ge. It is therefore possible to relieve the film distortions after crystallization by including Ge within the amorphous silicon film at the time of film formation.

Detailed explanations of the method of manufacturing the above crystalline silicon film containing germanium are given below.

[Embodiment Mode 1]

A method of manufacturing a crystalline semiconductor film explained with respect to FIGS. 11A to 11D is a method in which a metal element for promoting crystallization of silicon is added to the entire surface of an amorphous silicon film containing germanium. First, in FIG. 11A, a glass substrate, typically a Corning Corp. #1737 glass substrate, is used as a glass substrate 201. A silicon oxynitride film having a thickness of 100 nm is then formed as a blocking layer 202 on the surface of the substrate 201 by plasma CVD using $SiH_4$ and $N_2O$. The blocking layer 202 is formed so that alkaline metals contained in the glass substrate do not diffuse into a semiconductor film formed on the blocking layer.

An amorphous silicon film 203 containing germanium is manufactured by plasma CVD, and is formed on the substrate 201 by introducing $SiH_4$ and $GeH_4$ gas diluted to 10% by $SiH_4$ and $H_2$, into a reaction chamber and performing glow discharge separation. Detailed conditions of manufacture as shown in Table 1, and the conditions employed here are those of #SGN5 or #SGN10, or a set of conditions between #SGN5 and #SGN10. The thickness of the amorphous silicon film 203 containing germanium is formed to be 50 nm. In order to reduce impurities such as oxygen, nitrogen, and carbon as much as possible, $SiH_4$ having a purity equal to or greater than 99.9999% is used, and $GeH_4$ having a purity equal to or greater than 99.99% is used in the gas. Further, a compound molecular pump having an evacuation speed of 300 L/sec is formed in a first stage, and a dry pump having an evacuation speed of 40 $m^3$/hr is formed in a second stage for a reaction chamber having a volume of 13 liters. Along with preventing reverse diffusion of organic vapors from the evacuation system side, the vacuum level of the reaction chamber is enhanced, and impurity elements can be greatly prevented from being introduced within the film during film formation of the amorphous semiconductor film.

Figure 11A:
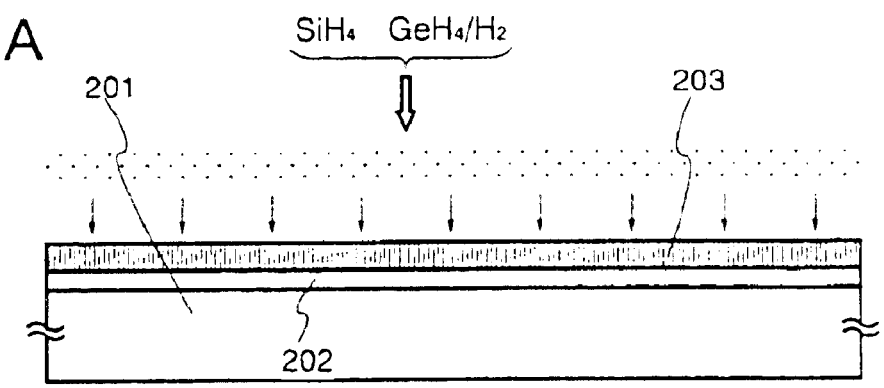
FIGS. 11A to 11D are diagrams for explaining a method of manufacturing a crystalline semiconductor film of the present invention.
Figure 11B:
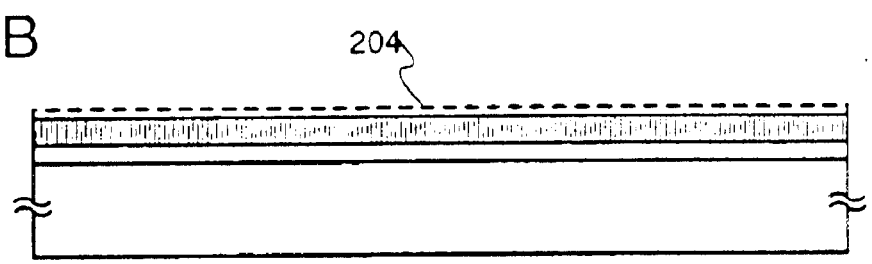
Figure 11C:
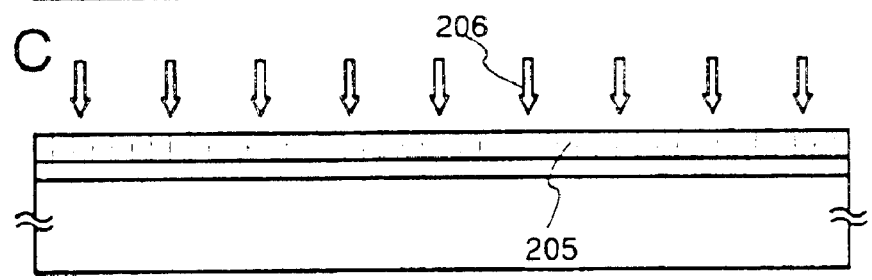

Then, as shown in FIG. 11B, a solution of nickel acetate salt containing 10 ppm nickel by weight is applied by a spinner, forming a nickel containing layer 204. In order to increase the adherence of the solution, an extremely thin oxide film is formed by an aqueous solution containing ozone as a surface process for the amorphous silicon film 203 containing germanium. The oxide film is then etched by a liquid mixture of hydrofluoric acid and hydrogen peroxide, forming a clean surface. An extremely thin oxide film is then once again formed by the aqueous solution containing ozone. The surface of silicon is normally hydrophobic, and therefore the aqueous nickel acetate salt solution can be applied uniformly by forming this type of oxide film.

Heat treatment is performed next at 500° C. for 1 hour, and driving out hydrogen from within the amorphous silicon film containing germanium. Heat treatment is then performed for 4 hours at 550° C., performing crystallization. A crystalline semiconductor film 205 having a high orientation ratio for the {101} lattice plane is thus formed. (See FIG. 11C.)

Figure 11D:
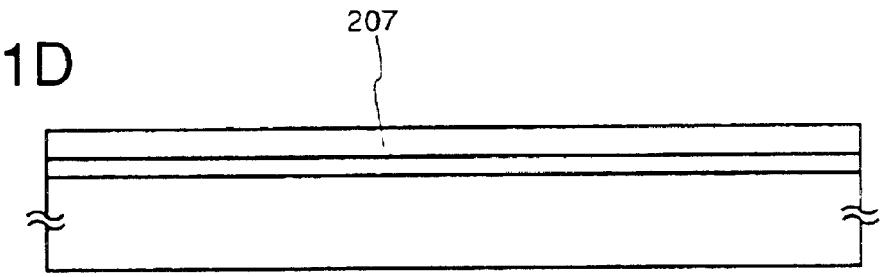
Figure 13A:
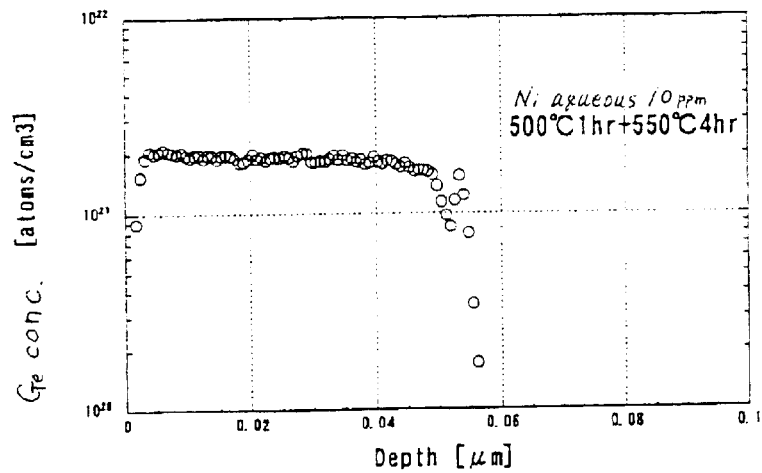
FIGS. 13A to 13C are graphs showing the results obtained when measuring, the concentration of Ge within a crystalline semiconductor film, after performing heat treatment processing or laser processing, by SIMS.
Figure 13B:
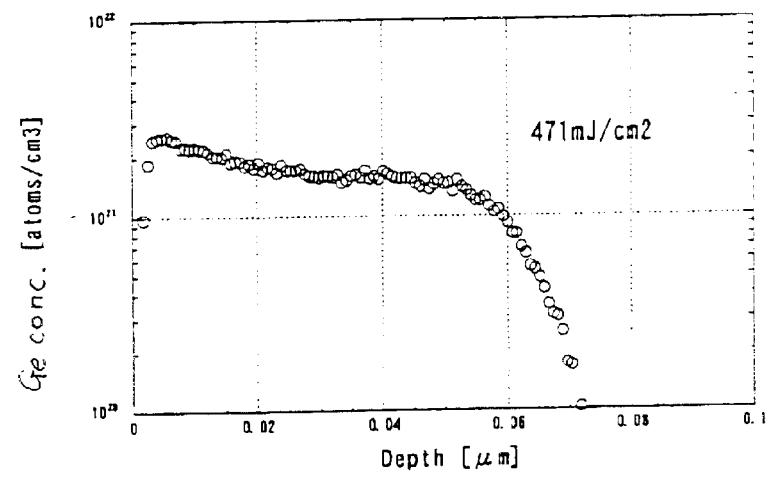
Figure 13C:
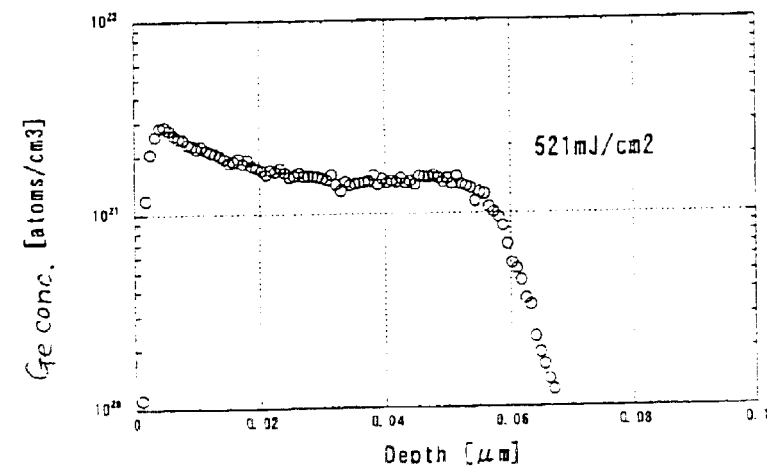

In addition, in order to increase the crystallinity (the proportion of crystalline components in the entire film volume) and in order to repair faults remaining within the crystal grains, laser processing is performed in which laser light 206 is irradiated to the crystalline semiconductor film 205. An excimer laser having emission at 30 Hz and a wavelength of 308 nm is used as the laser. The laser light is gathered to between 400 and 600 mJ/$cm^2$ by an optical system, and laser processing is performed while keeping an overlap ratio of 90 to 95%. A crystalline semiconductor film 207 can thus be obtained, as shown in FIG. 11D.

[Embodiment Mode 2]

A method of selectively forming a metal element for promoting crystallization of an amorphous semiconductor film is explained using FIG. 12A. A glass substrate as stated above, or a quartz substrate is employed as a substrate 220 in FIG. 12A. If a glass substrate is used, then a blocking layer is formed similar to that of embodiment mode 1.

An amorphous silicon film 221 containing germanium may be formed similar to that of embodiment mode 1 by plasma CVD, and germanium may be introduced by ion injection or ion doping. Further, it is also possible to employ a method of formation by low pressure CVD in which $Si_2H_6$ and $GeH_4$ are separated at a temperature of 450 to 500° C.

A silicon oxide film 222 having a thickness of 150 nm is then formed on the amorphous silicon film 221 containing germanium. There are no particular limitations on the method of manufacturing the silicon oxide film, for example, it can be formed with a mixture of TEOS (tetraethyl ortho silicate) and $O_2$, at a reaction pressure of 40 Pa, with the substrate temperature set from 300 to 400° C., and by discharging at a high frequency (13.56 MHz) electric power density of 0.5 to 0.8 W/$cm^2$.

An opening portion 223 is then formed in the silicon oxide film 222, and a nickel acetate salt solution containing 10 ppm by weight of nickel is applied. A nickel containing layer 224 is thus formed, and the nickel containing layer 224 contacts the amorphous silicon film containing germanium 221 only at the bottom portion of the opening portion 223.

Crystallization is performed by heat treatment at a heat treatment temperature of 500 to 650° C. for between 4 and 24 hours, for example at 570° C. for 14 hours. In this case, crystallization begins at portions of the amorphous silicon film in contact with nickel, and crystallization proceeds from there in a direction parallel to the surface of the substrate. A crystalline silicon film 225 thus formed is made from an aggregation of needle or rod shaped crystals, and each of the crystals are seen to have a specific directionality in growth when seen macroscopically. If the silicon oxide film 222 is then removed, the crystalline silicon film 225 can be obtained.

[Embodiment Mode 3]

The metal element, utilized in crystallization of the crystalline silicon films manufactured in accordance with the methods explained by embodiment mode 1 and embodiment mode 2, remains after crystallization. Even if the metal element does not have a uniform distribution within the film, it exists at an average concentration exceeding $1\times10^{19}/cm^3$. It is of course possible to use the film in this state in a channel-forming region for all types of semiconductor devices including TFTs, but it is preferable to remove the metal element by gettering.

One example of a gettering method is explained in embodiment mode 3 using FIGS. 12B-a to 12B-c. A glass substrate or a quartz substrate is employed as a substrate 230 in FIG. 12B-a. If a glass substrate is used, a blocking layer similar to that of embodiment mode 1 is formed. A silicon oxide film 232 is formed with a thickness of 150 nm as a mask on the surface of a crystalline semiconductor film 231, and an opening portion 233 is formed, forming a region in which the crystalline silicon film is exposed. It is possible to utilize the silicon oxide film 222 shown by FIG. 12A-a as is when performing manufacture in accordance with embodiment mode 2, and it can be switched over to the processes of embodiment mode 3 (FIG. 12B-a) as is after the processes of FIG. 12A-b. Phosphorus is then added by ion doping, forming a phosphorus added region 235 having a phosphorus concentration of $1\times10^{19}$ to $1\times10^{22}/cm^3$.

If heat treatment is then performed in a nitrogen atmosphere for 5 to 24 hours at 550 to 800° C., for example, at 600° C. for 12 hours, as shown in FIG. 12B-b, the phosphorus added region 235 works as a gettering site, and the metal elements remaining in the crystalline silicon film 231 can be segregated to the phosphorus added region 235.

Next, as shown in FIG. 12B-c, a crystalline silicon film 236, in which the concentration of the metal element used in the crystallization process is reduced to less than $1\times10^{17}/cm^3$, can be obtained by removing the silicon oxide film 232 used as a mask and the phosphorus added region 235 by etching.

Note that the TFTs shown as examples in this specification are reverse stagger type TFTs, and therefore a gate electrode, a and a gate insulating film covering the gate electrode are formed in advance before forming the amorphous semiconductor film. The amorphous semiconductor film is formed on the gate insulating film, and a crystalline semiconductor film having a high orientation ratio for the {101} lattice plane may be formed by freely combining any of the above embodiment modes 1 to 3.

A more detailed explanation of the present invention having the above structure is made by the embodiments shown below.

Embodiments

[Embodiment 1]

An example of manufacturing an n-channel reverse stagger TFT is explained below using FIGS. 14A to 14F.

A substrate 11 is first prepared. An insulating substrate such as glass substrate, a quartz substrate, or a crystalline glass substrate can be used as the substrate 11. Note that a structure in which a base film is formed in order to prevent impurities from diffusing from the substrate, and increasing the electrical characteristics of the TFT, may also be used. If a base film is formed, a film such as a silicon oxide film, a silicon nitride film, a silicon oxynitride film (SiOxNy), or a lamination film of these films can be used with a film thickness in the range of 100 to 500 nm. Film formation methods such as thermal CVD, plasma CVD, evaporation, sputtering, and low pressure thermal CVD can be used as the film formation means. Conversely, an insulating film may be formed on the surface of a semiconductor substrate such as one of silicon, germanium, or gallium arsenide, and this may also be used as the substrate.

Gate wirings (including gate electrodes) 12 are formed next from a single layer structure or a lamination structure. After forming a conductive film having a film thickness from 10 to 1000 nm, preferably in the range of 30 to 300 nm, using a method such as sputtering, evaporation, thermal CVD, plasma CVD, or low pressure thermal CVD as the means of forming the gate wirings 12, the gate wirings 12 is patterned by a known patterning technique. Further, a material having a conductive material or a semiconductor material as its main constituent. For example, a high melting point metal material such as Ta (tantalum), Mo (molybdenum), Ti (titanium), W (tungsten), chromium (Cr) may be used, as may a silicide compound of these metal materials and silicon. In addition, a material such as polysilicon having n-type or p-type conductivity, or a material layer having a low resistance metal material such as Cu (copper) or Al (aluminum) as its main constituent, may be used as the materials for gate wirings 12. There are no particular limitations placed upon the structure, provided that it is a structure having at least one layer. Note that a lamination structure in which a low resistance metal material is used as a lower layer, and a high melting point metal material is used as an upper layer, is preferable for the gate wirings. For example, a lamination structure of Al (lower layer) and Ta (upper layer), a lamination structure of Al (lower layer) and W (upper layer), and a lamination structure of Al (lower layer) and Cu (upper layer) are preferable lamination structures. Further, a structure in which an anodic oxidation film or an oxidation film is formed in order to protect the gate wirings may also be used.

Figure 14A:
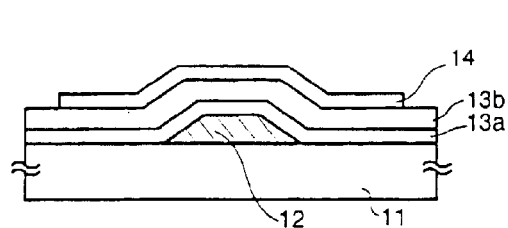
FIGS. 14A to 14F are diagrams for explaining a process of manufacturing an n-channel TFT.
Figure 14E:
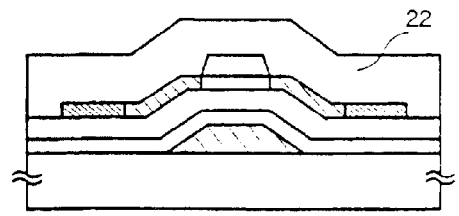
Figure 14B:
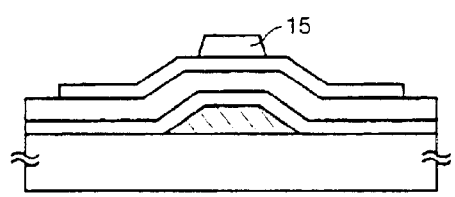

A gate insulating film is formed next. A silicon oxide film, a silicon nitride film, a silicon oxynitride film (SiOxNy), an organic resin film (BCB (benzocyclobutene) film), or a lamination film of these films can be used as the gate insulating film with a film thickness in the range of 100 to 400 nm. Methods such as thermal CVD, plasma CVD, low pressure thermal CVD, evaporation, sputtering, and application can be used as the film formation method. Lamination structure gate insulating films 13a and 13b are formed here, as shown in FIG. 14A. The lower layer gate insulating film 13a is formed from a film such as a silicon nitride film, which effectively prevents impurities from diffusing from the substrate or the gate wirings. The film thickness is formed in the range of 10 nm to 60 nm.

An amorphous semiconductor film is formed next. An amorphous silicon germanium film having silicon as its main constituent and containing germanium in a range from 0.1 atom % to 10 atom %, preferably between 1 and 5 atom %, or a lamination film of the amorphous silicon germanium film and an amorphous silicon film, formed with a film thickness of 20 to 100 nm, preferably in a range between 20 and 60 nm, can be used as an amorphous semiconductor film. Formation methods such as thermal CVD, plasma CVD, low pressure thermal CVD, evaporation, and sputtering can be used as the means of forming the amorphous semiconductor film.

Note that impurities will not mix into the interface between the gate insulating films and the amorphous semiconductor film if the gate insulating films 13a and 13b, and the amorphous semiconductor film are formed in succession, without exposure to the atmosphere, and good interface characteristics can be obtained.

A process of crystallizing the amorphous semiconductor film is preformed next, and after forming a crystalline semiconductor film, the crystalline semiconductor film obtained is patterned into a desired shape. (See FIG. 14A.) Note that there are no particular limitations regarding the order in which patterning of the semiconductor film is performed, and for example, it may be performed after adding an impurity element. One of the methods shown in embodiment mode 1 and embodiment mode 2 may be used as the crystallization process. In addition, gettering of the metal element contained within the crystalline semiconductor film may be performed using embodiment mode 3. Furthermore, if a natural oxide film on the amorphous semiconductor film surface is removed by using a fluoride etchant, such as a buffered acid, directly before the crystallization process, then the silicon bonds near the surface are terminated by hydrogen, and bonding with impurities becomes difficult. A good quality crystalline semiconductor film can be formed, and this etching is therefore preferable.

Next, an insulating film 15 is formed on the crystalline semiconductor layer 14. The insulating film 15 protects a channel-forming region during a process of adding an impurity element. A film such as a silicon oxide film, a silicon nitride film, a silicon oxynitride film (SiOxNy), an organic resin film (BCB film), or a lamination film of these films can be used as the insulating layer 15 with a film thickness in a range from 100 to 400 nm. The insulating film 15 is formed using a known patterning technique, for example using normal exposure or back surface exposure. (See FIG. 14B.)

A resist mask 16 is formed next using a photo-mask, and a doping process for adding an impurity element that imparts n-type conductivity to the crystalline semiconductor film is performed, forming first impurity regions ($n^+$ regions) 17a and 18a. (See FIG. 15C.) An impurity element residing in group 15 of the periodic table, for example an element such as P, As, Sb, N, and Bi can be used as the impurity element that imparts n-type conductivity to a semiconductor. Doping conditions (such as dosage and acceleration voltage) are suitably set in accordance with a plasma doping method and P (phosphorus) is added to the crystalline semiconductor film, which has, its surface exposed. An ion injection method also can be used as another doping method. Further, a first impurity region 17a is a high concentration impurity region, and later becomes a source/drain region. Therefore the dosage is set such that the sheet resistance becomes less than or equal to 500 Ω (preferably less than or equal to 300 Ω) when the TFT manufacture is complete.

Next, after removing the resist 16, a second doping process for adding an impurity element that imparts n-type conductivity is performed with the insulating layer 15 as a mask, forming second impurity regions ($n^-$ regions) 19 and 20. The second impurity regions 19 and 20 thus formed function as low concentration impurity regions (hereafter referred to as LDD regions). Note that the phosphorus concentration of the second impurity regions 19 and 20 is preferably within a range from $1 \times 10^{15}$ to $1 \times 10^{17}$ atoms/cm³ by SIMS analysis. The impurity element is additionally added to the first impurity regions 17a and 18a, forming first impurity regions 17b and 18b, and an effectively intrinsic crystalline semiconductor region 21 (hereafter referred to as a channel-forming region) remains directly under the insulating film 15. Note that, throughout this specification, the term essentially intrinsic indicates a region in which an impurity element is not contained at an amount capable of changing the Fermi level of the silicon. In other words, the term essentially intrinsic indicates a region containing an impurity that imparts n-type or p-type conductivity in a concentration range capable of controlling the threshold voltage, or a region in which the conductivity type is intentionally offset by the addition of an inverse conductivity type impurity.

Further, an insulating film may be formed on the semiconductor layer before performing the second doping, and the amount of doping may be controlled to be low concentration in accordance with the film thickness of the insulating film.

An interlayer insulating film 22 is formed next over the entire surface. A silicon oxide film, a silicon nitride film, a silicon oxynitride film, an organic resin film (such as a polyimide film or a BCB film), or a lamination film of these films can be used as the interlayer insulating film 22.

Activation of the impurity ions and restoration of damage during doping can be attained in accordance with furnace annealing, laser annealing, or lamp annealing performed after formation of the interlayer insulating film 22, or before formation of the interlayer insulating film 22. The nickel used as a catalyst when performing crystallization is gettered into the impurity regions 17b, 18b, 19, and 20 containing phosphorus at the same time during this process, and mainly the nickel concentration within the semiconductor layer which becomes the channel-forming region is reduced. A TFT having the channel-forming region thus manufactured has a low value of off current, a high electric field mobility can be obtained due to its good crystallinity, and good characteristics can be achieved.

Figure 14F:
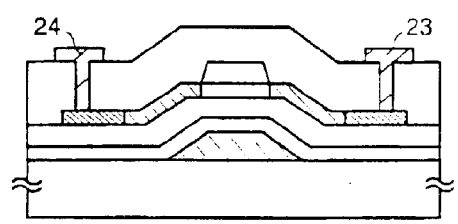
Figure 14C:
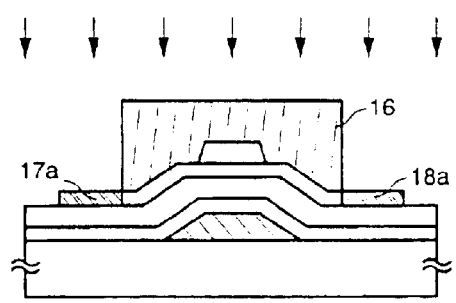
Figure 14D:
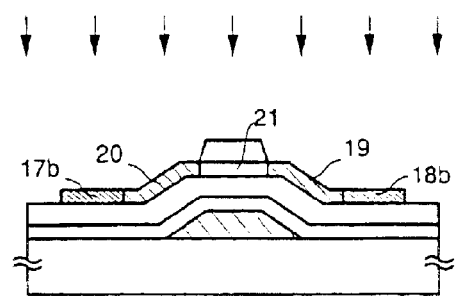

Then, after forming contact holes using a known technique, wirings 23 and 24 are formed, and the state shown in FIG. 14F is obtained. The wirings 23 and 24 function as source wirings or drain wirings. Heat treatment is performed within a hydrogen atmosphere last, hydrogenating the entire body, and the n-channel TFT is complete.

Note that embodiment 1 is not limited to the processes of doping in order ($n^+$ region→$n^-$ region), and it is also possible, for example, to use a process in which the order is from an $n^-$ region to an $n^+$; region, or a process in which only an $n^+$ region is formed.

Furthermore, an example is shown above in embodiment 1 in which patterning of the active layer is performed before formation of the insulating layer 15, but there are no particular limitations to this, and for example patterning may be performed before the crystallization process, before doping, or after the activation process.

In addition, a process for performing control of the TFT threshold value, in which addition of a minute amount of an impurity element to the channel-forming region (also referred to as a channel doping process) may also be added to embodiment 1.

If the TFT is to be made lightweight by the use of a plastic substrate, a separation layer and a base insulating film may be formed between the substrate and the gate insulating film. After performing heat treatment for the crystallization process, the substrate and the base insulating film may be separated by utilizing a fixed substrate, and the base insulating film and the plastic substrate may be joined.

A basic logic circuit such as a NAND circuit or a NOR circuit can be structured by using the n-channel TFT shown by embodiment 1, and in addition, a complex logic circuit (such as a signal dividing circuit, an op-amp, and a γ correction circuit) can also be structured using the n-channel TFT shown in embodiment 1.

Note that the TFT shown in embodiment 1 can be divided into two types, an enhancement type and a depletion type, by adding an element residing in group 15 of the periodic table (preferably phosphorus) or an element residing in group 13 of the periodic table (preferably boron) to the semiconductor which becomes the channel-forming region.

Further, there are cases in which an NMOS circuit is formed by combining n-channel TFTs, cases in which a circuit is formed by enhancement TFTs (hereafter referred to as an EEMOS circuit), and cases in which an enhancement TFT and a depletion TFT are combined (hereafter referred to as an EDMOS circuit).

An example of an EEMOS circuit is shown here in FIG. 15A, and an example of an EDMOS circuit is shown in FIG. 15B. Reference numerals 31 and 32 both denote enhancement type n-channel TFTs (hereafter referred to as E-type NTFT) in FIG. 15A. Further, in FIG. 15B reference numeral 33 denotes an E-type NTFT, while reference numeral 34 denotes a depletion type n-channel TFT (hereafter referred to as a D-type NTFT).

Note that, in FIGS. 15A and 15B, reference symbol $V_{DH}$ denotes an electric power source wiring for applying a positive voltage (positive electric power source wiring), and reference symbol $V_{DL}$ denotes an electric power source wiring for applying a negative voltage (negative electric power source wiring). The negative electric power source wiring may also be made into a ground electric potential electric power source wiring (ground electric power source wiring).

In addition, an example of manufacturing a shift register using the EEMOS circuit shown in FIG. 15A, or using the EDMOS circuit shown in FIG. 15B, is shown in FIGS. 16A and 16B. Reference numerals 40 and 41 denote flip-flop circuits in FIG. 16A. Further, reference numerals 42 and 43 denote E-type NTFTs. A clock signal (CL) is input to a gate of the E-type NTFT 42, and a clock signal having an inverted polarity (CL-bar) is input to a gate of the E-type NTFT 43. Further, reference numeral 44 denotes an inverter circuit, and the EEMOS circuit shown in FIG. 15A or the EDMOS circuit shown in FIG. 15B is used. It is therefore possible to structure all driver circuits of a liquid crystal display device by using n-channel TFTs.

Figure 17A:
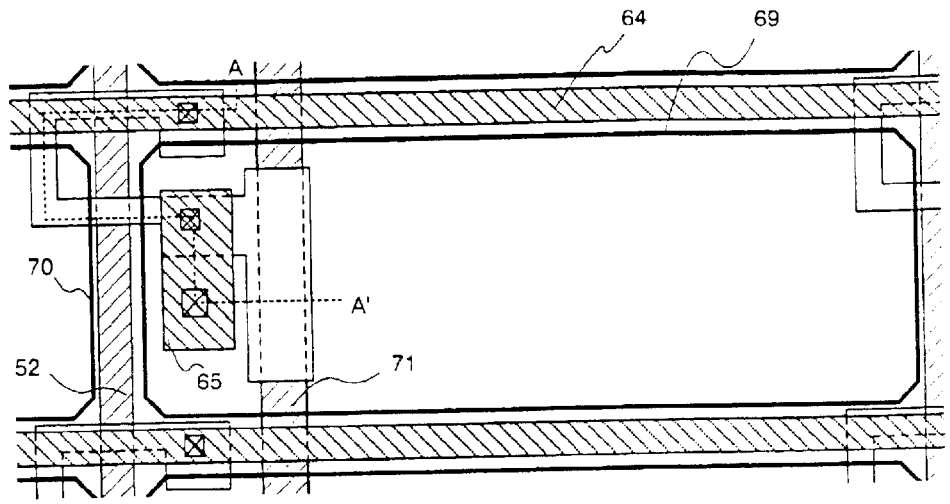
FIGS. 17A and 17B are a top surface diagram and a cross sectional diagram, respectively, of the structure of a pixel in a pixel portion.

Further, a pixel TFT of a pixel portion can be formed using the n-channel TFTs shown in embodiment 1. FIG. 17A is a top surface diagram of an enlargement of one pixel of a pixel portion, and the portion cut along the dotted line A–A' in FIG. 17A corresponds to a cross sectional structure of the pixel portion shown in FIG. 17B.

A pixel TFT portion is formed by an n-channel TFT in the pixel portion. A gate electrode 52 is formed on a substrate 51, and a first insulating film 53a made from silicon nitride, and a second insulating film 53b made from silicon oxide are formed on the gate electrode. Further, $n^+$ regions 54 to 56, channel-forming regions 57 and 58, and $n^-$ regions 59 and 60 between the $n^+$ regions and the channel-forming regions are formed as an active layer on the second insulating film. The channel-forming regions 57 and 58 are protected by insulating layers 61 and 62. After forming a contact hole in a first interlayer insulating film 63, which covers the insulating layers 61, 62, and the active layer, a wiring 64 for connecting to the $n^+$ region 54 is formed. A wiring 65 is connected to the n+region 56, and in addition, a passivation film 66 is formed. A second interlayer insulating film 67 is then formed on top. Additionally, a third interlayer insulating film 68 is formed on the second interlayer insulating film 67, and a pixel electrode 69 made from a transparent conductive film such as ITO or $SnO_2$ is connected to the wiring 65. Furthermore, reference numeral 70 denotes a pixel electrode neighboring the pixel electrode 69.

An example of a transmission type liquid crystal display device is shown in embodiment 1, but there are no limitations to this type of device. For example, it is possible to manufacture a reflection type liquid crystal display device by using a metal material having reflectivity as the pixel electrode material, changing the patterning of the pixel electrode, and adding/eliminating process as appropriate.

Note that, in embodiment 1, the gate wirings of the pixel TFTs of the pixel portion are given a double gate structure, but a multi-gate structure such as a triple gate structure may also be used in order to reduce dispersion in the off current. Further, a single gate structure may also be used in order to increase the aperture ratio.

A capacitor portion of the pixel portion is formed by a capacitor wiring 71, the $n^+$ region 56, and the first insulating film and the second insulating film acting as a dielectric.

Figure 17B:
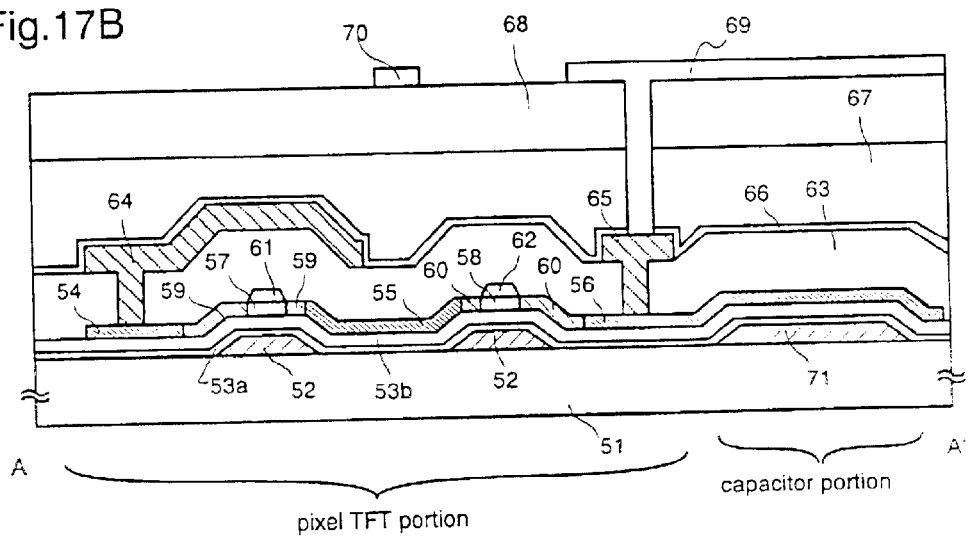

Note that the pixel portion shown by FIGS. 17A and 17B is merely one example, and there are of course no special limitations to this structure.

Therefore, by forming a driver circuit using the circuits shown in FIGS. 15A and 15B, and in FIGS. 16A and 16B, and the pixel portion shown in FIGS. 17A and 17B on the same substrate, all TFTs on the active matrix substrate can be formed by n-channel TFTs. A process for forming p-channel TFTs can be omitted provided that all TFTs on the active matrix substrate are structured by n-channel TFTs, and therefore the process of manufacturing the liquid crystal display device can be simplified. Furthermore, the yield of the manufacturing process can be increased, and the cost of manufacturing the liquid crystal display device can be reduced.

An example of manufacturing a liquid crystal display device using the active matrix substrate thus obtained is shown below.

Figure 18:
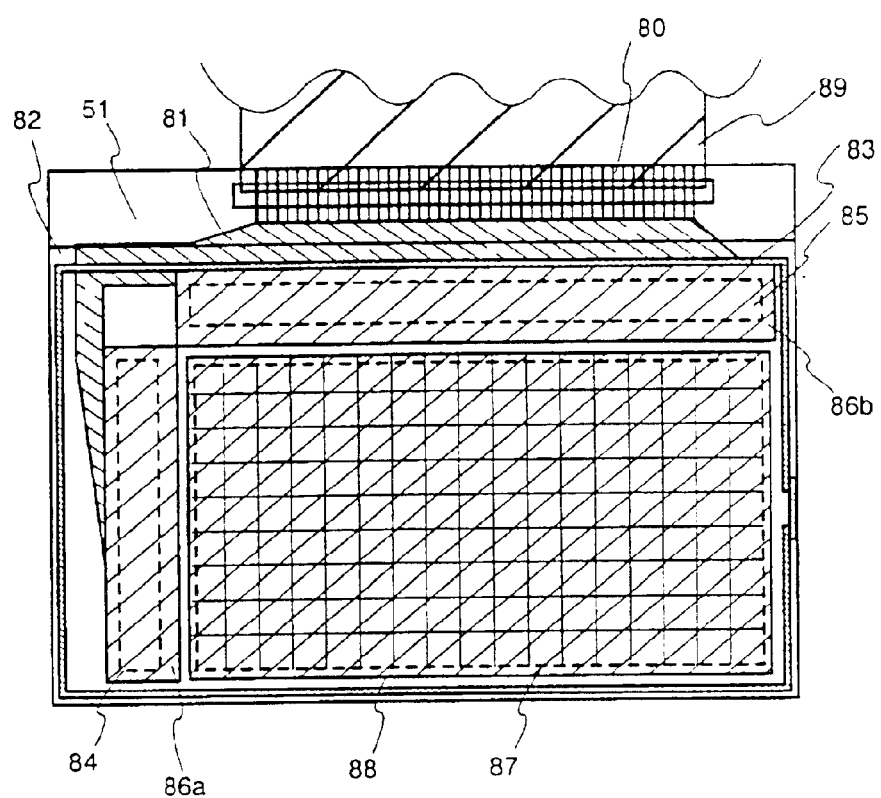
FIG. 18 is a diagram showing an external view of an AM-LCD.

The top surface diagram shown in FIG. 18 has an active matrix substrate on which a pixel portion, a driver circuit portion, an external input terminal to which an FPC (flexible printed circuit) is attached, and a wiring 81 for connecting the external input terminal to input portions of each circuit, are formed, and an opposing substrate 82 on which color filters and the like are formed, and both substrates are joined through a sealing material 83.

A light shielding layer 86a is formed on the opposing substrate side so as to overlap with a gate side driver circuit 84, and a light shielding layer 86b is formed on the opposing substrate side so as to overlap with a source side driver circuit 85. Further, color filters 88 formed in the opposing substrate above the pixel portion 87 are formed with each pixel corresponding to light shielding layers and pigment layers of red (R), green (G), and blue (B). In actual display, color display is formed by the three colors of the red R) pigment layer, the green (G) pigment layer, and the blue (B) pigment layer, but the arrangement of each of these pigment layers is arbitrary.

The color filters 88 are formed on the opposing substrate in order to provide colorization here, but there are no particular limitation to this structure, and color filters may also be formed on the active matrix substrate when manufacturing the active matrix substrate.

Further, the light shielding layers are formed between adjacent pixels in the color filters, shielding light in locations outside of display regions. The light shielding layers 86a and 86b are also formed in regions covering the driver circuit, but the regions covering the driver circuit are covered by a cover when later installing the liquid crystal display device into an electronic device as a display section, and therefore a structure in which the light shielding layers are not formed may also be used. Further, a light shielding layer may also be formed on the active matrix substrate when manufacturing the active matrix substrate.

Light shielding may also be suitably arranged by lamination layers in which a plurality of pigment layers for structuring color filters overlap between the opposing substrate and opposing electrodes, without forming the above light shielding layers, shielding light in locations outside of the display regions and shielding light from the driver circuit.

Further, an FPC 89 composed of a base film and a wiring is joined to the external input terminal by an an-isotropic conductive resin. In addition, the mechanical strength is increased by use of a reinforcing plate.

A liquid crystal display device thus manufactured can then be used as a display section of all types of electronic devices.

Figure 19:
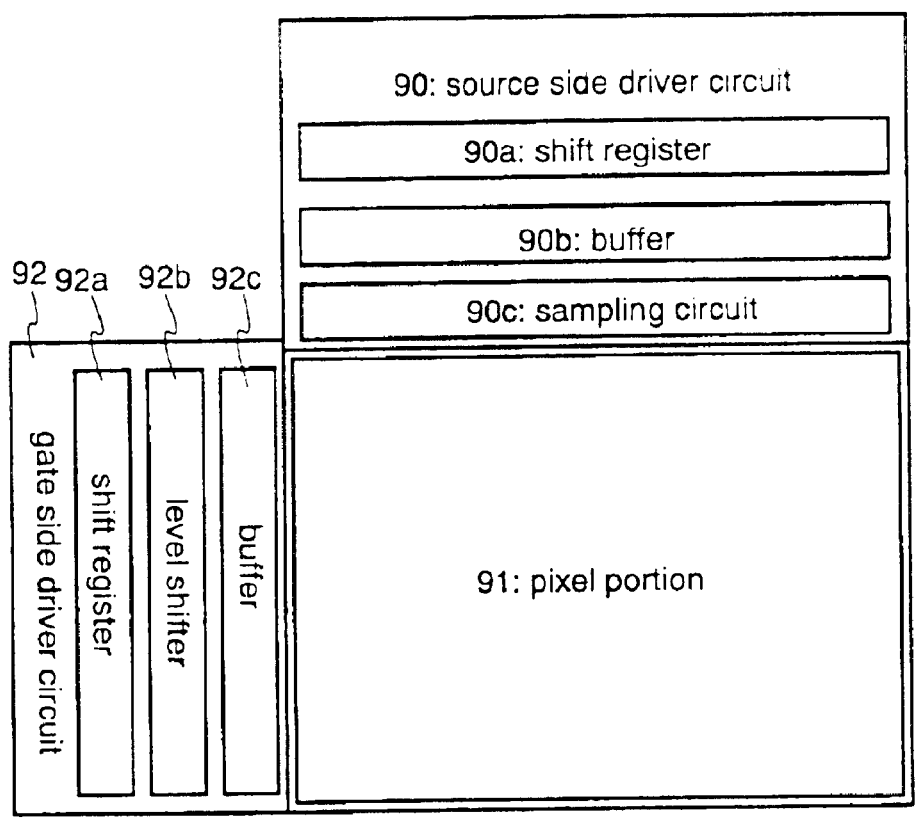
FIG. 19 is a block diagram of circuits of an analog drive display device.

A block diagram of the above liquid crystal display device is shown in FIG. 19. Note that FIG. 19 is a circuit structure for performing analog drive. Embodiment 1 has a source side driver circuit 90, a pixel portion 91, and a gate side driver circuit 92. Note that, throughout this specification, the term driver circuit is a generic name, which includes source side processing circuits and gate side driver circuits.

The source side driver circuit 90 is formed by a shift register 90*a*, a buffer 90*b*, and a sampling circuit (transfer gate) 90*c*. Further, the gate side driver circuit 92 is formed by a shift register 92*a*, a level shifter 92*b*, and a buffer 92*c*. Note that the shift register shown in FIGS. 16A and 16B may be used for the shift registers 90*a* and 92*a*. Further, level shifter circuits may also be formed between the sampling circuits and the shift register circuits, if necessary.

The pixel portion 91 contains a plurality of pixels in embodiment 1, and each TFT element is formed in the plurality of pixels.

The circuits of the source side driver circuit 90 and the gate side driver circuit 92 are all formed by n-channel TFTs, and all of the circuits are formed with the EEMOS circuit shown in FIG. 15A as a basic unit. However, the electric power consumption becomes slightly higher here when compared to a conventional CMOS circuit.

Note that, although not shown in the figures, an additional gate side driver circuit may also be formed on the side opposite to the gate side driver circuit 92, sandwiching the pixel portion 91.

Figure 20:
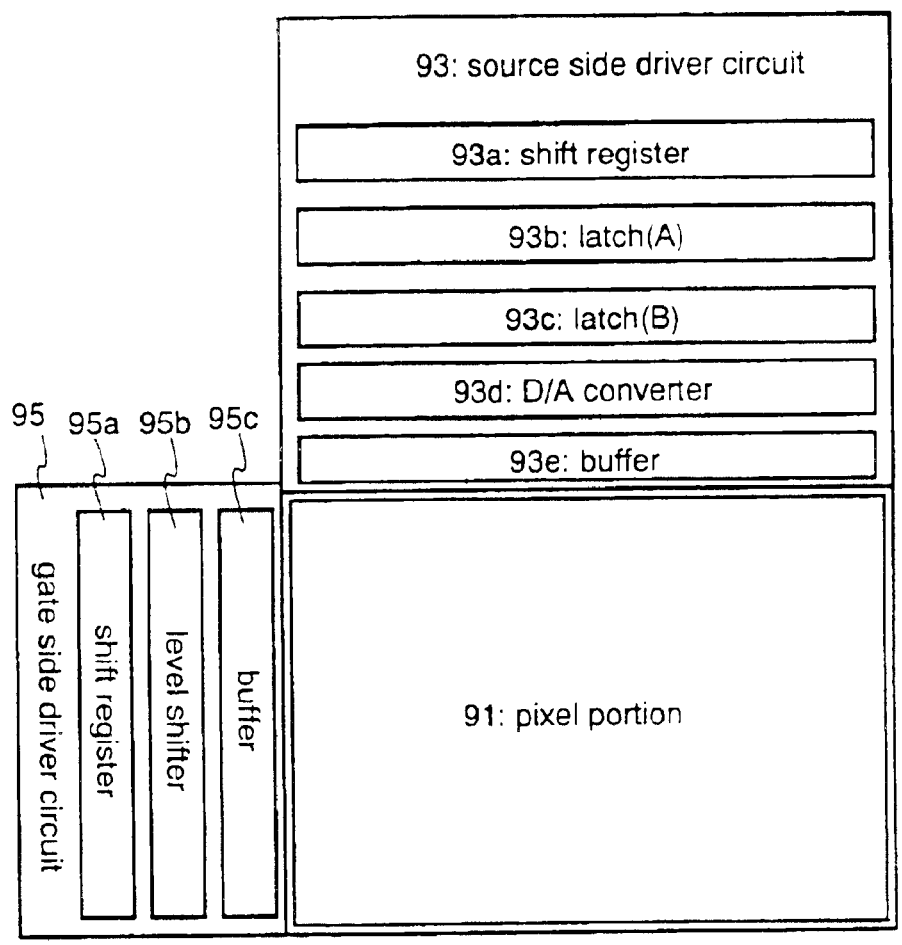
FIG. 20 is a block diagram of circuits of a digital drive display device.

Furthermore, a latch (A) 93*b* and a latch (B) 93*c* may be formed instead of the sampling circuit, as shown in FIG. 20, for a case of digital drive. A source side driver circuit 93 is formed by a shift register 93*a*, the latch (A) 93*b*, the latch (B) 93*c*, a D/A converter 93*d*, and a buffer 93*e*. Further, a gate side driver circuit 95 is formed by a shift register 95*a*, a level shifter 95*b*, and a buffer 95*c*. Note that the shift register shown in FIGS. 16A and 16B may be used as the shift registers 93*a* and 95*a*. Further, a level shifter circuit may also be formed between the latch (B) 93*c* and the D/A converter 93*d*, if necessary.

Note that the above structure can be realized in accordance with the manufacturing process shown in FIGS. 14A to 14F. Furthermore, only the structure of the pixel portion and the driver circuit portion is shown in embodiment 1, but memory and microprocessors may also be formed in accordance with the manufacturing process of embodiment 1.

[Embodiment 2]

An example of manufacturing a p-channel reverse stagger type TFT is explained below using FIGS. 21A to 21E.

Only the doping process differs in embodiment 2 from that of embodiment 1, and the other processes are identical. An explanation of the identical processes is therefore omitted.

First, similar to embodiment 1, gate insulating films 303*a* and 303*b* are formed after forming a gate wiring 302 on a substrate 301. Next, in accordance with embodiment 1, a semiconductor layer 304 is formed. (See FIG. 21A.)

An insulating layer 305 is formed next in accordance with embodiment 1. (See FIG. 21B.)

A process of adding an impurity element which imparts p-type conductivity to the semiconductor layers is performed next using the insulating layer 305 as a mask, forming impurity regions ($p^+$ regions) 306 and 307. (See FIG. 21C.) A periodic table group 13 element, for example B, Al, Ga, In, or Tl, can be used as the impurity element which imparts p-type conductivity to a semiconductor material. Boron (B) is used as the p-type conductive impurity element here, and a plasma doping method is employed. Diborane ($B_2H_6$) diluted to between 1 and 10% by hydrogen is used as a doping gas. An ion injection method can also be used as another method of doping.

An interlayer insulating film 307 is formed next in accordance with embodiment 1. (See FIG. 21C.)

Activation of the impurity ions, and repair of damage occurring during doping, can be performed by furnace annealing, laser annealing, or lamp annealing either after forming the interlayer insulating film 307, or before forming the interlayer insulating film 307.

Figure 21A:
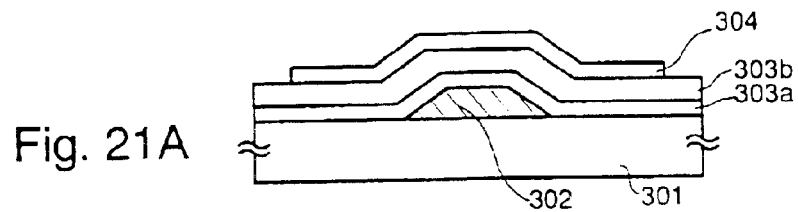
FIGS. 21A to 21E are diagrams for explaining a process of manufacturing a p-channel TFT.
Figure 21B:
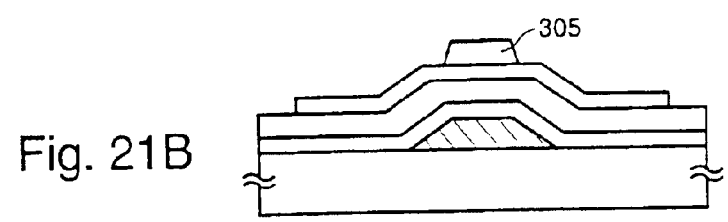
Figure 21C:
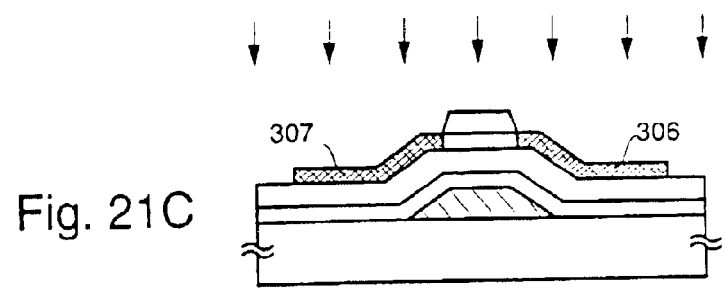
Figure 21D:
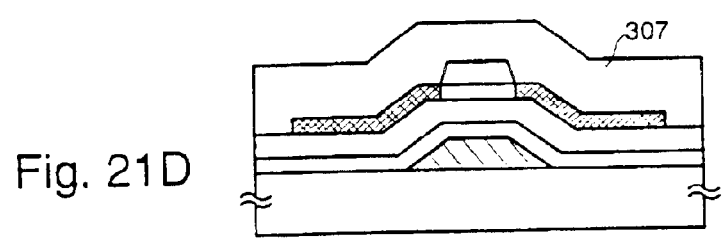
Figure 21E:
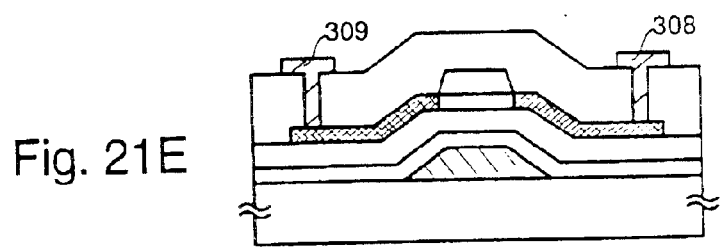
Figure 22A:
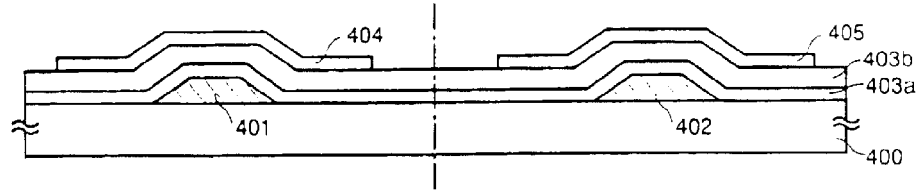
FIGS. 22A to 22D are diagrams for explaining a process of manufacturing CMOS structure TFTs.
Figure 22B:
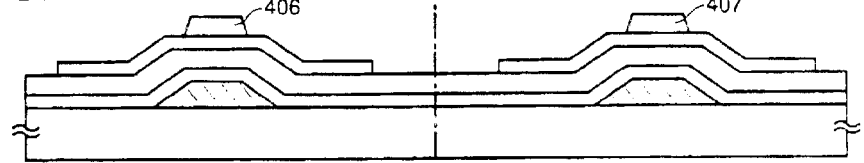
Figure 22C:
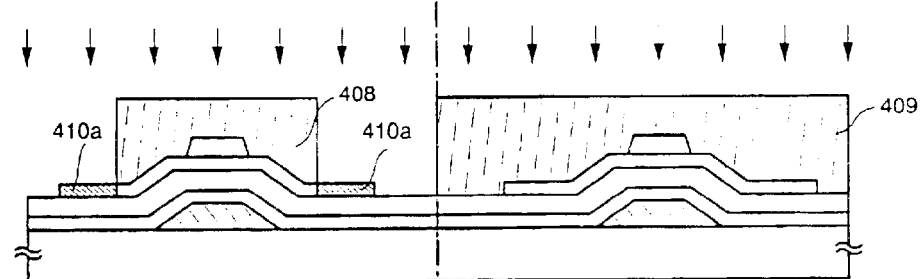
Figure 22D:
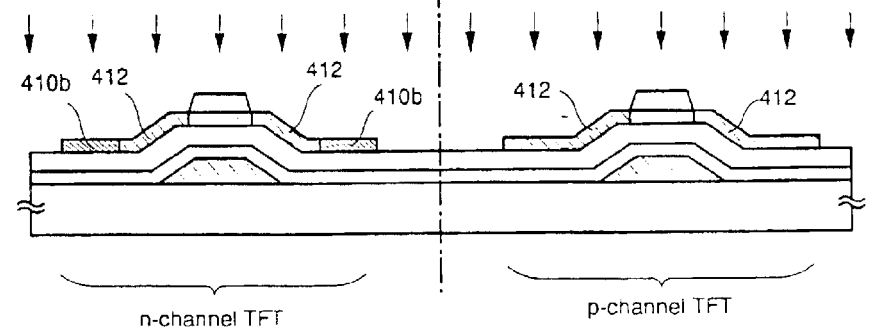

After then forming a contact hole using a known technique, wirings 308 and 309 are formed, and the state shown in FIG. 21E is obtained. The wirings 308 and 309 function as source wirings or drain wirings. Finally, heat treatment is performed within a hydrogen atmosphere, the entire body is hydrogenated, and the p-channel TFT is completed.

Note that, although only one doping process is performed in embodiment 2, and an LDD region is not formed, an LDD region may be formed similar to that of embodiment 1 by utilizing resist.

Further, a process for adding a very small amount of an impurity element to the channel-forming region to control the TFT threshold value (also referred to as a channel doping process) may be added to embodiment 2.

A basic logic circuit may be structured using the p-channel TFT shown by embodiment 2, and in addition, a plurality of logic circuits (such as a signal dividing circuit, a D/A converter, an op-amp, and a γ correction circuit) can also be structured using the p-channel TFT shown by embodiment 2. In addition, memory and microprocessors can also be formed using the p-channel TFT of embodiment 2. For example, it is possible to structure all driver circuits of a liquid crystal display device by using the p-channel TFTs.

It is also possible to use the p-channel TFT of embodiment 2 as a substitute for the n-channel TFT used in the pixel TFTs of the pixel portion of embodiment 1.

All TFTs on an active matrix substrate on which a driver circuit and a pixel portion are formed can therefore be formed by p-channel TFTs. If all TFTs on an active matrix substrate are structured by p-channel TFTs, a process of forming n-channel TFTs can be omitted, and therefore the process of manufacturing a liquid crystal display device can be simplified. Furthermore, the yield of the manufacturing process can be increased, and the cost of manufacturing the liquid crystal display device can be reduced, in accordance with such.

The liquid crystal display device shown in FIG. 18 can be formed similar to embodiment 1 using the active matrix substrate thus obtained.

Furthermore, embodiment 1 and embodiment 2 can be combined.

[Embodiment 3]

An example of manufacturing an n-channel reverse stagger type TFT and a p-channel reverse stagger type TFT on the same substrate is explained here using FIGS. 22A to 22D and FIGS. 23A to 23C.

Only the doping process differs in embodiment 3 from that of embodiment 1, and the other processes are identical. An explanation of the identical processes is therefore omitted.

First, similar to embodiment 1, gate insulating films 403a and 403b are formed after forming gate wirings 401 and 402 on a substrate 400. Semiconductor layers 404 and 405 are formed next in accordance with embodiment 1. (See FIG. 22A.)

Insulating layers 406 and 407 are formed next in accordance with embodiment 1. (See FIG. 22B.)

A resist mask 408, which covers portions of the semiconductor layers that become an n-channel TFT, is formed using a photo mask, and a resist mask 409, which covers portions of the semiconductor layers which become a p-channel TFT, is also formed using a photo-mask. A doping process for adding an impurity element that imparts n-type conductivity into the semiconductor layers is performed, forming a first impurity region ($n^+$ region) 410a. (See FIG. 22C.)

Next, after removing the resist masks 408 and 409, a second doping process for adding an impurity element which imparts n-type conductivity to the semiconductor layers is performed with the insulating layers 406 and 407 acting as masks, forming a second impurity region ($n^-$ region) 412. (See FIG. 22D.) A first impurity region 410b, in which additional impurity is added, is formed in this process.

A resist mask 414 for covering the n-channel TFT is formed next using a photo-mask, and a process for adding an impurity element which imparts p-type conductivity to the semiconductor layers is performed, forming a third impurity region ($p^+$ region) 413. (See FIG. 23A.)

Activation of the impurity ions and restoration of damage occurring during doping can be performed next by furnace annealing, laser annealing, or lamp annealing, after removing the resist mask 414. The nickel used as a catalyst during crystallization is also gettered at the same time by this process into the impurity regions 410b, 412, and 413 containing phosphorus. Mainly, the concentration of nickel within the semiconductor layers, which become channel-forming regions is reduced. The value of the off current for TFTs having channel-forming regions thus manufactured is lowered, and a high electric field effect mobility can be obtained due to good crystallinity, and good characteristics for the TFTs can be achieved.

A source region, a drain region, a low concentration impurity region, and a channel-forming region of the n-channel TFT are formed via the above processes, as are a source region, a drain region, and a channel-forming region of the p-channel TFT.

An interlayer insulating film 415 is formed next over the entire surface in accordance with embodiment 1. (See FIG. 23B.)

Figure 23A:
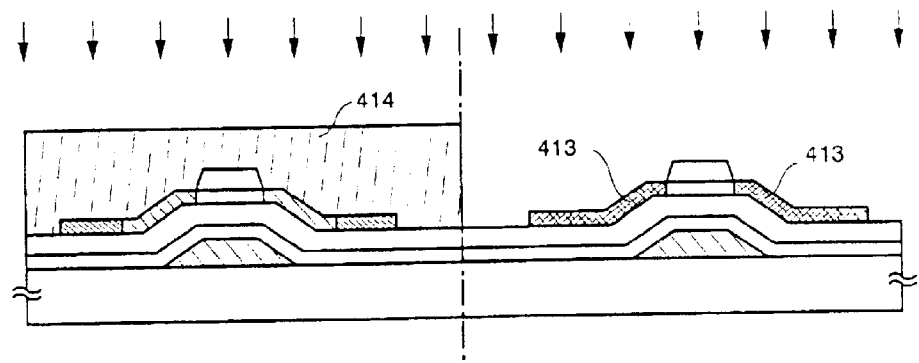
FIGS. 23A to 23C are diagrams for explaining the process of manufacturing CMOS structure TFTs.
Figure 23B:
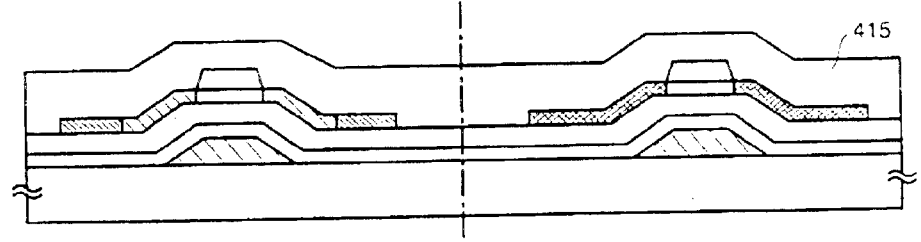
Figure 23C:
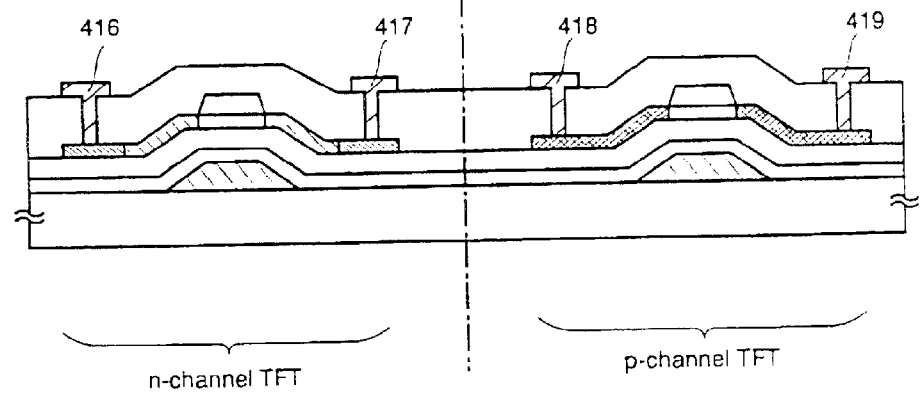

Wirings 416 to 419 are then formed after forming a contact hole using a known technique, and the state shown in FIG. 23C is obtained. The wirings 416 to 419 function as source wirings or drain wirings. Finally, heat treatment is performed in a hydrogen atmosphere, hydrogenating the entire body, and the n-channel TFT and the p-channel TFT are completed.

Note that there are no limitations to the doping order of embodiment 2, which is from the $n^+$ region to the $n^-$ region to the $p^+$ region, and it is possible for the order to be carried out from the $p^+$ region to the $n^-$ region to the $n^+$ region, for example.

Further, a process for adding a very small amount of an impurity element to the channel-forming region to control the TFT threshold value (also referred to as a channel doping process) may be added to embodiment 3.

A circuit in which the n-channel TFT and the p-channel TFT shown by embodiment 3 are combined in a complementary manner is referred to as a CMOS circuit, and the CMOS circuit is a fundamental circuit for structuring semiconductor circuits.

Figure 24A:
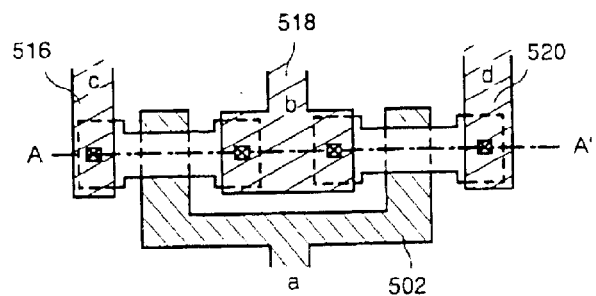
FIGS. 24A to 24C are a top surface diagram, a cross sectional diagram, and a circuit diagram, respectively, of a CMOS circuit.
Figure 24B:
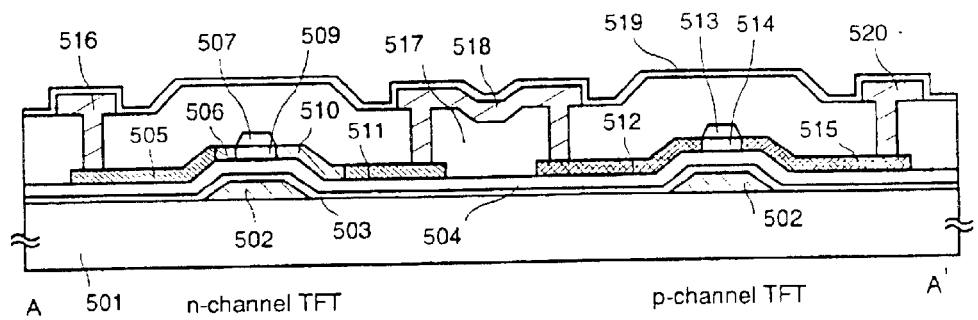
Figure 24C:
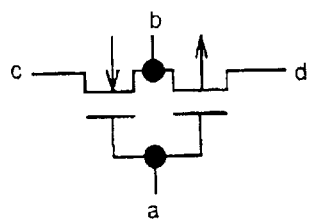

An example of a CMOS circuit is shown in FIGS. 24A to 24C.

The CMOS circuit shown by FIGS. 24A to 24C is also referred to as an inverter circuit, and is a fundamental circuit for structuring semiconductor circuits.

FIG. 24A is a diagram corresponding to the top surface of FIG. 24B, and the portion cut along the dotted line A–A' in FIG. 24A corresponds to the cross sectional structure of the CMOS circuit of FIG. 24B. Further, FIG. 24C is a circuit diagram corresponding to FIG. 24A and to FIG. 24B.

Both TFTs (thin film transistors) are formed on a substrate 501 in FIG. 24B. A gate electrode 502 is formed in a p-channel TFT of the CMOS circuit, and a first insulating film 503 made from silicon nitride, and a second insulating film 504 made from silicon oxide are formed on the gate electrode 502. A $p^+$ region 512 (drain region), a $p^+$ region 515 (source region), and a channel-forming region 514 are formed as an active layer on the second insulating film. In order to reduce the number of process steps in embodiment 3, a low concentration impurity region (LDD region) is not formed between the high concentration impurity region and the channel-forming region in the p-channel TFT, but there are no particular limitations to this structure, and an LDD region may also be formed. The channel-forming region 514 is protected by an insulating layer 513. Contact holes are formed in a first interlayer insulating film 517 covering the insulating layer 513 and the semiconductor layer, and wirings 518 and 520 are connected to the $p^+$ regions 512 and 515. In addition, a passivation film 519 is formed on top.

Further, an $n^+$ region (source region) 505, an $n^+$ region (drain region) 511, a channel-forming region 509, and $n^-$ regions 506 and 510 between the $n^+$ regions and the channel-forming region are formed as an active layer in the n-channel TFT. Note that the $n^-$ region 510 contacting the drain region is formed having a width larger than that of the $n^-$ region 506, increasing its reliability. Contact holes are formed in the first interlayer insulating film covering the insulating film 508, and wirings 516 and 518 are formed in the $n^+$ regions 505 and 511, respectively. In addition, the passivation film 519 is formed on top. Note that portions outside of the semiconductor layer have the same overall structure as the p-channel TFT, and an explanation is therefore omitted. Reference numeral 507 denotes an insulating film having the same function as that of the insulating layer 513.

A basic logic circuit is structured by combining these types of CMOS circuits, and a plurality of logic circuits (such as a signal dividing circuit, a D/A converter, an op-amp, and a γ correction circuit) can also be structured by combining CMOS circuits. In addition, memory and microprocessors can be formed.

For example, an active matrix substrate can be formed in which a driver circuit prepared with CMOS circuits of embodiment 3 and a pixel portion prepared with pixels composed of n-channel TFTs are formed on the same substrate. Further, an active matrix substrate can be formed in which a driver circuit prepared with CMOS circuits of embodiment 3 and a pixel portion prepared with pixels composed of p-channel TFTs are formed on the same substrate.

The liquid crystal display device shown in FIG. 18 can similarly be formed in accordance with embodiment 1 by using the active matrix substrate thus obtained.

Furthermore, embodiment 3 can be freely combined with embodiment 1 and embodiment 2.

[Embodiment 4]

An example of manufacturing an EL (electroluminescence) display device using the TFTs obtained by embodiments 1 to 3 is explained below using FIGS. 25, 26A, and 26B. The EL display device is also called a light emitting device or a light emitting diode.

Figure 25:
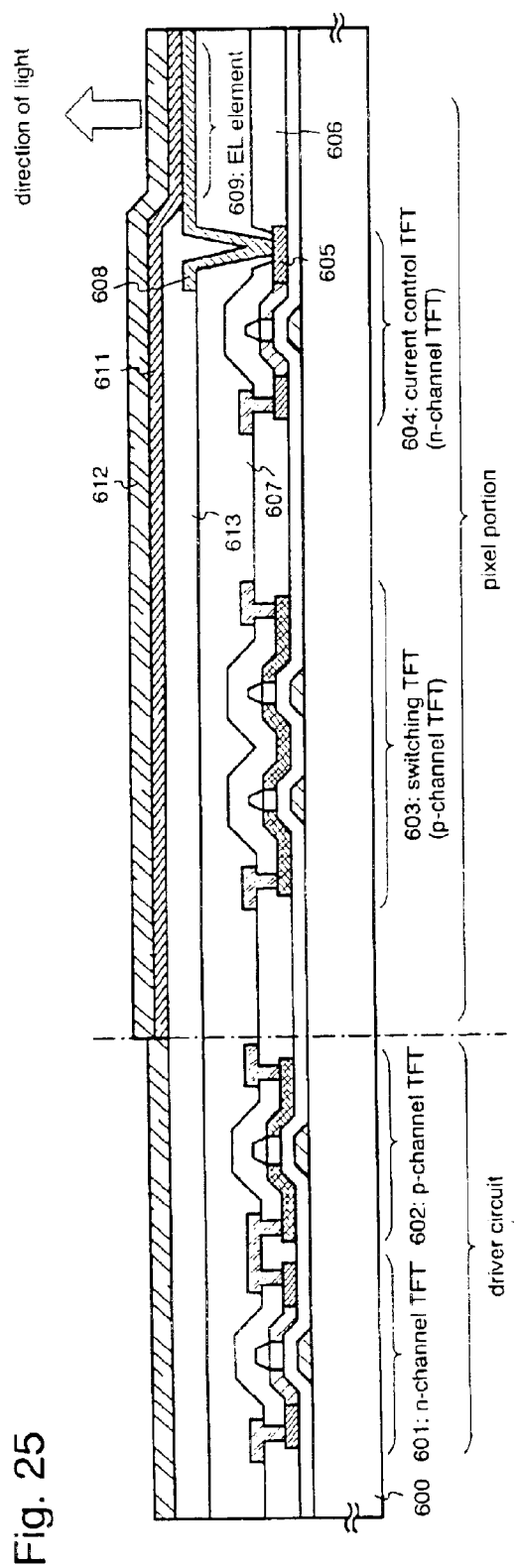
FIG. 25 is a cross sectional structure diagram of a driver circuit and a pixel portion of an EL display device.

An example of a light emitting device having a pixel portion and a driver circuit for driving the pixel portion on the same insulating body (the state before the sealing) is shown in FIG. 25. Note that the basic unit of a CMOS circuit is shown in the driver circuit, and one pixel is shown in the pixel portion. This CMOS circuit can be obtained in accordance with embodiment 3.

Reference numeral 600 denotes an insulating body in FIG. 25, and an n-channel TFT 601, a p-channel TFT 602, a switching TFT 603 composed of a p-channel TFT, and a current control TFT 604 composed of an n-channel TFT are formed on the insulating body 600. Further, all TFTs in embodiment 4 are structured by reverse stagger TFTs.

Embodiment 3 may be referred to for an explanation of the n-channel TFT 601 and the p-channel TFT 602, and therefore such explanation is omitted here. Further, the switching TFT 603 has a structure in which two channel-forming regions are formed between a source region and a drain region (double gate structure), and this structure can be understood easily by referring to the explanation of the p-channel TFT in embodiment 2. Such explanation is therefore omitted here. Note that there are no particular limitations to the double gate structure in embodiment 4, and a single gate structure in which one channel forming region is formed, and a triple gate structure in which three channel-forming regions are formed may also be used.

Further, a contact hole is formed in a first interlayer insulating film 606 before forming a second interlayer insulating film 607 on a drain region 605 of the current control TFT 604. This is done in order to simplify an etching process when forming a contact hole in the second interlayer insulating film 607. A contact hole is formed in the second interlayer insulating film 607 so as to reach the drain region 605, and a pixel electrode 608 is formed contacting the drain region 605. The pixel electrode 608 is an electrode which functions as a cathode of an EL element, and the pixel electrode 608 is formed using a conductive film containing an element residing in periodic table group 1 or group 2. A conductive film made from a lithium and aluminum compound is used in embodiment 4.

Reference numeral 613 denotes an insulating film formed so as to cover the end portion of the pixel electrode 608, and is referred to as a bank throughout this specification. The bank 613 may be formed by an insulating film containing silicon or from a resin film. If a resin film is used, damage to the insulating properties at the time of film deposition can be suppressed if carbon particles or metal particles are added so that the resistivity of the resin film becomes from $1 \times 10^6$ to $1 \times 10^{12}$ $\Omega$m (preferably from $1 \times 10^8$ to $1 \times 10^{10}$ $\Omega$m).

Further, an EL element 609 is composed of the pixel electrode (cathode) 608, an EL layer 611, and an anode 612. A conductive film having a high work function, typically a conductive oxide film, is used for the anode 612. Indium oxide, tin oxide, zinc oxide, or a compound of these materials may be used as the conductive oxide film.

Note that, throughout this specification, a lamination body in which a hole injecting layer, a hole transporting layer, a hole stopping layer, an electron transporting layer, an electron injecting layer, or an electron stopping layer are combined with respect to a light emitting layer is defined as an EL layer.

Known organic EL materials and inorganic EL materials can be used as the EL layer. Further, there are low molecular weight (monomer) materials and high molecular weight (polymer) materials as organic EL materials, and each type may be used. A thin film made from a light emitting material (singlet compound) in which light is emitted when returning to a base state from a singlet excitation state (fluorescence), and a thin film made from a light emitting material (triplet compound) in which light is emitted when returning to a base state from a triplet excitation state (phosphorescence) can be used as the EL layer.

Note that, although not shown in the figures, it is effective to form a passivation film so as to completely cover the EL element 609 after forming the anode 612. An insulating film made from a carbon film, a silicon nitride film, or a silicon oxynitride film may be used as the passivation film in either a single layer structure or a lamination structure of a combination of the above films.

An explanation of the EL display device after performing up through a process of sealing (or enclosing) in order to protect the EL element is explained next using FIGS. 26A and 26B.

Figure 26A:
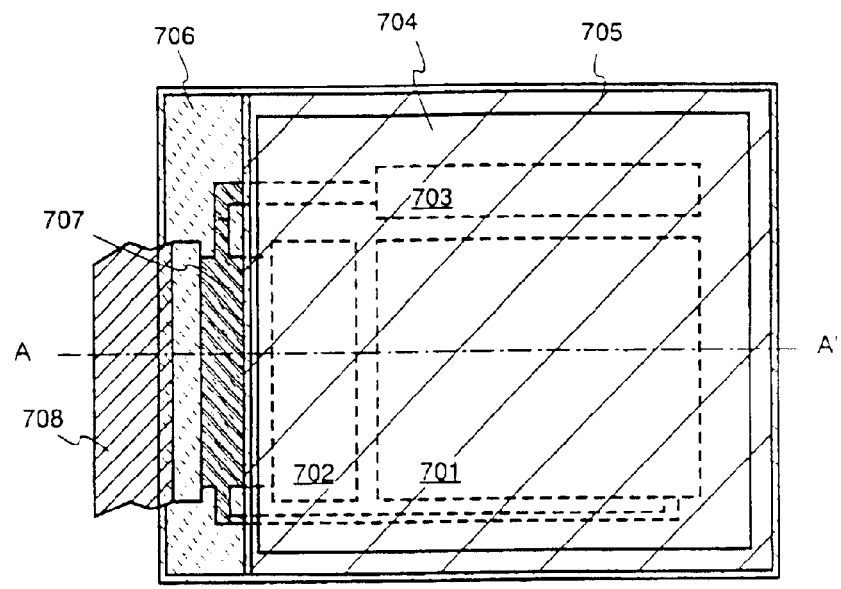
FIGS. 26A and 26B are a top surface diagram and a cross sectional diagram, respectively, of an EL display device.
Figure 26B:
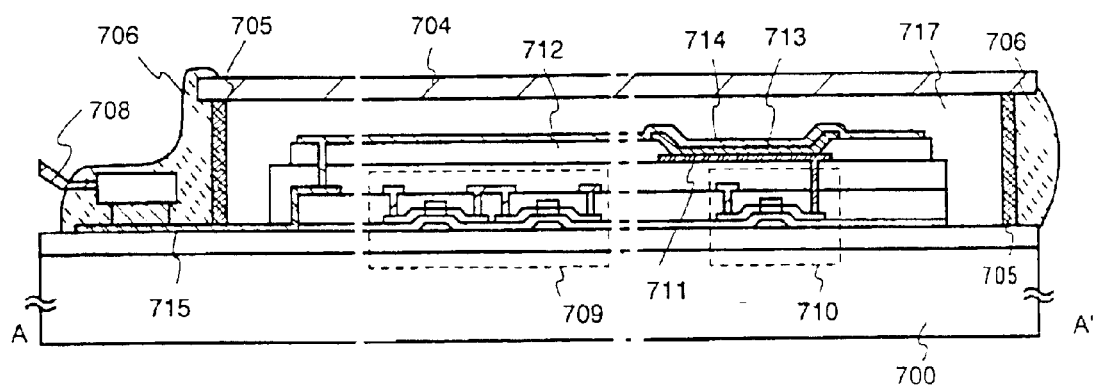

FIG. 26A is a top surface diagram showing a state up through the sealing of the EL element, and FIG. 26B is a cross sectional diagram of FIG. 26A cut along the line A–A'. Reference numeral 701, shown by a dotted line, denotes a pixel portion, reference numeral 702 denotes a source side driver circuit, and reference numeral 703 denotes a gate side driver circuit. Further, reference numeral 704 denotes a cover material, reference numeral 705 denotes a first sealing material, and reference numeral 706 denotes a second sealing material.

Note that reference numeral 707 denotes a wiring for transferring a signal input to the source side driver circuit 702 and the gate side driver circuit 703, and video signals and clock signals are received from an FPC (flexible printed circuit) 708, which becomes an external input terminal. Note that, although only the FPC is shown in the figures here, a printed wiring board (PWB) may also be attached to the FPC.

The cross sectional structure is explained next using FIG. 26B. A pixel portion and a source side driver circuit 709 are formed over an insulating body 700. The pixel portion is formed by a plurality of pixels containing a current control TFT 710 and a pixel electrode 711 electrically connected to a drain of the current control TFT 710. Further, the source side driver circuit 709 is formed using a CMOS circuit in which an n-channel TFT and a p-channel TFT are combined. Note that a polarizing plate (typically a circular polarizing plate) may also be joined to the insulating body 700.

Banks 712 are formed at both ends of the pixel electrode 711, and an EL layer 713 and an EL element anode 714 are formed on the pixel electrode 711. The anode 714 functions as a common wiring for all pixels, and is electrically connected to an FPC 708 via a connection wiring 715. In addition, all elements contained in the pixel portion and in the source side driver circuit 709 are covered by a passivation film (not shown in the figures).

Further, the cover material 704 is joined by the first sealing material 705. Note that spacers may also be formed to maintain the gap between the cover material 704 and the EL element. An opening 717 is formed on the inside of the first sealing material 705. Note that it is preferable that the first sealing material 705 be a material through which moisture and oxygen do not pass. In addition, it is effective to form a compound possessing a moisture absorbing effect and a compound possessing an oxidation preventing effect in the inside of the opening 717.

Note that a carbon film (typically a diamond like carbon film) may be formed having a thickness of 2 to 30 nm as a protective film on the top side and the bottom side of the cover material 704. This type of carbon film (not shown in the figures here) prevents the incursion of oxygen and water, and also possesses a role in mechanically protecting the surface of the cover material 704.

Further, after connecting the cover material 704, the second sealing material 706 is formed so as to cover the exposed surface of the first sealing material 705. The same material used for the first sealing material 705 can also be used as the second sealing material.

By sealing the EL element by the above structure, the EL element can be completely sealed off from the outside, and incursion from the outside of compounds which accelerate degradation of the EL layers by oxidation, such as moisture and oxygen, can be prevented. An EL display device having high reliability can therefore be obtained.

[Embodiment 5]

Figure 27A:
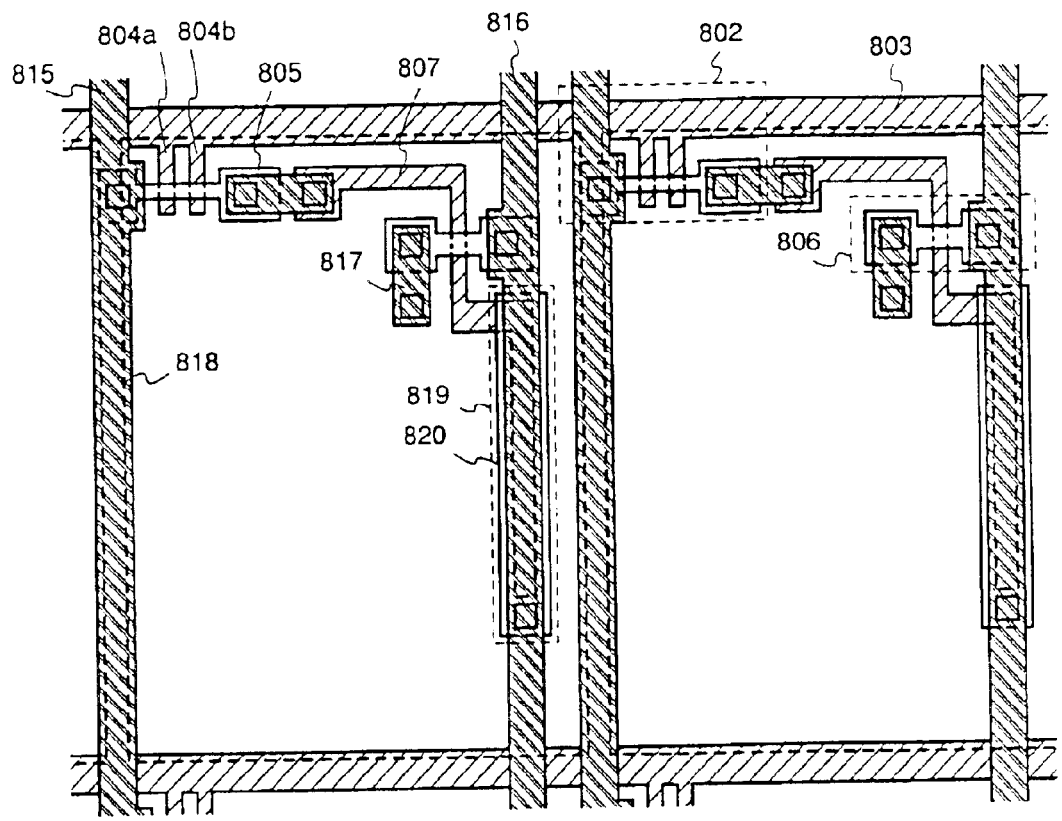
FIGS. 27A and 27B are a top surface diagram and a circuit diagram, respectively, of a pixel of an EL display device.
Figure 27B:
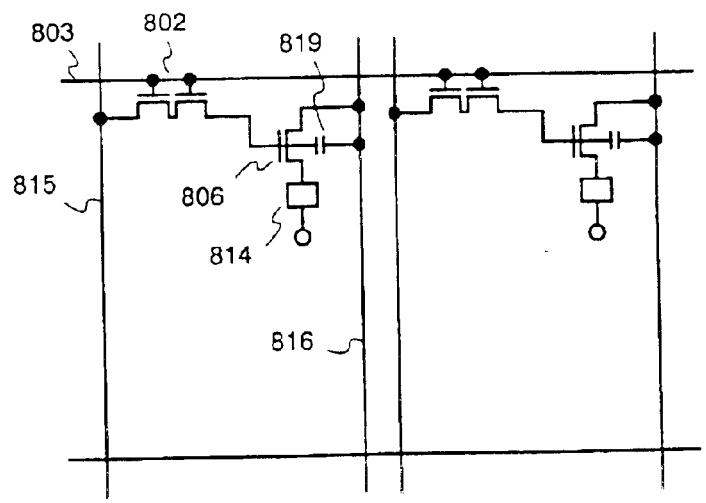

An additionally detailed top surface structure of the pixel portion in the EL display device obtained by embodiment 4 is shown in FIG. 27A, and a circuit diagram is shown in FIG. 27B in this embodiment 5. Common reference numerals are used in FIG. 27A and FIG. 27B, and therefore the figures may be mutually referenced.

A source of a switching TFT 802 is connected to a source wiring 815, a drain of the switching TFT 802 is connected to a drain wiring 805, and gate electrodes 804a and 804b of the switching TFT 802 is connected to a gate wiring 803. Further, the drain wiring 805 is electrically connected to a gate electrode 807 of a current control TFT 806. A source of the current control TFT 806 is electrically connected to a current supply line 816, and a drain of the current control TFT 806 is electrically connected to a drain wiring 817. Furthermore, the drain wiring 817 is electrically connected to a pixel electrode (cathode) 818 of EL element 814 as shown by a dotted line.

A storage capacitor is formed at this point in a region denoted by reference numeral 819. The storage capacitor 819 is formed by a semiconductor film 820 which is electrically connected to the current supply line 816, an insulating film (not shown in the figures) on the same layer as a gate insulating film, and the gate electrode 807. Further, it is also possible to use a capacitance formed by the gate electrode 807, the same layer as that of a first interlayer insulating film, and the current supply line 816, as a storage capacitor.

[Embodiment 6]

Figure 28:
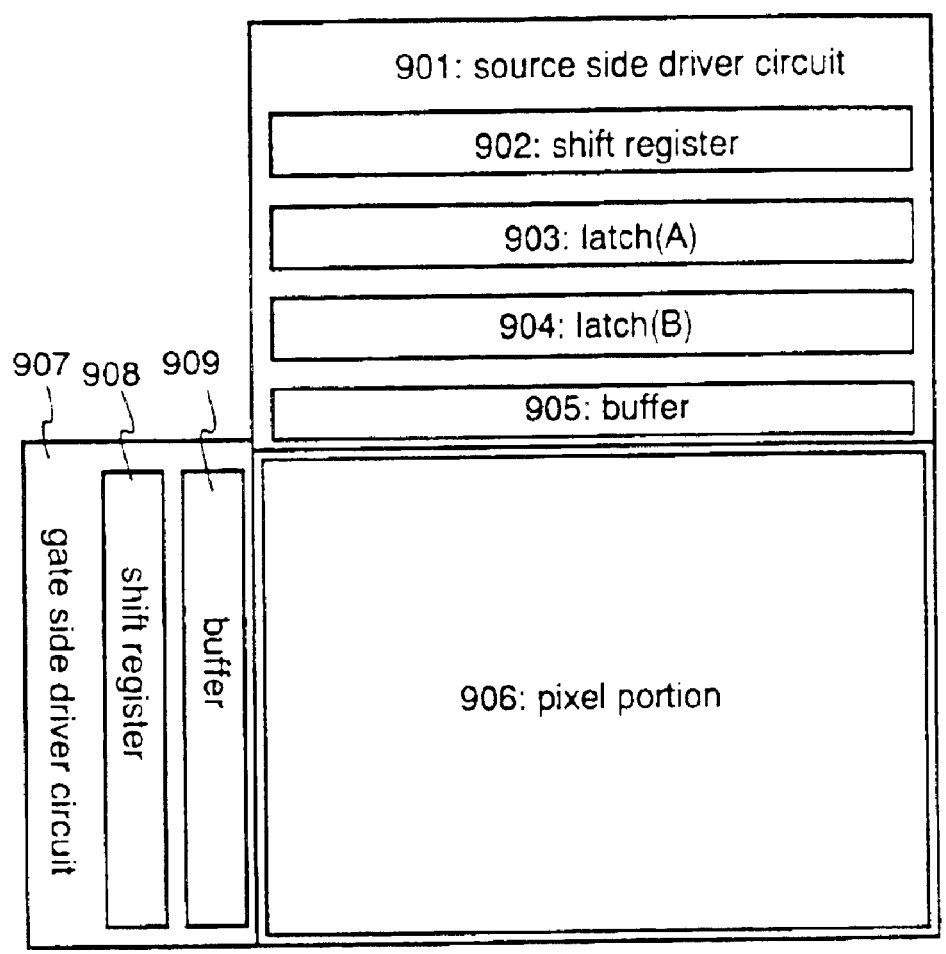
FIG. 28 is a block diagram of circuits of a digital drive EL display device.

An example circuit structure of the EL display device shown in embodiment 4 or embodiment 5 is shown in FIG. 28 in embodiment 6. Note that a circuit structure for performing digital drive is shown in embodiment 6. The circuit structure has a source side driver circuit 901, a pixel portion 906, and a gate side driver circuit 907 in embodiment 6. The term driver circuit is a generic name within this specification, which includes source side processing circuits and gate side driver circuits.

A shift register 902, a latch (A) 903, a latch (B) 904, and a buffer 905 are formed in the source side driver circuit 901. Note that a sampling circuit (transfer gate) may be formed as a substitute for the latch (A) and the latch (B) for a case of analog drive. Further, a shift register 908 and a buffer 909 are formed in the gate side driver circuit 907.

A plurality of pixels are included in the pixel portion 906 in embodiment 6, and EL elements are formed in the plurality of pixels. It is preferable that cathodes of the EL elements are electrically connected to drains of current control TFTs at this point.

The source side driver circuit 901 and the gate side driver circuit 907 are formed by n-channel TFTs and p-channel TFTs obtained by embodiments 1 to 3.

Note that, although not shown in the figures, an additional gate side driver circuit may also be formed on the side opposite that of the gate side driver circuit 907, sandwiching the pixel portion 906. In this case, both are formed with the same structure and share gate wirings, and even if one is damaged, the remaining gate side driver circuit will send a gate signal and the pixel portion will be driven normally.

Note that the above structure can be realized by manufacturing TFTs in accordance with the processes of manufacturing shown in any of embodiments 1 to 3.

[Embodiment 7]

Figure 29:
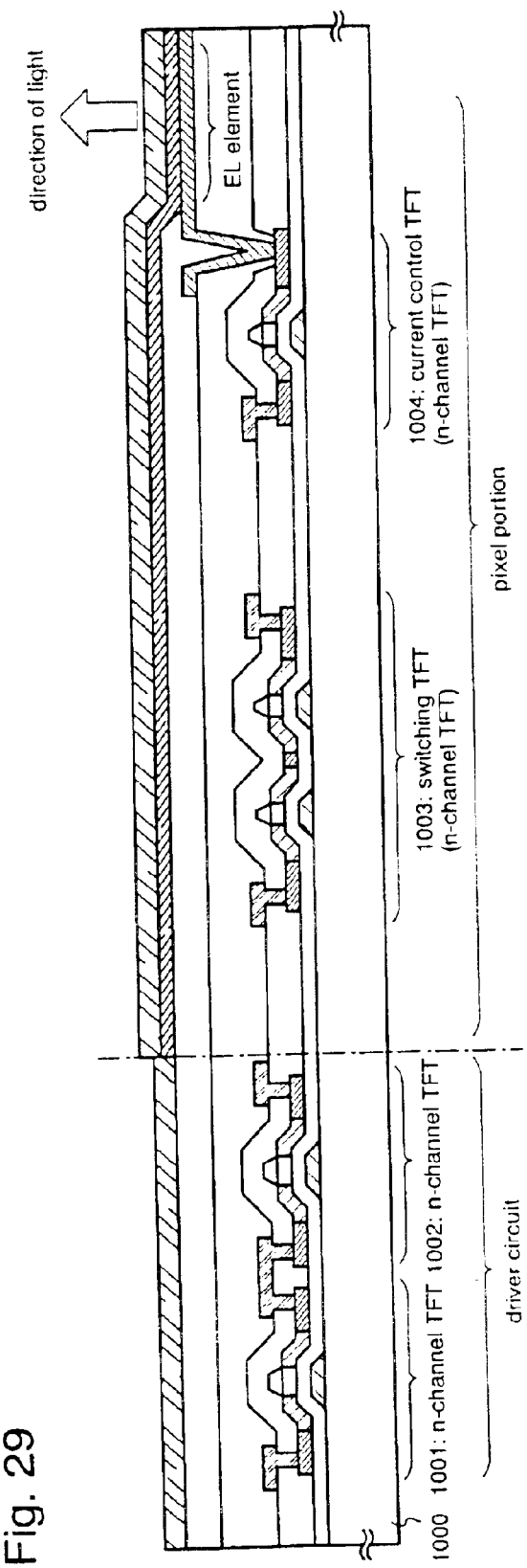
FIG. 29 is a cross sectional structure diagram of a driver circuit and a pixel portion of an EL display device formed by n-channel TFTs.

In this embodiment, the example of the EL display device which composes all TFT used for pixel portion and the driver circuit of n-channel TFT is shown in FIG. 29.

In FIG. 29, the reference numeral 1000 is an insulator and n-channel TFT 1001, n-channel TFT 1002, the switching TFT 1003 from n-channel TFT and the current control TFT 1004 from n-channel TFT. Moreover, all TFT is formed with reverse-staggered type TFT in this embodiment. The explanation of n-channel TFT can be omitted because it refers to Embodiment 1. The explanation of the EL display device can be omitted because it refers to Embodiment 4.

The case of which the source side driver circuit and the gate side driver circuit are formed with E-type n-channel TFT is explained using FIGS. 30 to 32 as follows. The decoder which uses only n-channel TFT substituted for shift resister is used in this embodiment.

Figure 30:
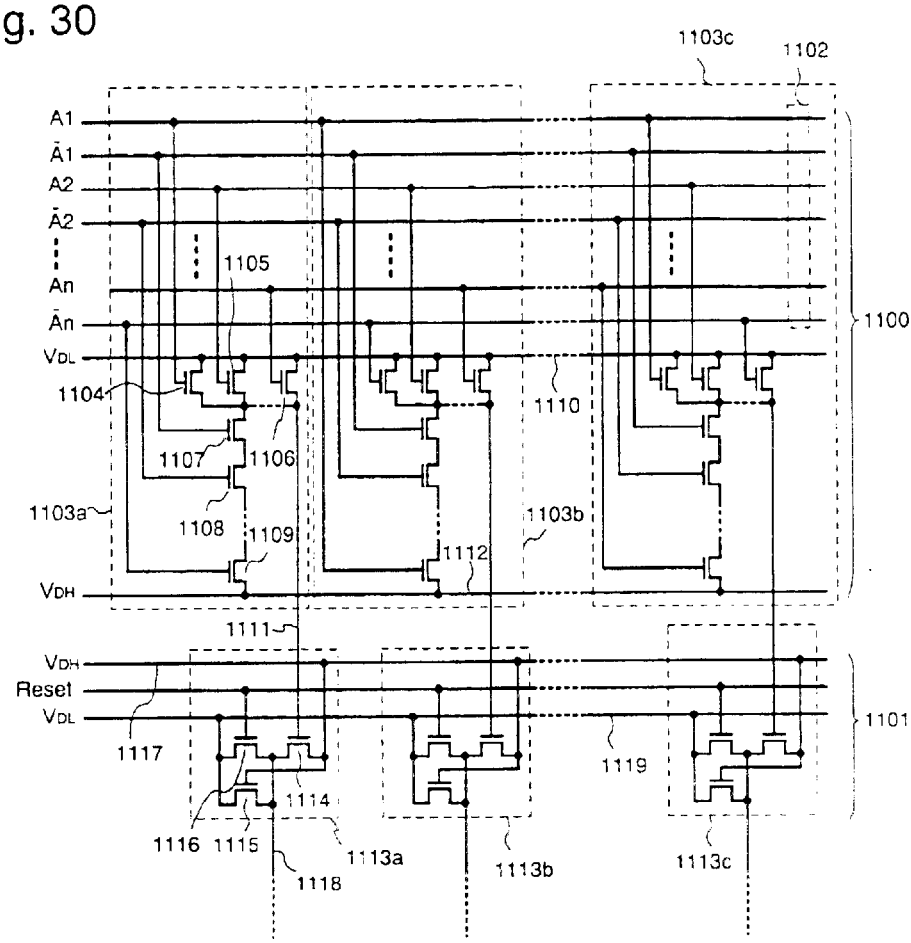
FIG. 30 is a diagram showing a structure of a gate side driver circuit formed by n-channel TFTs.

FIG. 30 is an example of a gate side driver circuit. In FIG. 30, reference numeral 1100 denotes a decoder in the gate side driver circuit, and 1101 denotes a buffer section of the gate side driver circuit. Here, the buffer section refers to a section in which a plurality of buffers (buffer amplifiers) are integrated. Furthermore, the buffer refers to a circuit capable of exhibiting the driving capability without providing any adverse effects of a subsequent stage on a previous stage.

The gate side decoder 1100 will be now described. Reference numeral 1102 denotes input signal lines (hereinafter referred to as the selection lines) of the decoder 1100, and more specifically indicates A1, A1-bar (a signal having an inverted polarity with respect to A1), A2, A2-bar (a signal having an inverted polarity with respect to A2), . . . , An, and An-bar (a signal having an inverted polarity with respect to An). In other word, it can be considered that the 2n selection lines are arranged.

Figure 31:
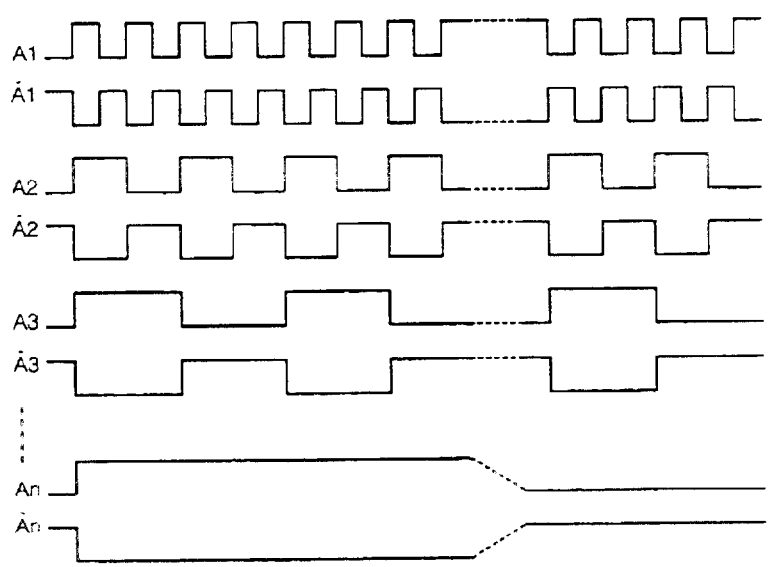
FIG. 31 is a diagram for explaining a timing chart of a decoder input signal.

The selection lines 1102 transmit signals shown in the timing chart in FIG. 31. As shown in FIG. 31, assuming that a frequency of A1 is normalized to be 1, a frequency of A2 can be expressed as $2^{-1}$, a frequency of A3 can be expressed as $2^{-2}$, and a frequency of An can be expressed as $2^{-(n-1)}$.

Reference numeral 1103*a* denotes a first-stage NAND circuit (also referred to as the NAND cell), while 1103*b* and 1103*c* denote a second-stage and an n-th stage NAND circuits, respectively. The required number of the NAND circuits is equal to the number of the gate wirings, and specifically, n NAND circuits are required here. In other word, the decoder 1100 in accordance with the present invention is composed of a plurality of the NAND circuits.

In each of the NAND circuits 1103*a* to 1103*c*, n-channel TFTs 1104 to 1109 are combined to form a NAND circuit. Furthermore, a gate of each of the n-channel TFTs 1104 to 1109 is connected to either one of the selection lines 1102 (A1, A1-bar, A2, A2-bar, . . . , An, An-bar).

In this case, in the NAND circuit 1103*a*, the n-channel TFTs 1104 to 1106 that respectively have the gates connected to any of A1, A2, . . . , An (which are referred to as the positive selection lines) are connected to each other in parallel, and further connected to a negative power source wiring ($V_{DL}$) 1110 as a common source, as well as to an output line 1111 as a common drain.

In this embodiment, each NAND circuit includes n n-channel TFTs connected in series and n n-channel TFTs connected in parallel.

Then, the buffer 1101 is composed of a plurality of buffers 1113*a* to 1113*c* so as to respectively correspond to the NAND circuits 1103*a* to 1103*c*. It should be noted that the buffers 1113*a* to 1113*c* may have the same structure.

Each of the buffers 1113*a* to 1113*c* is formed by using n-channel TFTs 1114 to 1116.

That is, in the present invention, each of the buffers 1113*a* to 1113*c* includes the first n-channel TFT (n-channel TFT 1114) and the second n-channel TFT (n-channel TFT 1115) connected in series with the first n-channel TFT and has its gate connected to the drain of the first n-channel TFT.

An n-channel TFT 1116 (third n-channel TFT) has its gate connected to a reset signal line (Reset), its source to the negative power supply line ($V_{DL}$) 1119, and its drain to the gate wiring 1118. The negative power supply line ($V_{DL}$) 1119 may be provided as a ground power supply line (GND).

The n-channel TFT 1116 is used as a reset switch for forcibly reducing, to a negative voltage, the potential of the gate wiring line 1118 to which a positive voltage is applied. That is, at the end of the period for selection of the gate wiring line 1118, a reset signal is input to apply a negative voltage to the gate wiring line 1118. However, the n-channel TFT 1116 may be omitted.

Figure 32:
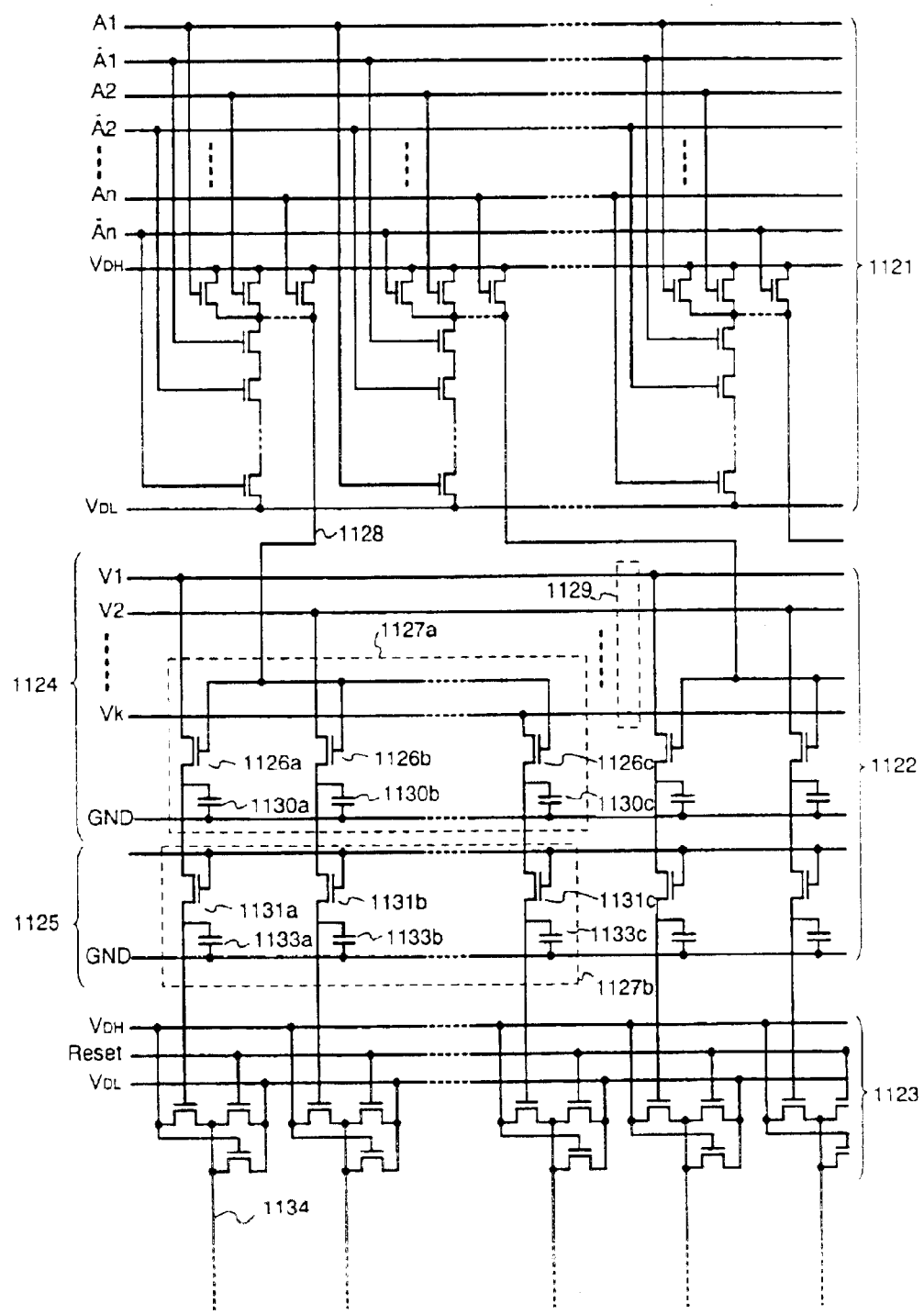
FIG. 32 is a diagram showing a structure of a source side driver circuit formed by n-channel TFTs.

FIG. 32 shows the configuration of the source side driver circuit. The source side driver circuit shown in FIG. 32 includes a decoder 1121, a latch 1122, and a buffer section 1123.

In the source side driver circuit shown in FIG. 32, the latch 1122 is formed of a first-stage latch 1124 and a second-stage latch 1125. Each of the first-stage latch 1124 and the second-stage latch 1125 has a plurality of unit sections 1127 each formed by m n-channel TFTs 1126*a* to 1126*c*. The output line 1128 from the decoder 1121 is input to the gate of m n-channel TFT 1126*a* to 1126*c* forming unit sections 1127. Further m is an arbitrary integer.

The sources of the n-channel TFTs 1126*a* to 1126*c* are respectively connected to video signal lines (V1, V2, . . . Vk) 1129. That is, when a positive voltage is applied to the output line 1128, the n-channel TFTs 1126*a* to 1126*c* are simultaneously turned on to take in corresponding video signals. The video signals thus taken in are held in capacitors 1130*a* to 1130*c* connected to the n-channel TFTs 1126*a* to 1126*c*.

The second-stage latch 1125 has a plurality of unit sections 1127*b* each formed by m n-channel TFTs 1131*a* to 1131*c*. The gates of all the n-channel TFTs 1131*a* to 1131*c* are connected to a latch signal line 1132. When a negative voltage is applied to the latch signal line 1132, the n-channel TFTs 1131*a* to 1131*c* are simultaneously turned on.

The signals held by the capacitors 1130*a* to 1130*c* are then held by capacitors 1133*a* to 1133*c* respectively connected to the n-channel TFTs 1131*a* to 1131*c* and are simultaneously output to the buffer 1123. Then, the signals are output to source wiring lines 1134 through the buffer. The source wiring lines are successively selected by the source side driver circuit operating as described above.

As described in the above, by composing the gate side driver circuit and the source side driver circuit only of the n-channel TFTs, all of the pixel sections and the driver circuits can be entirely formed of the n-channel TFTs. Accordingly, upon fabrication of an active-matrix type electro-optical device, a fabrication yield and a throughput of the TFT steps can be significantly improved, thereby resulting in a reduced fabrication cost.

It should be noted that the present invention can be embodied even in the case where either of the source side driver circuit or the gate side driver circuit, are provided in an IC chip to be externally attached.

Though the driver circuit is structured by using E-type n-channel TFT in this embodiment, the combination of E-type n-channel TFT and D-type n-channel TFT can also be used.

[Embodiment 8]

Figure 33:
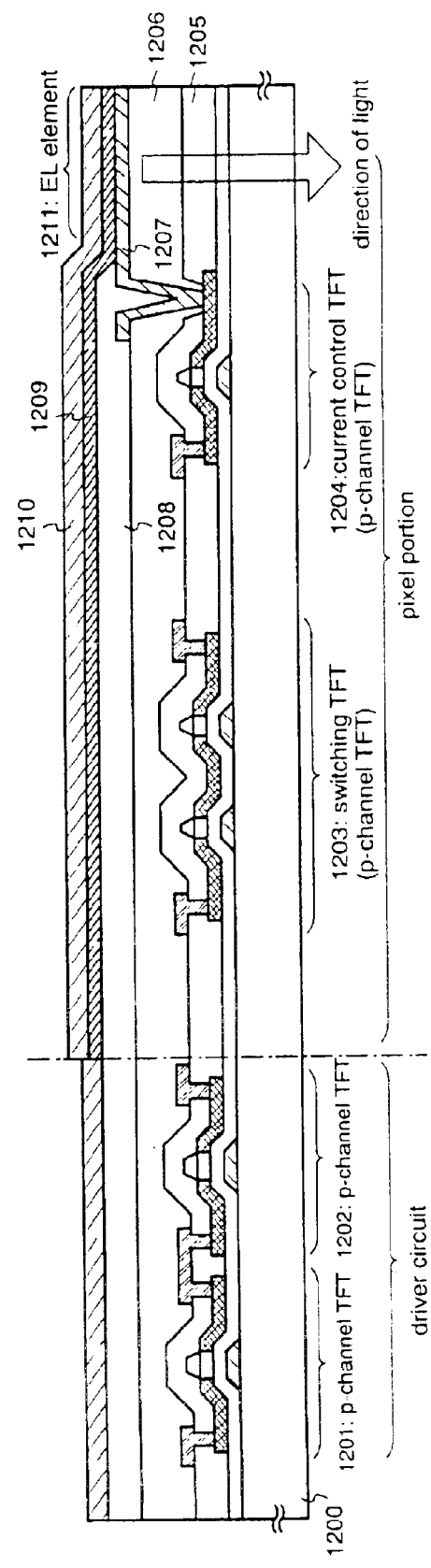
FIG. 33 is a cross sectional structure diagram of a driver circuit and a pixel portion of an EL display device formed by p-channel TFTs.

An example of an EL display device in which all TFTs used in a pixel portion and a driver circuit are structured by p-channel TFTs is shown in FIG. 33.

Reference numeral 1200 denotes an insulating body in FIG. 33, and a p-channel TFT 1201, a p-channel TFT 1202, a switching TFT 1203 composed of a p-channel TFT, and a current control TFT 1204 composed of a p-channel TFT are formed on the insulating body 1200. Further, all TFTs are formed by reverse stagger TFTs in embodiment 8. Note that embodiment 2 may be referred to for an explanation of the p-channel TFTs, and therefore such explanation is omitted here.

This interlayer insulating films 1205 and 1206 are formed on the current control TFT 1204 in embodiment 8, and a pixel electrode 1207, which is electrically connected to a drain of the current control TFT 1204, is formed on the interlayer insulating films. The pixel electrode 1207, made from a transparent conductive film having a large work function, functions as an anode of an EL element in embodiment 8.

A bank 1208 is then formed on the pixel electrode 1207, similar to embodiment 4.

An EL layer 1209 is formed on the pixel electrode 1207 next. A cathode 1210 made from a conductive film containing an element residing in group 1 or group 2 of the periodic table is formed on the EL layer 1209. An EL element 1211 composed of the pixel electrode (anode) 1207, the EL layer 1209, and the cathode 1210 is thus formed.

However, in embodiment 8 the direction of light emitted from the EL element differs from that of embodiment 4, and the insulating body 1200 must be transparent.

An example of forming a driver circuit using a decoder, which uses a p-channel TFT like that shown in FIG. 1, as a substitute for a general shift register is shown next. Note that FIG. 34 shows an example of a gate side driver circuit.

Figure 34:
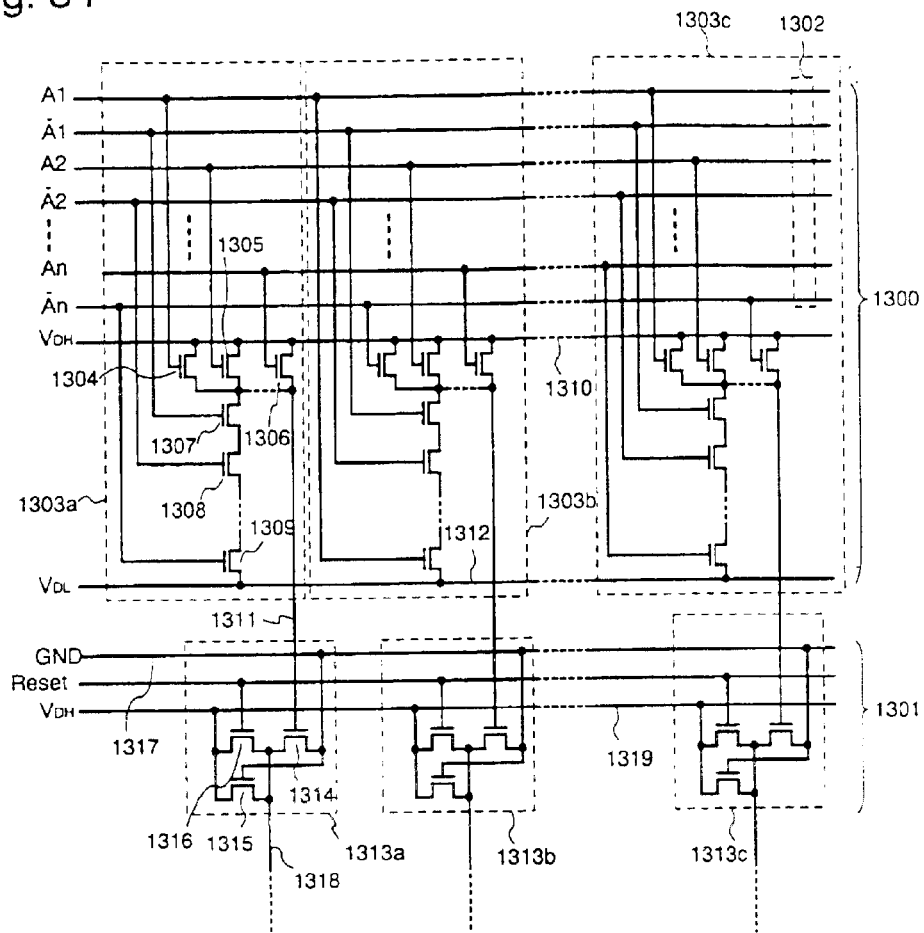
FIG. 34 is a diagram showing a structure of a gate side driver circuit formed by p-channel TFTs.

Reference numeral 1300 denotes a decoder of a gate side driver circuit in FIG. 34, and reference numeral 1301 denotes a buffer portion of the gate side driver circuit.

The gate side decoder 1300 is explained first. Reference numeral 1302 denotes an input signal line of a decoder 100

(hereafter referred to as a selection line), and A1, A1-bar (a signal which is A1 having inverted polarity), A2, A2-bar (a signal which is A2 having inverted polarity), . . . An, An-bar (a signal which is An having inverted polarity) are shown here.

Figure 35:
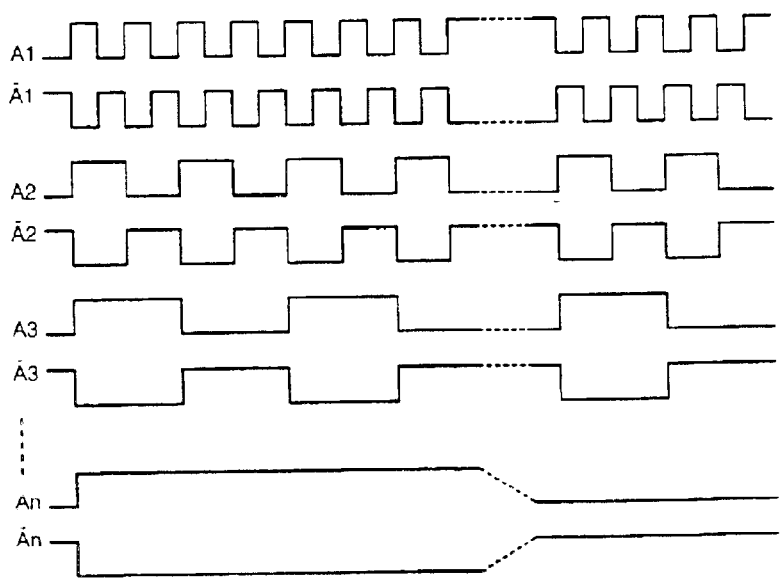
FIG. 35 is a diagram for explaining a timing chart of a decoder input signal.

The selection line 1302 transfers the signals shown in the timing chart of FIG. 35. As shown in FIG. 35, if the frequency of A1 is taken to be 1, the frequency of A2 becomes $2^{-1}$ that of A1, the frequency of A3 becomes $2^{-2}$ that of A1, and the frequency of An becomes $2^{-(n-1)}$ that of A1.

Further, reference numeral 1303a denotes a first stage NAND circuit (also referred to as a NAND cell), reference numeral 1303b denotes a second stage NAND circuit, and reference numeral 1303c denotes an n-th stage NAND circuit.

The NAND circuits 1303a to 1303c are formed from NAND circuits which combine p-channel TFTs 1304 to 1309.

Further, the p-channel TFTs 1304 to 1306 having gates connected to any of A1, A2, . . . , An (referred to as positive selection lines) in the NAND circuit 1303a are mutually connected in parallel, and a positive electric power source line ($V_{DH}$) 1310 is connected as a common source, while an output line 1311 is connected as a common drain.

Next, a buffer 1301 is formed from a plurality of buffers 1313a to 1313c corresponding to the NAND circuits 1303a to 1303c, respectively. Note that the buffers 1313a to 1313c all have the same structure. Further, the buffers 1313a to 1313c are formed using p-channel TFTs 1314 to 1316 as single conductivity type TFTs.

A gate of the p-channel TFT 1316 is taken as a reset signal line, a source is taken as a positive electric power source line 1319, and a drain is taken as a gate wiring 1318. Note that a ground electric power source line 1317 may also be taken as a negative electric power source line (an electric power source line for imparting a voltage such that the p-channel TFTs used as switching elements of the pixels are placed in an on state).

Figure 36:
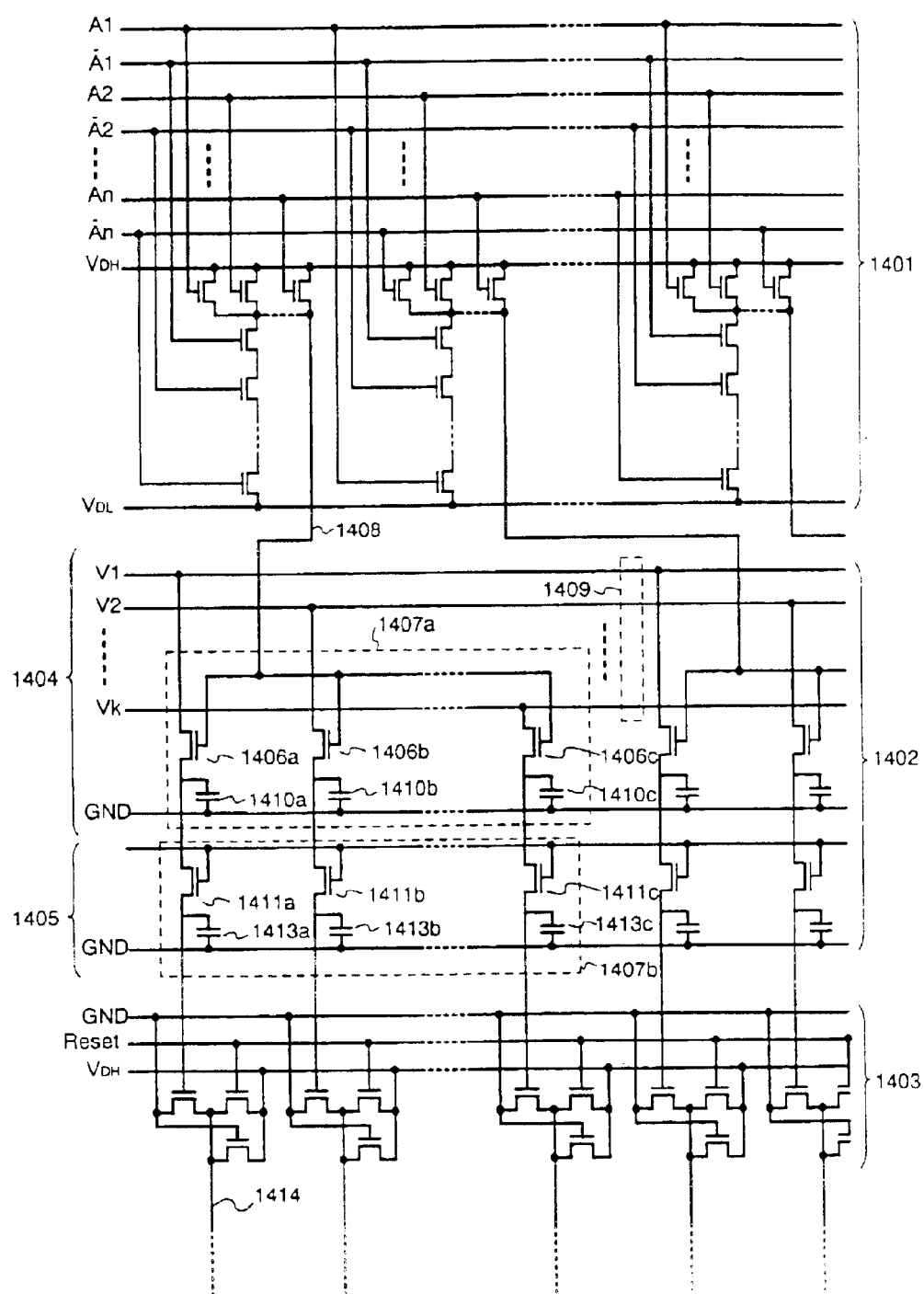
FIG. 36 is a diagram showing a structure of a source side driver circuit formed by p-channel TFTs.

A source side driver circuit structure is shown in FIG. 36. The source side driver circuit shown in FIG. 36 contains a decoder 1401, a latch 1402, and a buffer 1403. Note that the structure of the decoder 1401 and the structure of the buffer 1403 are similar to those of the gate side driver circuit, and therefore an explanation of the structures is omitted here.

The latch 1402 is composed of a first stage latch 1404 and a second stage latch 1405 for the case of the source side driver circuit shown in FIG. 36. Further, the first stage latch 1404 and the second stage latch 1405 each have a plurality of units 1407a and 1407b formed by m p-channel TFTs 1406a to 1406c.

Sources of the p-channel TFTs 1406a to 1406c are connected to video signal lines V1, V2, . . . , Vk, 1409 respectively. If a negative voltage is applied to an output line 1408, the p-channel TFTs 1406a to 1406c all turn on at the same time, and the video signals corresponding to each of the p-channel TFTs are taken in. Further, the thus read-in video signals are stored in capacitors 1410a to 1410c connected to the p-channel TFTs 1406a to 1406c, respectively.

Further, the second stage latch 1405 also has a plurality of units 1407b, and the units 1407b are formed by m p-channel TFTs 1411a to 1411c. Gates of the p-channel TFTs 1411a to 1411c are all connected to a latch signal line 1412. If a negative voltage is applied to the latch signal line 1412, the p-channel TFTs 1411a to 1411c are all simultaneously placed in an on state.

As a result, the signals stored in the capacitors 1410a to 1410c are output to buffers 1403 at the same time as they are stored in capacitors 1413a to 1413c connected to the p-channel TFTs 1411a to 1411c, respectively. The signals are then output to source lines 1414 through the buffers. The source lines are selected in order by the source side driver circuit having the above operation.

It becomes possible to form the pixel portion and the driver circuit portion using all p-channel TFTs by forming the gate side driver circuit and the source side driver circuit using only p-channel TFTs as above. It is therefore possible to greatly increase the yield and the throughput of TFT processing, and to reduce the cost, when manufacturing an active matrix electro-optical device.

[Embodiment 9]

An example of a process of moving TFTs and EL elements, formed on a substrate, to a plastic substrate is shown in FIGS. 37A to 37C and FIGS. 38A and 38B in embodiment 9.

Figure 37A:
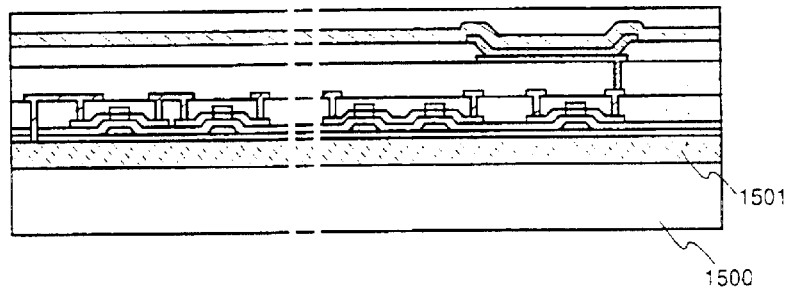
FIGS. 37A to 37C are diagrams for explaining a process of joining plastic substrates.

Reference numeral 1500 denotes a substrate on which elements are formed (hereafter referred to as an element formation substrate) in FIG. 37A, and a separation layer 1501 is formed from an amorphous silicon film having a thickness of 100 to 500 nm (300 nm in embodiment 9) on the substrate. A glass substrate is used as the element formation substrate (first substrate) 1500 in embodiment 9, but a quartz substrate, a silicon substrate, a metal substrate, and a ceramic substrate may also be used. Note that, throughout this specification, there are also cases in which the term element formation substrate indicates the entire substrate on which semiconductor elements or light emitting elements are formed.

Further, film formation of the separation layer 1501 may be performed using low pressure thermal CVD, plasma CVD, sputtering, or evaporation. A base insulating film is formed with a thickness of 200 nm on the separation layer 1501a.

Subsequent processes are performed in accordance with embodiment 4, and an EL element is manufactured.

Figure 37B:
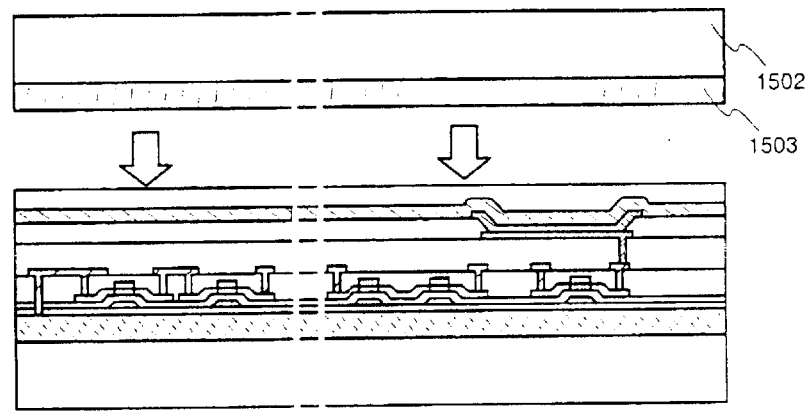

Next, after covering a cathode of the EL element by an insulating film, a substrate 1502 for fixing elements in accordance with a first adhesive layer 1503 (hereafter referred to as a fixing substrate) is joined as shown in FIG. 37B.

Figure 37C:
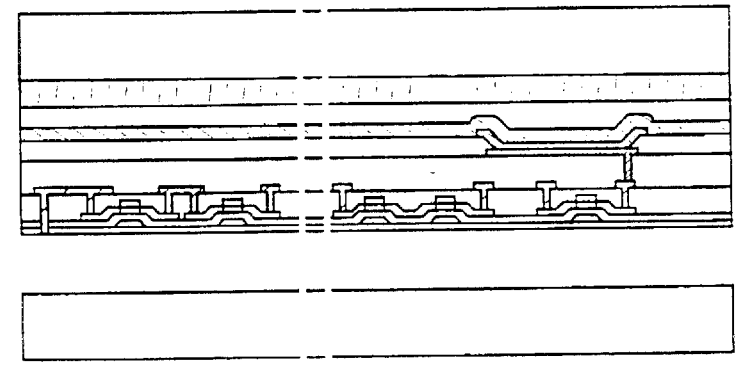

The first substrate 1500 on which the EL elements are formed is then exposed to a gas containing a halogen fluoride, and removal of the separation layer 1501 is performed as shown in FIG. 37C. The TFTs and the EL elements are formed by laminating thin films at this point, but remain as transferred to the fixing substrate 1502. Chlorine trifluoride ($ClF_3$) is used as the halogen fluoride in embodiment 9, and nitrogen is used as the dilution gas. Argon, helium, and neon may also be used as the dilution gas.

The silicon film is etched in this case, but the plastic film, the glass substrate, the polyimide film, and the silicon oxide film are not etched. In other words, the separation layer 1501 is selectively etched by exposure to the chlorine trifluoride gas, and is completely removed. Note that the active layer, also formed by a silicon film, is covered by the gate insulating film, and therefore is not exposed to the chlorine trifluoride gas, and is not etched.

Figure 38A:
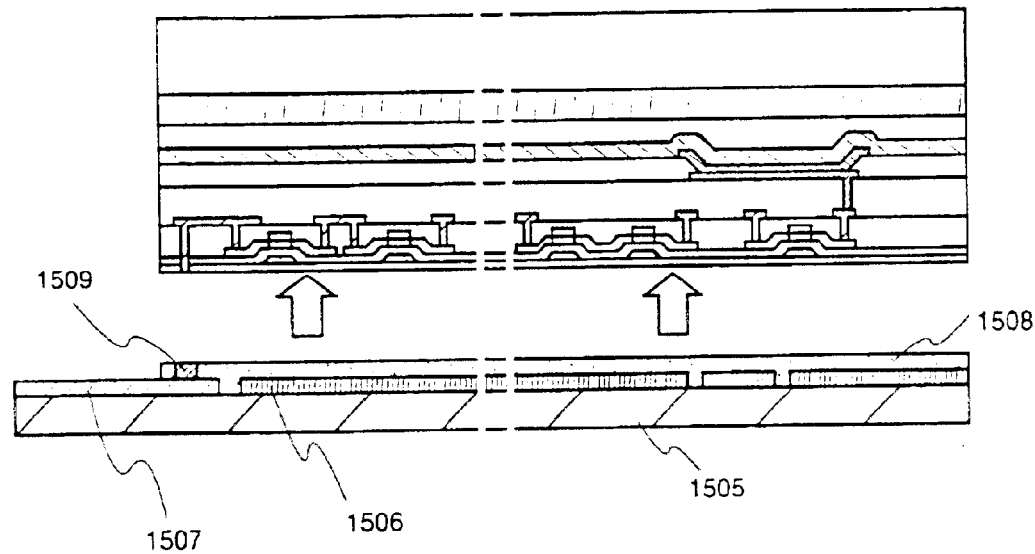
FIGS. 38A and 38B are diagrams for explaining a process of joining plastic substrates.

Once the TFTs and the EL elements are thus transferred to the fixing substrate 1502, a second adhesive layer 1508 is formed, and a second substrate 1505, the plastic substrate, is joined as shown in FIG. 38A. Note that color filters 1506 are formed in the pixel portion in the second substrate 1505, corresponding to the positions of each pixel and TFT. In addition, a terminal connection portion 1507 and a conductive an-isotropic adhesive 1509 containing a conductive filler are formed on the terminal connection portion so as to contact the exposed wirings are formed in a terminal portion.

Figure 38B:
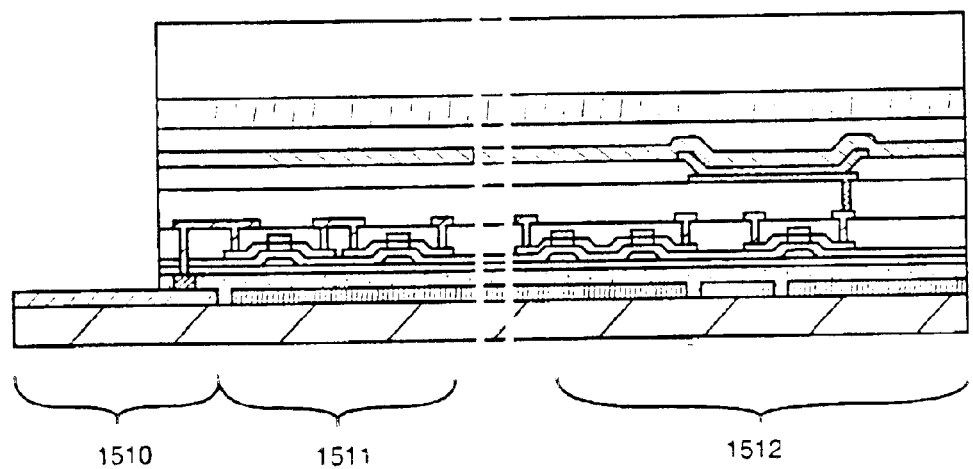

The TFTs and the EL elements are thus transferred from the first substrate 1500 to the second substrate 1505. As a result, a flexible EL display device on which a pixel portion 1512, a driver circuit portion 1511, and a terminal portion 1510 are formed on the second substrate 1505 can thus be obtained as shown in FIG. 38B.

Furthermore, if the fixing substrate 1502 and the second substrate 1505 are formed from the same material (plastic film), then the thermal expansion coefficients are equal, and therefore the influence of stress and strain due to temperature changes can be reduced.

Further, it is possible to freely combine embodiment 9 with any one of embodiments 4 to 8.

[Embodiment 10]

The driver circuit portion and the pixel portion fabricated by implementing the present invention can be utilized for various electro-optical devices (active matrix liquid crystal display, active matrix EL display and active matrix EC display). Namely, the present invention can be implemented onto all of the electronic devices that incorporate such electro-optical devices as a display portion.

Following can be given as such electronic devices: video cameras; digital cameras; projectors (rear type or front type); head mounted displays (goggle type displays); car navigation systems; car stereo; personal computers; portable information terminals (mobile computers, portable telephones or electronic books etc.) etc. Examples of these are shown in FIGS. 39, 40 and 41.

FIG. 39A is a personal computer which comprises: a main body 2001; an image input section 2002; a display section 2003; and a key board 2004. The present invention can be applied to the image input section 2002, the display section 2003 and other driver circuits.

FIG. 39B is a video camera which comprises: a main body 2101; a display section 2102; a voice input section 2103; operation switches 2104; a battery 2105 and an image receiving section 2106. The present invention can be applied to the display section 2102, and other driver circuits.

FIG. 39C is a mobile computer which comprises: a main body 2201; a camera section 2202; an image receiving section 2203; operation switches 2204 and a display section 2205. The present invention can be applied to the display section 2205 and other driver circuits.

FIG. 39D is a goggle type display which comprises: a main body 2301; a display section 2302; and an arm section 2303. The present invention can be applied to the display section 2302 and other driver circuits.

FIG. 39E is a player using a recording medium which records a program (hereinafter referred to as a recording medium) which comprises: a main body 2401; a display section 2402; a speaker section 2403; a recording medium 2404; and operation switches 2405. This device uses DVD (digital versatile disc), CD, etc. for the recording medium, and can perform music appreciation, film appreciation, games and the use for Internet. The present invention can be applied to the display section 2402 and other driver circuits.

FIG. 39F is a digital camera which comprises: a main body 2501; a display portion 2502; a view finder 2503; operation switches 2504; and an image receiving section (not shown in the figure). The present invention can be applied to the display section 2502 and driver circuits.

Figure 40A:
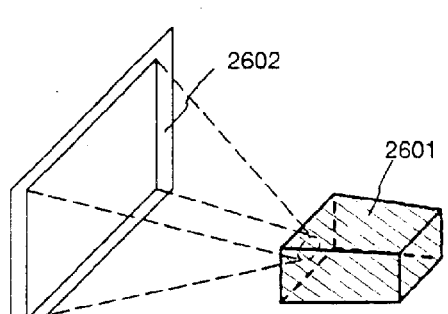
FIGS. 40A to 40D are diagrams showing examples of electronic devices.

FIG. 40A is a front type projector which comprises: a projection system 2601; and a screen 2602. The present invention can be applied to the liquid crystal display device 2808 which forms a part of the projection system 2601 and other driver circuits.

Figure 40B:
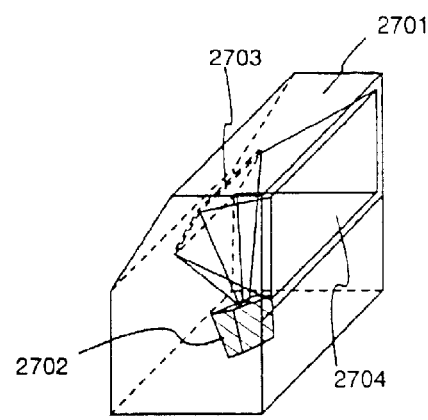

FIG. 40B is a rear type projector which comprises: a main body 2701; a projection system 2702; a mirror 2703; and a screen 2704. The present invention can be applied to the liquid crystal display device 2808 which forms a part of the projection system 2702 and other driver circuits.

Figure 40C:
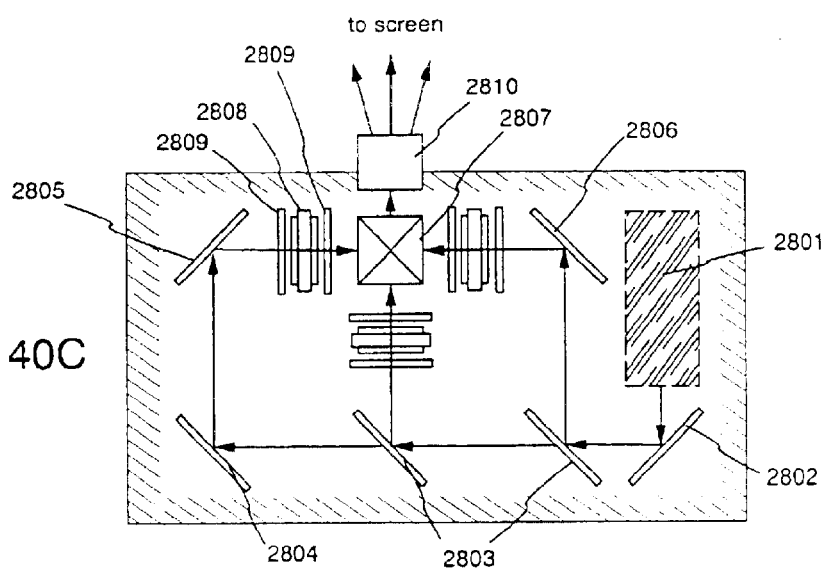

FIG. 40C is a diagram which shows an example of the structure of a projection system 2601 and 2702 in FIGS. 40A and 40B. Projection systems 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 40C.

Figure 40D:
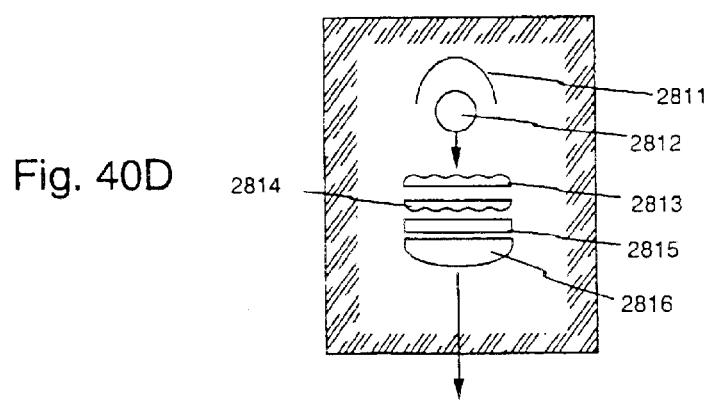

FIG. 40D is a diagram showing an example of a structure of an optical light source system 2801 in FIG. 40C. In the present embodiment the optical light source system 2801 comprises: a reflector 2811; a light source 2812; lens arrays 2813 and 2814; a polarizer conversion element 2815; and a collimator 2816. Note that the optical light source system shown in FIG. 40D is merely an example and the structure is not limited to this example. For instance, an operator may appropriately dispose an optical lens, a film which has a function to polarize light, a film which adjusts a phase difference or an IR film, etc.

Note that the projectors shown FIG. 40 are the cases of using a transmission type electro-optical devices, and applicable examples of a reflection type electro-optical device and an EL display device are not shown.

Figure 41A:
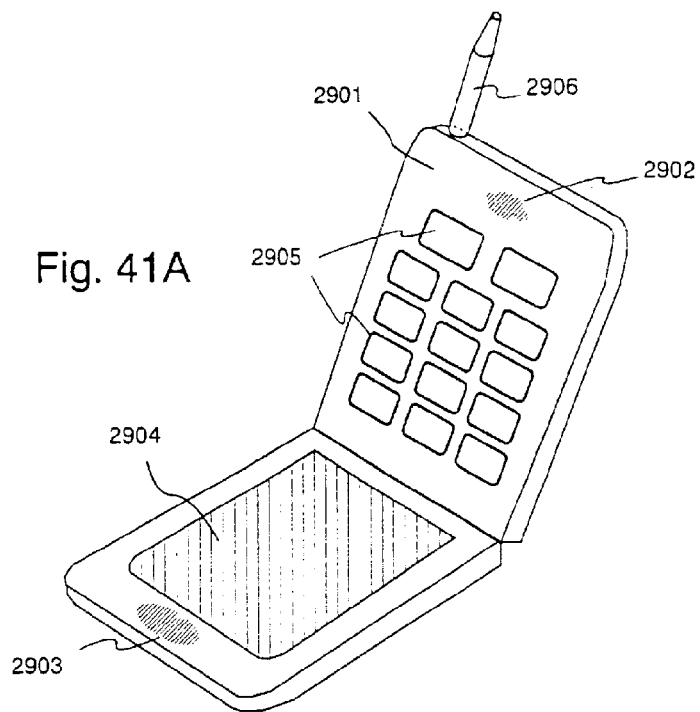
FIGS. 41A to 41C are diagrams showing examples of electronic devices.

FIG. 41A is a portable telephone which comprises: a main body 2901; a voice output section 2902; a voice input section 2903; a display section 2904; operation switches 2905; and an antenna 2906 etc. The present invention can be applied to the voice output section 2902, the voice input section 2903, the display section 2904 and other driver circuits.

Figure 41B:
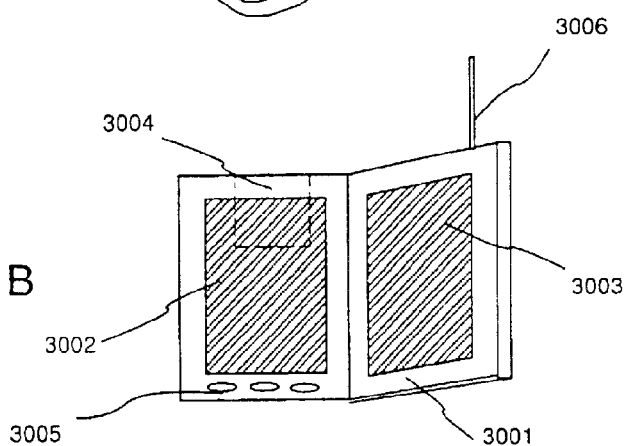

FIG. 41B is a portable book (electronic book) which comprises: a main body 3001; display sections 3002 and 3003; a recording medium 3004; operation switches 3005 and an antenna 3006 etc. The present invention can be applied to the display sections 3002 and 3003, and other driver circuits.

Figure 41C:
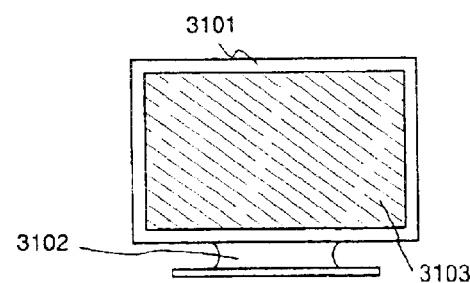

FIG. 41C is a display which comprises: a main body 3101; a supporting section 3102; and a display section 3103 etc. The present invention can be applied to the display section 3103. The display of the present invention is advantageous specifically when large sized, and it is advantageous in a display having a diagonal exceeding 10 inches (specifically exceeding 30 inches).

As described above, the applicable range of the present invention is very large, and the invention can be applied to electronic devices of various areas. Note that the electronic devices of the present embodiment can be achieved by utilizing any combination of constitutions in Embodiments 1 to 9.

[Embodiment 11]

An example of a method of gettering, in which semiconductor film to which phosphorus atoms added to a semiconductor film is made into gettering sites, is shown by embodiment 3. In embodiment 11, however, an example of a method of gettering, in which inert gas elements, or inert gas element are added to a semiconductor film, are made into gettering sites is explained below. Note that, in general, gettering is known as a technique for reducing the impurity concentration of an active region of an element by segregating metal impurity elements introduced within a semiconductor film into gettering sites at a certain energy.

An explanation is made below using FIGS. 45A to 45E.

First, in accordance with embodiment 1, a gate wiring (including a gate electrode) is formed on a substrate 1601. An insulating substrate such as glass substrate, a quartz substrate, or a crystalline glass substrate can be used as the substrate 1601. A glass substrate is used here, and therefore a base insulating film (not shown in the figures) composed of an insulating film such as a silicon oxide film, a silicon nitride film, a silicon oxynitride film (SiOxNy), is formed. It is, preferable to use a single layer silicon nitride film as the base insulating film. If a silicon nitride film is used, it has an effect as a blocking layer for preventing alkaline metals contained in the glass substrate from diffusing within a later formed substrate film. It is also effective in increasing the gettering efficiency of a gettering process performed later. However, the base insulating film need not be formed in particular.

Gate wirings (including gate electrodes) 1602 having a single layer structure or a lamination structure are formed next. After forming a conductive film having a film thickness from 10 to 1000 nm, preferably in the range of 30 to 300 nm, using a method such as sputtering, evaporation, thermal CVD, plasma CVD, or low pressure thermal CVD as the means of forming the gate wirings 1602, the conductive film is patterned by a known patterning technique. Further, a material having a conductive material or a semiconductor material as its main constituent, for example, a high melting point metal material such as Ta (tantalum), Mo (molybdenum), Ti (titanium), W (tungsten), Cr (chromium) may be used as the gate wiring 1602 material, as may a silicide compound of these metal materials and silicon. In addition, a material such as polysilicon having n-type or p-type conductivity, or a material layer having a low resistance metal material such as Cu (copper) or Al (aluminum) as its main constituent, may be used. There are no particular limitations placed upon the structure, provided that it is a structure having at least one layer. Further, a structure in which an anodic oxidation film or an oxidation film is formed in order to protect the gate wirings may also be used.

A gate insulating film is formed next. A silicon oxide film, a silicon nitride film, a silicon oxynitride film (SiOxNy), an organic resin film (BCB (benzocyclobutene) film), or a lamination film of these films can be used with a film thickness in the range of 100 to 400 nm. Methods such as thermal CVD, plasma CVD, low pressure CVD, evaporation, sputtering, and application can be used as the film formation method. Lamination structure gate insulating films 1603a and 1603b are formed here. The lower layer gate insulating film 1603a is formed from a silicon nitride film having a film thickness in the range of 10 nm to 60 nm. If a silicon nitride film is used, it is effective as a blocking layer for preventing alkaline metals contained in the glass substrate from diffusing within the later formed semiconductor film, and is also effective in increasing the gettering efficiency of the later preformed gettering process. Nickel has a tendency to easily migrate to regions having a high oxygen concentration during gettering, and therefore the silicon oxide film is extremely effective as the gate insulating film contacting the semiconductor layer. Further, a lamination structure in which a silicon oxynitride film or a silicon nitride film is laminated in order may also be used.

An amorphous semiconductor film obtained by plasma CVD, low pressure CVD, or sputtering is formed next on the base insulating film, crystallization is performed in accordance with that shown in embodiment mode 1, and a crystalline silicon film 1604 containing germanium is formed. (See FIG. 45A.)

The amorphous silicon film containing germanium is manufactured by plasma CVD in embodiment 11. GeH$_4$ gas diluted to 10% by SiH$_4$ and H$_2$ is introduced to the reaction chamber, then decomposed by glow discharge, to be deposited on the substrate 1601. An extremely thin oxide film is formed by an aqueous solution containing ozone on the surface of the amorphous silicon film containing germanium thus obtained, and the oxide film is then etched by a liquid mixture of hydrofluoric acid and hydrogen peroxide, forming a clean surface. An extremely thin oxide film is then once again formed by the aqueous solution containing ozone, and a nickel acetate salt solution containing 10 ppm nickel is then applied to the entire surface by using a spinner, forming a nickel containing layer. Heat treatment is performed next at 500° C. for 1 hour, and driving out hydrogen from within the amorphous silicon film containing germanium. Heat treatment is then performed for 4 hours at 550° C., performing crystallization. Note that although crystallization is performed here by heat treatment, crystallization may also be performed, as a substitute to heat treatment, by the irradiation of strong light from a lamp light source such as a halogen lamp, a metal halide lamp, xenon arc lamp, a carbon arc lamp, a high pressure sodium lamp, or a high pressure mercury lamp. If this type of lamp light source of these types is used, then the lamp light source is turned on for 1 to 60 seconds, preferably for 30 to 60 seconds, and this is repeated between 1 and 10 times, preferably between 2 and 6 times. The light emission strength of the lamp light source is arbitrary, but a strength is used such that the silicon film is heated instantaneously to between 600 and 1000° C., preferably on the order of 650 to 750° C. Even if this type of high temperature is used, the silicon film is only heated instantaneously, and a substrate 1601 does not strain or change shape. However, it is necessary to set the conditions while taking into consideration the heat resistance temperature of the metals used in the gate wiring material when performing crystallization using the irradiation of strong light from a lamp light source.

The amorphous silicon film containing germanium is thus crystallized, and the crystalline silicon film 1604 containing germanium can be obtained.

Note that there is a tendency for nickel to easily move to regions having a high oxygen concentration when performing the later gettering process, and therefore it is preferable that the crystalline silicon film containing germanium 1604 be formed such that the oxygen concentration be equal to or less than $5 \times 10^{18}/cm^3$ (SIMS analysis).

Further, after crystallization, the segregated metal elements may be removed or may be reduced in concentration by using an etchant containing hydrofluoric acid, for example dilute hydrogluoric acid or FPM (a liquid mixture of hydrofluoric acid, aqueous hydrogen peroxide and water). Further, if using a surface etching process with an etchant containing hydrofluoric acid, it is preferable to irradiate strong light from the above lamp light sources, making the surface more level.

In addition, after the above crystallization, an additional process for irradiating laser light or the strong light from a lamp light source may also be performed in order to improve crystallization. Excimer laser light having a wavelength equal to or less than 400 nm, and the second harmonic and the third harmonic of a YAG laser may be used for the laser. After irradiation of the laser light or the strong light from the lamp light source in order to improve crystallization, segregated metal elements may be removed or lowered in concentration by an etchant containing hydrofluoric acid, and strong light from a lamp light source may be irradiated again, making the surface more level.

A gettering process for removing the metal elements contained within the crystalline silicon film 1604 containing germanium is performed next. First, a barrier layer 1605 is formed on the crystalline silicon film containing germanium. A porous film through which the metal elements (mainly nickel here) can penetrate to the gettering sites, and in addition through which the etching liquid used in removing the gettering sites does not permeate is formed. A chemical oxide film or a silicon oxide film (SiOx) formed in accordance with processing by using aqueous ozone, may be used. Films having these qualities are referred to in particular as porous films throughout this specification. Further, the barrier layer 1605 may be extremely thin, and a natural oxide film may be used. In addition, an oxide film oxidized by generating ozone by irradiation of ultraviolet light in an atmosphere containing oxygen may also be used.

A semiconductor film 1606 which functions as gettering sites during the later performed gettering process is then formed on the barrier layer 1605. (See FIG. 45B.) A semiconductor film having an amorphous structure may be used, or a semiconductor film having a crystalline structure may be used. The semiconductor film 1606 may be formed using plasma CVD, low pressure thermal CVD, or sputtering. The film thickness of the semiconductor film 1606 is from 5 to 50 nm, preferably between 10 and 20 nm. Nickel has a tendency to easily migrate to regions having a high oxygen concentration during the later gettering process, and therefore it is preferable that oxygen be contained within the semiconductor film 1606 (a concentration equal to or greater than $5\times10^{18}/cm^3$, preferably equal to or greater than $1\times10^{19}/cm^3$ by SIMS analysis) in order to increase the gettering efficiency. Further, a semiconductor film formed under conditions where it contains rare gas atoms may also be used.

After film formation by a process such as plasma CVD or sputtering, rare gas atoms are added by ion doping or ion injection, and a semiconductor film containing noble gas atoms (gettering sites) 1607 is formed. (See FIG. 45C.) A semiconductor film containing rare gas atoms at a concentration of $1\times10^{20}$ to $5\times10^{21}/cm^3$, preferably between $1\times10^{20}$ and $1\times10^{21}/cm^3$ may be formed.

One element, or a plurality of elements, selected from the group consisting of He, Ne, Ar, Kr, and Xe, is used as the noble gas atoms. By accelerating these ions by an electric field and injecting them into the semiconductor film, dangling bonds and lattice distortions are formed, and these can form gettering sites. It is preferable to use the low cost gas Ar. Note that a high concentration of rare gas atoms can be added to the semiconductor film in a short processing time on the order or 1 or 2 minutes, and therefore the throughput is increased remarkably compared to performing gettering using phosphorus.

Furthermore, in addition to the rare gas atoms, a substance, or a plurality of substances, selected form the group consisting of H, $H_2$, O, $O_2$, and P may also be added, and a synergistic gettering effect can be obtained by the addition of a plurality of atoms. Note that, although the rare gas atoms diffuse very little, it is preferable to regulate the film thickness of the semiconductor film containing the rare gas atoms to be thick, for cases in which other elements, which easily diffuse, are added in addition to the rare gas elements. This is so that the other elements added do not diffuse into the crystalline silicon film during later heat treatment processing. Further, the barrier layer also functions to prevent the diffusion of the other elements.

A gettering process is performed next by performing heat treatment or irradiation of strong light from a lamp light source. When performing gettering by heat treatment, heat treatment may be performed in a nitrogen atmosphere at 450 to 800° C. for 1 to 24 hours, for example at 550° C. for 14 hours. Further, when performing gettering in accordance with irradiation of strong light from a lamp light source, the heating lamp light source may be turned on from 1 to 60 sec, preferably from 30 to 60 seconds, and this may be repeated 1 to 10 times, preferably between 2 and 6 times. The light emission strength of the lamp light source may be arbitrarily set, but is such that the semiconductor film is heated instantaneously to between 600 and 1000° C., preferably on the order of 700 to 750° C. Further, strong light from a lamp light source may also be irradiated at the same time as performing heat treatment.

Figure 45A:
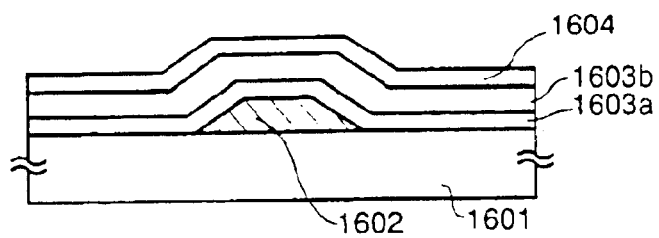
FIGS. 45A to 45E are diagrams for explaining a method of manufacturing a crystalline semiconductor film of the present invention.
Figure 45B:
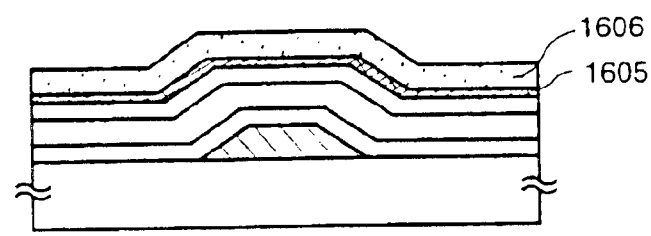
Figure 45C:
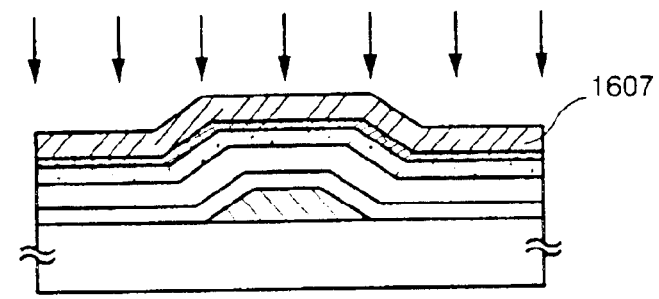
Figure 45D:
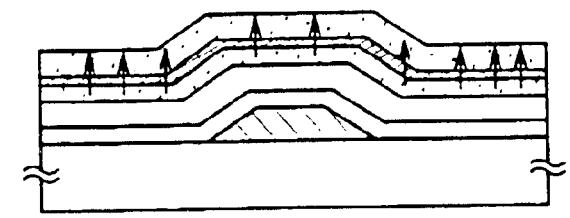
Figure 45E:
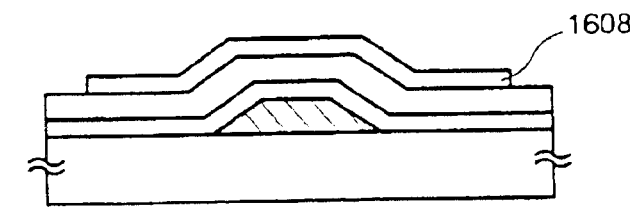

Nickel moves in the direction of the arrow in FIG. 45D (vertical direction) due to the gettering process, and removal of, or a reduction in the concentration of, the metal atoms contained in the crystalline silicon film containing germanium 1604 which is covered by the barrier layer 1605 is performed. Compared to gettering using phosphorus, gettering in accordance with the addition of rare gas atoms is extremely effective, and a higher concentration, for example $1\times10^{20}$ to $5\times10^{21}/cm^3$ can be added, and therefore the amount added of the metal element used in crystallization can be increased. In other words, it becomes possible to perform the crystallization process with a shorter process time due to the greater added amount of the metal element used in crystallization. Further, by increasing the amount of added metal element used in crystallization and the processing time of crystallization is not changed, the crystallization process can be carried out at a lower temperature. Furthermore, the generation of spontaneous nucleation can be lowered by adding a large amount of the metal element used in crystallization, and a semiconductor film having good crystallinity can be formed.

The semiconductor film gettering sites 1607 are selectively etched and removed after the gettering process is performed. Dry etching without using a plasma from $ClF_3$, and wet etching using an alkaline solution such as hydrazine or an aqueous solution containing tetraethyl-ammonium-hydroxide (chemical formula $(CH_3)_4NOH$) can be performed as the wet etching method. The barrier layer 1605 functions as an etching stopper at this point. Further, the barrier layer 1605 may also be removed afterward by hydrofluoric acid.

Results of an experiment to confirm whether or not the nickel contained within the crystalline silicon film is actually reduced in concentration by the above gettering process are shown here.

Figure 46:
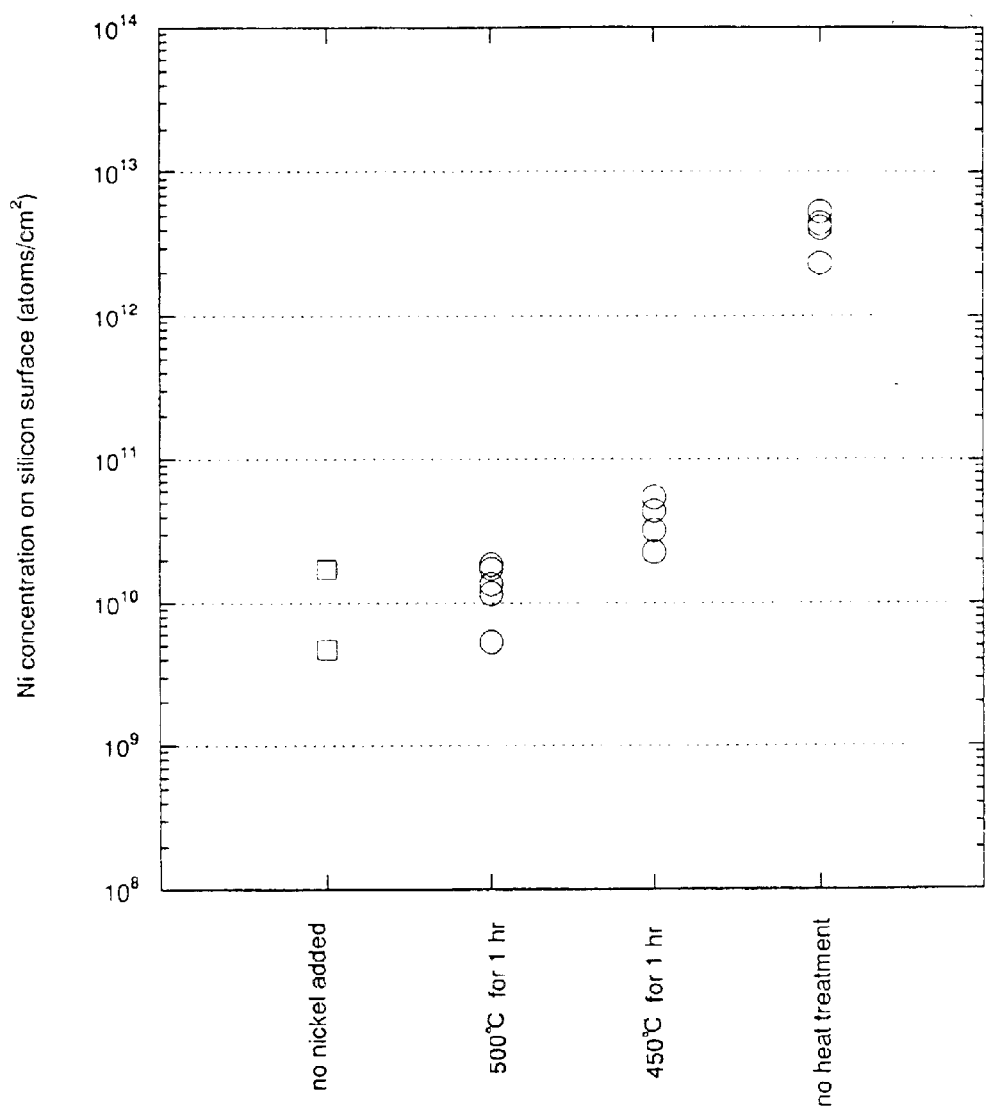
FIG. 46 is a graph showing the nickel concentration of a crystalline silicon film surface after gettering.

First, an amorphous silicon film having a film thickness of 50 nm was prepared as a test piece by introducing $GeH_4$ gas diluted to 10% by $SiH_4$ and $H_2$ (flow rate 10 sccm) into the reaction chamber after forming a base insulating film (silicon oxynitride film, 150 nm thickness) on a glass substrate. Next, a nickel acetate aqueous solution (10 ppm) was applied by spin coating, and heat treatment was performed for 1 hour at 500° C. Additional heat treatment was then performed for 4 hours at 580° C., crystallizing the amorphous silicon film and forming a crystalline silicon film. A barrier layer composed of a chemical oxide film formed in accordance with processing the surface of the crystalline silicon by aqueous ozone, and an amorphous silicon film having a film thickness of 150 nm and containing argon atoms at a concentration of $1\times10^{20}$ to $5\times10^{21}/cm^3$, preferably between $1\times10^{20}$ to $1\times10^{21}/cm^3$ was formed on the barrier layer by sputtering. Heat treatment was performed next at 500° C. for 1 hour, performing gettering. The amorphous silicon film and the barrier layer were then removed, and the nickel concentration of the surface of the crystalline silicon film was measured. The results are shown in FIG. 46. The nickel concentration is one in which the number of nickel atoms per unit surface area on the surface is measured in accordance with TXRF (total reflection x-ray fluorescence). Further, a test piece which underwent gettering by heat treatment at 450° C. for 1 hour, a test piece which underwent gettering with no heat treatment, and a test piece to which nickel was not added were each manufactured, comparison was performed, and the experimental results are shown in FIG. 46. It can be confirmed that the concentration of nickel contained in the crystalline silicon film containing germanium is reduced by gettering processing using a rare gas element, as shown in FIG. 46.

The obtained crystalline silicon film containing germanium is next etched into desired shapes, forming island shaped and separated semiconductor layers 1608.

Subsequent processes may be performed in accordance with those of embodiment 1, completing the TFTs. In this case, the semiconductor layers 1608 shown by embodiment 11 may be substituted for the semiconductor layers 304 shown in embodiment 1. The crystalline silicon film containing germanium obtained by embodiment 11 has a high orientation ratio for the {101} plane, and the concentration of metal elements within the film is sufficiently reduced, and therefore superior TFT electrical characteristics are shown when the crystalline silicon film is used in TFT active layers.

Further, although an example in which the crystallization method of embodiment mode 1 is used is shown in embodiment 11, there are no particular limitations on this method, and the crystallization method shown in embodiment mode 2 may also be used.

Furthermore, the gettering process shown in embodiment mode 3 may be added to the gettering process of embodiment 11.

Nickel elements may be dispersed on a gate insulating film (for example, a silicon nitride film) by sputtering, after which an amorphous silicon film containing germanium is formed, a barrier layer is formed, and a semiconductor film containing a rare gas element is formed. Then crystallization and gettering of the amorphous silicon film containing germanium may be performed at the same time by heat treatment or irradiation of strong light.

Further, it is possible to freely combine embodiment 11 with any of embodiments 1 to 10.

[Embodiment 12]

One example of a method of gettering in which phosphorus is added is shown in embodiment mode 3, but a rare gas element may also be used as a substitute for phosphorus. Note that, except for the conditions of the addition process, all other conditions are identical, and therefore a detailed explanation of such is omitted here.

A rare gas element is selectively added to a crystalline silicon film obtained by embodiment mode 1 or embodiment mode 2. Argon is added by ion doping (for example, a dosage of $5\times10^{15}/cm^2$), forming an argon added region (gettering sites). It is preferable that the concentration of the rare gas element added to the gettering sites be from $1\times10^{20}$ to $5\times10^{21}/cm^3$.

After forming the gettering sites, the metal element contained within the crystalline silicon film can be removed or lowered in concentration provided that heat treatment or irradiation of strong light from a lamp light source is performed.

Further, it is possible to freely combine embodiment 12 with any of embodiments 1 to 11.

If a metal element is added to an amorphous semiconductor film having silicon as its main constituent and containing from 0.1 atom % to 10 atom % germanium, and then crystallization is performed by heat treatment, then it becomes possible to obtain a crystalline semiconductor film having: the ratio of {101} lattice planes within an angle of 10° to the surface of the semiconductor film is equal to or greater than 20%; the ratio of {001} lattice planes within an angle of 10° to the surface of the semiconductor film is less than or equal to 3%; and the ratio of {111} lattice planes within an angle of 10° to the surface of the semiconductor film less than or equal to 5%, as observed by an EBSP method. A channel-forming region of a reverse stagger type thin film transistor can be formed using this type of crystalline semiconductor film.

Reverse stagger TFTs using a crystalline semiconductor film with a high orientation ratio to the {101} lattice plane can be used as TFTs for manufacturing an active matrix liquid crystal display device or EL display device. Further, the reverse stagger TFTs of the present invention can be used as, TFTs for realizing thin film integrated circuits as a substitute for LSIs manufactured by conventional semiconductor substrates.

What is claimed is:

1. A semiconductor device comprising:
   an electrode on an insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5\times10^{18}/cm^3$ as detected by SIMS;
   oxygen at less than $1\times10^{19/cm3}$ as detected by SIMS; and
   a plurality of crystal planes as measured by EBSP method in which an electron beam of 20 nm or less in a spot diameter is irradiated to a plurality of different points of said channel-forming region,
   wherein ratios of said plurality of crystal planes which form an angle equal to or less than 10° with a substrate surface is larger or equal to 20% in {101} plane, less than or equal to 3% in {001} plane, and less than or equal to 5% in {111} plane.

2. The semiconductor device according to claim 1, wherein said germanium contained in said channel-forming region is larger than or equal to 0.1 atom %, and less than or equal to 10 atom %.

3. The semiconductor device according to claim 1, wherein said channel-forming region has a germanium concentration gradient in which said germanium concentration becomes larger with increasing a distance from an interface with said insulating film.

4. The semiconductor device according to claim 1, wherein a concentration of a metal element contained in said channel-forming region is less than $1\times10^{17}/cm^3$.

5. The semiconductor device according to claim 4, wherein said metal element is one or a plurality of elements selected from the group consisting of Fe, Co, Ni, Ru, Rh, Pd, Os, Ir, Pt, Cu, and Au.

6. The semiconductor device according to claim 1, wherein said electrode comprises a gate electrode.

7. The semiconductor device according to claim 1, wherein said insulating film covering said electrode comprises a gate insulating film.

8. The semiconductor device according to claim 1, wherein a thickness of said semiconductor layer is between 20 and 100 nm.

9. The semiconductor device according to claim 1, wherein said semiconductor device is an electroluminescence display device.

10. The semiconductor device according to claim 1, wherein said semiconductor device is one selected from the group consisting of a personal computer, a video camera, a mobile computer, a goggle-type display, a digital camera, a projector, a player using a recording medium, an electronic book, and a mobile telephone.

11. A semiconductor device comprising thin film transistors in a pixel portion and in a driver circuit formed over a same insulating surface, said semiconductor device comprising:
   an electrode on said insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5\times10^{18}/cm^3$ as detected by SIMS;
   oxygen at less than $1\times10^{19}/cm^3$ as detected by SIMS; and
   a plurality of crystal planes as measured by EBSP method in which an electron beam of 20 nm or less in a spot diameter is irradiated to a plurality of different points of said channel-forming region,
   wherein ratios of said plurality of crystal planes which form an angle equal to or less than 10° with a substrate surface is larger or equal to 20% in {101} plane, less than or equal to 3% in {001} plane, and less than or equal to 5% in {111} plane, and
   wherein all said thin film transistors in said pixel portion and in said driver circuit are n-channel thin film transistors.

12. The semiconductor device according to claim 11, wherein said germanium contained in said channel-forming region is larger than or equal to 0.1 atom %, and less than or equal to 10 atom %.

13. The semiconductor device according to claim 11, wherein said channel-forming region has a germanium concentration gradient in which said germanium concentration becomes larger with increasing a distance from an interface with said insulating film.

14. The semiconductor device according to claim 11, wherein a concentration of a metal element contained in said channel-forming region is less than $1\times10^{17}/cm^3$.

15. The semiconductor device according to claim 14, wherein said metal element is one or a plurality of elements selected from the group consisting of Fe, Co, Ni, Ru, Rh, Pd, Os, Ir, Pt, Cu, and Au.

16. The semiconductor device according to claim 11, wherein said electrode comprises a gate electrode.

17. The semiconductor device according to claim 11, wherein said insulating film covering said electrode comprises a gate insulating film.

18. The semiconductor device according to claim 11, wherein a thickness of said semiconductor layer is between 20 and 100 nm.

19. The semiconductor device according to claim 11, wherein said semiconductor device is an electroluminescence display device.

20. The semiconductor device according to claim 11, wherein said semiconductor device is one selected from the group consisting of a personal computer, a video camera, a mobile computer, a goggle-type display, a digital camera, a projector, a player using a recording medium, an electronic book, and a mobile telephone.

21. A semiconductor device comprising thin film transistors in a pixel portion and in a driver circuit formed over a same insulating surface, said semiconductor device comprising:
   an electrode on said insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5\times10^{18}/cm^3$ as detected by SIMS;
   oxygen at less than $1\times10^{19}/cm^3$ as detected by SIMS; and
   a plurality of crystal planes as measured by EBSP method in which an electron beam of 20 nm or less in a spot diameter is irradiated to a plurality of different points of said channel-forming region,
   wherein ratios of said plurality of crystal planes which form an angle equal to or less than 10° with a substrate surface is larger or equal to 20% in {101} plane, less than or equal to 3% in {001} plane, and less than or equal to 5% in {111} plane, and
   wherein all said thin film transistors in said pixel portion and in said driver circuit are p-channel thin film transistors.

22. The semiconductor device according to claim 21, wherein said germanium contained in said channel-forming region is larger than or equal to 0.1 atom %, and less than or equal to 10 atom %.

23. The semiconductor device according to claim 21, wherein said channel-forming region has a germanium concentration gradient in which said germanium concentration becomes larger with increasing a distance from an interface with said insulating film.

24. The semiconductor device according to claim 21, wherein a concentration of a metal element contained in said channel-forming region is less than $1\times10^{17}/cm^3$.

25. The semiconductor device according to claim 24, wherein said metal element is one or a plurality of elements selected from the group consisting of Fe, Co, Ni, Ru, Rh, Pd, Os, Ir, Pt, Cu, and Au.

26. The semiconductor device according to claim 21, wherein said electrode comprises a gate electrode.

27. The semiconductor device according to claim 21, wherein said insulating film covering said electrode comprises a gate insulating film.

28. The semiconductor device according to claim 21, wherein a thickness of said semiconductor layer is between 20 and 100 nm.

29. The semiconductor device according to claim 21, wherein said semiconductor device is an electroluminescence display device.

30. The semiconductor device according to claim 21, wherein said semiconductor device is one selected from the group consisting of a personal computer, a video camera, a mobile computer, a goggle-type display, a digital camera, a projector, a player using a recording medium, an electronic book, and a mobile telephone.

31. A semiconductor device comprising thin film transistors in a pixel portion and in a driver circuit formed over a same insulating surface, said semiconductor device comprising:
   an electrode on said insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5 \times 10^{18}/cm^3$ as detected by SIMS;
   oxygen at less than $1 \times 10^{19}/cm^3$ as detected by SIMS; and
   a plurality of crystal planes as measured by EBSP method in which an electron beam of 20 nm or less in a spot diameter is irradiated to a plurality of different points of said channel-forming region,
   wherein ratios of said plurality of crystal planes which form an angle equal to or less than 10° with a substrate surface is larger or equal to 20% in {101} plane, less than or equal to 3% in {001} plane, and less than or equal to 5% in {111} plane, and
   wherein all said thin film transistors in said pixel portion and in said driver circuit are n-channel thin film transistors or p-channel thin film transistors.

32. The semiconductor device according to claim 31, wherein said germanium contained in said channel-forming region is larger than or equal to 0.1 atom %, and less than or equal to 10 atom %.

33. The semiconductor device according to claim 31, wherein said channel-forming region has a germanium concentration gradient in which said germanium concentration becomes larger with increasing a distance from an interface with said insulating film.

34. The semiconductor device according to claim 31, wherein a concentration of a metal element contained in said channel-forming region is less than $1 \times 10^{17}/cm^3$.

35. The semiconductor device according to claim 34, wherein said metal element is one or a plurality of elements selected from the group consisting of Fe, Co, Ni, Ru, Rh, Pd, Os, Ir, Pt, Cu, and Au.

36. The semiconductor device according to claim 31, wherein said electrode comprises a gate electrode.

37. The semiconductor device according to claim 31, wherein said insulating film covering said electrode comprises a gate insulating film.

38. The semiconductor device according to claim 31, wherein a thickness of said semiconductor layer is between 20 and 100 nm.

39. The semiconductor device according to claim 31, wherein said semiconductor device is an electroluminescence display device.

40. The semiconductor device according to claim 31, wherein said semiconductor device is one selected from the group consisting of a personal computer, a video camera, a mobile computer, a goggle-type display, a digital camera, a projector, a player using a recording medium, an electronic book, and a mobile telephone.

41. A semiconductor device comprising thin film transistors in a pixel portion formed over an insulating surface, said semiconductor device comprising:
   an electrode on said insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5 \times 10^{18}/cm^3$ as detected by SIMS;
   oxygen at less than $1 \times 10^{19}/cm^3$ as detected by SIMS; and
   a plurality of crystal planes as measured by EBSP method in which an electron beam of 20 nm or less in a spot diameter is irradiated to a plurality of different points of said channel-forming region,
   wherein ratios of said plurality of crystal planes which form an angle equal to or less than 10° with a substrate surface is larger or equal to 20% in {101} plane, less than or equal to 3% in {001} plane, and less than or equal to 5% in {111} plane.

42. The semiconductor device according to claim 41, wherein said germanium contained in said channel-forming region is larger than or equal to 0.1 atom %, and less than or equal to 10 atom %.

43. The semiconductor device according to claim 41, wherein said channel-forming region has a germanium concentration gradient in which said germanium concentration becomes larger with increasing a distance from an interface with said insulating film.

44. The semiconductor device according to claim 41, wherein a concentration of a metal element contained in said channel-forming region is less than $1 \times 10^{17}/cm^3$.

45. The semiconductor device according to claim 44, wherein said metal element is one or a plurality of elements selected from the group consisting of Fe, Co, Ni, Ru, Rh, Pd, Os, Ir, Pt, Cu, and Au.

46. The semiconductor device according to claim 41, wherein said electrode comprises a gate electrode.

47. The semiconductor device according to claim 41, wherein said insulating film covering said electrode comprises a gate insulating film.

48. The semiconductor device according to claim 41, wherein a thickness of said semiconductor layer is between 20 and 100 nm.

49. The semiconductor device according to claim 41, wherein said semiconductor device is an electroluminescence display device.

50. The semiconductor device according to claim 41, wherein said semiconductor device is one selected from the group consisting of a personal computer, a video camera, a mobile computer, a goggle-type display, a digital camera, a projector, a player using a recording medium, an electronic book, and a mobile telephone.

51. A semiconductor device comprising thin film transistors in a driver circuit formed over an insulating surface, said semiconductor device comprising:
   an electrode on said insulating surface;
   an insulating film covering said electrode;
   a semiconductor layer having at least a channel-forming region, a source region, and a drain region on said insulating film, said channel-forming region comprising:
   silicon and germanium;
   nitrogen and carbon at less than $5 \times 10^{18}/cm^3$ as detected by SIMS;
   oxygen at less than $1 \times 10^{19}/cm^3$ as detected by SIMS; and a plurality of crystal planes as measured by EBSP method in which an electron beam of 20 nm or less in a spot diameter is irradiated to a plurality of different points of said channel-forming region, wherein ratios of said plurality of crystal planes which form an angle equal to or less than 10° with a substrate surface is larger or equal to 20% in {101} plane, less than or equal to 3% in {001} plane, and less than or equal to 5% in {111} plane.

52. The semiconductor device according to claim 51, wherein said germanium contained in said channel-forming region is larger than or equal to 0.1 atom %, and less than or equal to 10 atom %.

53. The semiconductor device according to claim 51, wherein said channel-forming region has a germanium concentration gradient in which said germanium concentration becomes larger with increasing a distance from an interface with said insulating film.

54. The semiconductor device according to claim 51, wherein a concentration of a metal element contained in said channel-forming region is less than $1 \times 10^{17}/cm^3$.

55. The semiconductor device according to claim 54, wherein said metal element is one or a plurality of elements selected from the group consisting of Fe, Co, Ni, Ru, Rh, Pd, Os, Ir, Pt, Cu, and Au.

56. The semiconductor device according to claim 51, wherein said electrode comprises a gate electrode.

57. The semiconductor device according to claim 51, wherein said insulating film covering said electrode comprises a gate insulating film.

58. The semiconductor device according to claim 51, wherein a thickness of said semiconductor layer is between 20 and 100 nm.

59. The semiconductor device according to claim 51, wherein said semiconductor device is an electroluminescence display device.

60. The semiconductor device according to claim 51, wherein said semiconductor device is one selected from the group consisting of a personal computer, a video camera, a mobile computer, a goggle-type display, a digital camera, a projector, a player using a recording medium, an electronic book, and a mobile telephone.

* * * * *